(12) United States Patent
Higo et al.

(10) Patent No.: US 9,054,331 B2
(45) Date of Patent: Jun. 9, 2015

(54) ORGANIC EL DISPLAY AND METHOD OF MANUFACTURING THE SAME

(71) Applicant: Sony Corporation, Tokyo (JP)

(72) Inventors: Tomoyuki Higo, Tokyo (JP); Tadahiko Yoshinaga, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 14 days.

(21) Appl. No.: 13/705,118

(22) Filed: Dec. 4, 2012

(65) Prior Publication Data

US 2013/0092917 A1 Apr. 18, 2013

Related U.S. Application Data

(62) Division of application No. 13/016,536, filed on Jan. 28, 2011, now Pat. No. 8,841,833.

(30) Foreign Application Priority Data

Feb. 5, 2010 (JP) .................................. 2010-024390

(51) Int. Cl.
*H01L 51/50* (2006.01)
*H01L 27/32* (2006.01)
*H01L 51/00* (2006.01)

(52) U.S. Cl.
CPC ........ *H01L 51/5036* (2013.01); *H01L 27/3211* (2013.01); *H01L 51/0039* (2013.01); *H01L 51/0043* (2013.01); *H01L 51/0058* (2013.01); *H01L 51/0059* (2013.01); *H01L 51/006* (2013.01); *H01L 51/0081* (2013.01); *H01L 51/5004* (2013.01)

(58) Field of Classification Search
USPC ................................................. 313/504, 506
See application file for complete search history.

(56) References Cited

U.S. PATENT DOCUMENTS

| 7,275,972 | B2 * | 10/2007 | Wolk et al. ...................... 445/24 |
| 7,825,584 | B2 * | 11/2010 | Kim ............................... 313/504 |
| 2001/0001050 | A1 | 5/2001 | Miyashita et al. |
| 2004/0036421 | A1 * | 2/2004 | Arnold et al. .............. 315/169.3 |
| 2005/0057150 | A1 * | 3/2005 | Kim et al. ..................... 313/504 |

(Continued)

FOREIGN PATENT DOCUMENTS

| JP | 2006-140434 | 6/2006 |
| JP | 3899566 | 1/2007 |

(Continued)

*Primary Examiner* — Thomas A Hollweg
(74) *Attorney, Agent, or Firm* — Dentons US LLP

(57) ABSTRACT

An organic EL display includes: lower electrodes arranged on a substrate so as to correspond to red, green and blue organic EL elements, respectively; hole injection/transport layers arranged on the lower electrodes so as to correspond to the red, green and blue organic EL elements, respectively, the hole injection/transport layers having one or both of hole injection and hole transport properties; red and green organic light-emitting layers arranged on the hole injection/transport layers for the red and green organic EL elements, respectively, and including a low-molecular material; a blue organic light-emitting layer arranged on whole surfaces of the red and green organic light-emitting layers and the hole injection/transport layer for the blue organic EL element; and an electron injection/transport layer and an upper electrode arranged on a whole surface of the blue light-emitting layer, the electron injection/transport layer having one or both of electron injection properties and electron transport properties.

9 Claims, 12 Drawing Sheets

(56) References Cited

U.S. PATENT DOCUMENTS

| | | |
|---|---|---|
| 2006/0105201 A1 | 5/2006 | Lee et al. |
| 2007/0007870 A1* | 1/2007 | Yamazaki et al. ............ 313/112 |
| 2007/0046185 A1* | 3/2007 | Kim .............................. 313/504 |
| 2008/0067924 A1* | 3/2008 | Prakash et al. ................ 313/504 |
| 2011/0111542 A1* | 5/2011 | Yee et al. ........................ 438/35 |

FOREIGN PATENT DOCUMENTS

| | | |
|---|---|---|
| JP | 4062352 | 1/2008 |
| JP | 2009130142 A * | 6/2009 |

* cited by examiner

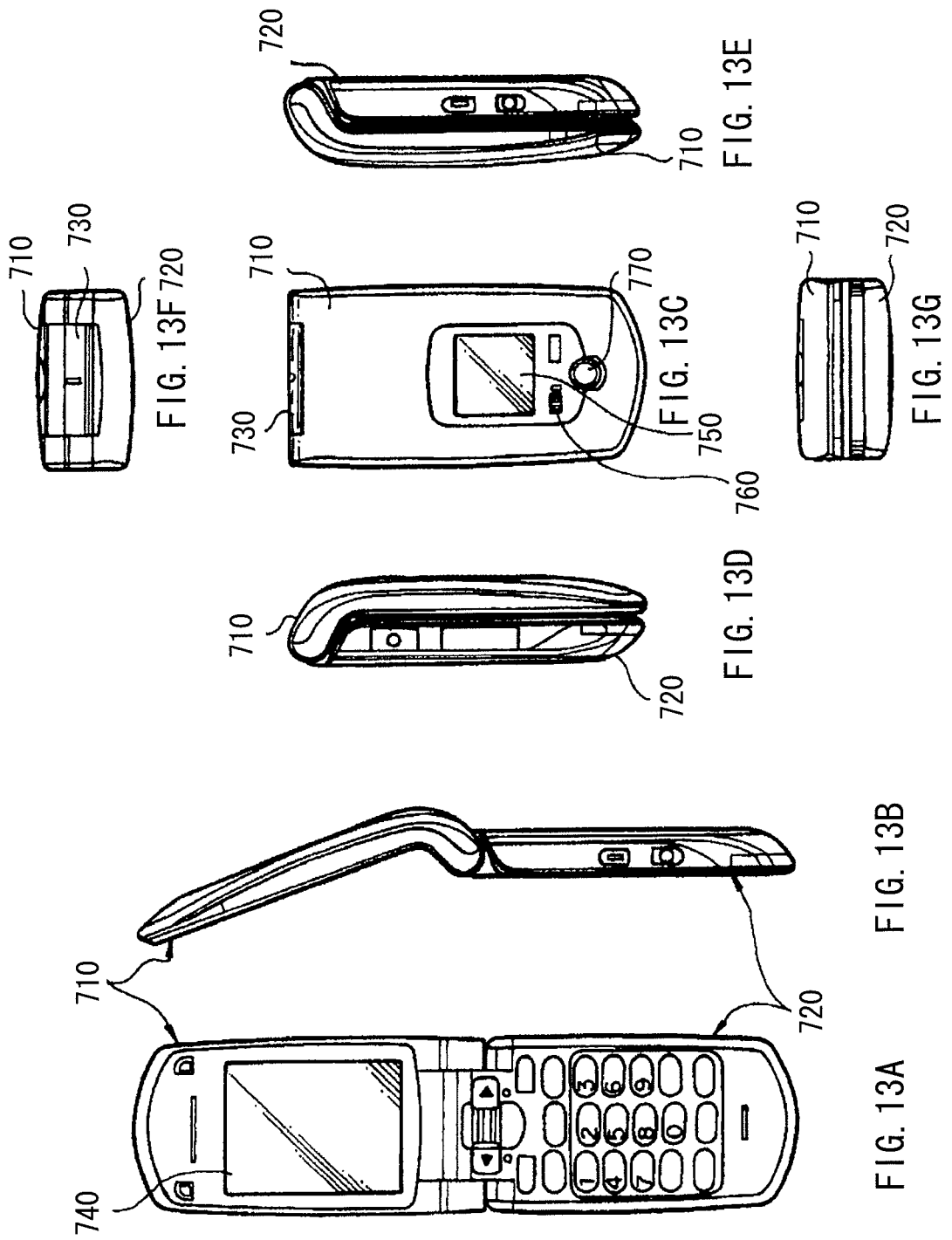

ORGANIC EL DISPLAY AND METHOD OF MANUFACTURING THE SAME

RELATED APPLICATION DATA

This application is a division of U.S. patent application Ser. No. 13/016,536, filed Jan. 28, 2011, the entirety of which is incorporated herein by reference to the extent permitted by law. The present application also claims priority to Japanese Patent Application No. 2010-024390, filed in the Japanese Patent Office on Feb. 5, 2010, the entirety of which is incorporated by reference herein to the extent permitted by law.

BACKGROUND OF THE INVENTION

1. Field of the Invention

The present invention relates to an organic electroluminescence (EL) display emitting light with use of an organic EL effect, and a method of manufacturing the same.

2. Description of the Related Art

As the development of information and communication industry is accelerated, display elements with higher performance are demanded. An organic EL element attracting attention as a next-generation display element has advantages of not only a wide viewing angle and excellent contract but also fast response time.

Materials of a light-emitting layer and the like forming the organic EL element are broadly divided into low-molecular materials and high molecular materials. It is generally known that the low-molecular materials exhibit high light emission efficiency and a long lifetime, and in particular, performance of low-molecular materials emitting blue light is high.

Moreover, as a method of forming an organic film of the organic EL element, a film made of a low-molecular material is formed by a dry method such as a vacuum deposition method, and a film made of a high-molecular material is formed by a wet method such as spin coating, ink jetprinting or nozzle coating.

As an example of using such a forming method, for example, as described in Japanese Patent Nos. 4062352 and 3899566, there are disclosed manufacturing methods in which a red light-emitting layer and a green light-emitting layer are formed by an ink jetprinting method and a blue light-emitting layer is formed by evaporation. In the manufacturing method in Japanese Patent Nos. 4062352 and 3899566, the blue light-emitting layer is manufactured with use of a low-molecular material with high practicality by an evaporation method; therefore, the manufacturing cost is low and the possibility of upsizing displays is high.

Moreover, as described in Japanese Unexamined Patent Application Publication No. 2006-140434, there is disclosed a display in which a blue light-emitting layer is formed as a common layer over a red light-emitting layer and a green light-emitting layer. In such a configuration, fine patterning on the blue light-emitting layer is not necessary; therefore, manufacturing steps are reduced.

SUMMARY OF THE INVENTION

However, in a display in Japanese Unexamined Patent Application Publication No. 2006-140434, there is an issue that hole or electron injection efficiency from a blue light-emitting layer arranged over a red light-emitting layer and a green light-emitting layer to the red light-emitting layer and the green light-emitting layer is low, thereby not obtaining intrinsic properties of the red light-emitting layer and the green light-emitting layer. In other words, in a red organic EL element and a green organic EL element, light emission efficiency, lifetime characteristics and the like are not obtained sufficiently.

It is desirable to provide an organic EL display allowed to improve properties of a red organic EL element and a green organic EL element, and a method of manufacturing the same.

According to an embodiment of the invention, there is provided an organic EL display including the following components (A) to (F):

(A) lower electrodes arranged on a substrate so as to correspond to a red organic EL element, a green organic EL element and a blue organic EL element, respectively;

(B) hole injection/transport layers arranged on the lower electrodes so as to correspond to the red organic EL element, the green organic EL element and the blue organic EL element, respectively, the hole injection/transport layers having one or both of hole injection properties and hole transport properties;

(C) a red organic light-emitting layer arranged on the hole injection/transport layer for the red organic EL element, and including a low-molecular material;

(D) a green organic light-emitting layer arranged on the hole injection/transport layer for the green organic EL element, and including a low-molecular material;

(E) a blue organic light-emitting layer arranged on whole surfaces of the red organic light-emitting layer, the green organic light-emitting layer and the hole injection/transport layer for the blue organic EL element; and (F) an electron injection/transport layer and an upper electrode arranged on a whole surface of the blue light-emitting layer, the electron injection/transport layer having one or both of electron injection properties and electron transport properties.

Herein, the low-molecular material is, for example, a monomer or an oligomer with a weight-average molecular weight of 50000 or less. The oligomer is a polymer formed by 2 to 10 monomers are bonded together. Note that only a preferable molecular weight range is described herein, but in the invention, a low-molecular material with a molecular weight exceeding the above-described range is not necessarily excluded.

In the organic EL display according to the embodiment of the invention, when the low-molecular material (a monomer or an oligomer) is added to the red light-emitting layer and the green light-emitting layer, hole or electron injection efficiency from the blue light-emitting layer which is a common layer to the red light-emitting layer and the green light-emitting layer is improved.

According to an embodiment of the invention, there is provided a method of manufacturing an organic EL display including the following steps (A) to (F):

(A) forming lower electrodes on a substrate so as to correspond to a red organic EL element, a green organic EL element and a blue organic EL element, respectively;

(B) forming hole injection/transport layers having one or both of hole injection properties and hole transport properties on the lower electrodes by a coating method so as to correspond to the red organic EL element, the green organic EL element and the blue organic EL element, respectively;

(C) forming a red light-emitting layer including a low-molecular material on the hole injection/transport layer for the red organic EL element by a coating method;

(D) forming a green light-emitting layer including a low-molecular material on the hole injection/transport layer for the green organic EL element by a coating method;

(E) forming a blue light-emitting layer made of a low-molecular material on whole surfaces of the red light-emitting layer, the green light-emitting layer and the hole injection/transport layer for the blue organic EL element by an evaporation method; and (F) forming an electron injection/transport layer having one or both of electron injection properties and electron transport properties and an upper electrode in order on a whole surface of the blue light-emitting layer.

In the method of manufacturing an organic EL display according to the embodiment of the invention, when the blue light-emitting layer made of the low-molecular material is formed on the red organic light-emitting layer and the green organic light-emitting layer to which the low-molecular material is added and a layer including hole injection properties or hole transport properties for the blue organic EL element by a coating method, hole or electron injection efficiency from the blue light-emitting layer which is a common layer is improved, and an interface with a blue hole transport layer made of a low-molecular material is improved.

In the organic EL display and the method of manufacturing an organic EL display according to the embodiment of the invention, the low-molecular material (a monomer or an oligomer) is added to the red organic light-emitting layer and the green organic light-emitting layer; therefore, hole or electron injection efficiency from the blue light-emitting layer to the red organic light-emitting layer and the green organic light-emitting layer is improved. Accordingly, properties of the red organic EL element and the green organic EL element are allowed to be improved. Therefore, higher light emission efficiency and a longer lifetime of a color organic EL display configured by forming a red organic EL element, a green organic EL element and a blue organic EL element in an array are achievable.

Other and further objects, features and advantages of the invention will appear more fully from the following description.

BRIEF DESCRIPTION OF THE DRAWINGS

FIGS. 13A to 13G illustrate Application Example 5 where FIGS. 13A and 13B are a front view and a side view in a state in which Application Example 5 is opened, respectively, and FIGS. 13C, 13D, 13E, 13F and 13G are a front view, a left side view, a right side view, a top view and a bottom view in a state in which Application Example 5 is closed, respectively.

DETAILED DESCRIPTION OF THE PREFERRED EMBODIMENTS

A preferred embodiment of the invention will be described in detail below referring to the accompanying drawings.

Figure 1:
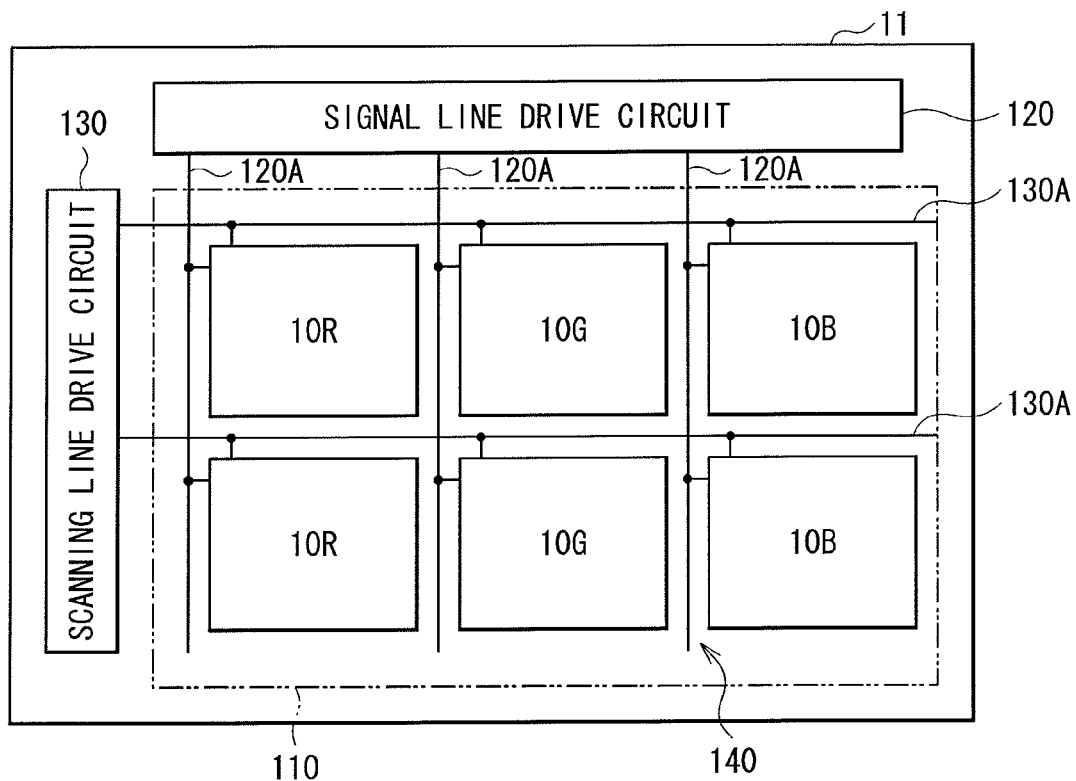
FIG. 1 is a diagram illustrating a configuration of an organic EL display according to an embodiment of the invention.

FIG. 1 illustrates a configuration of an organic EL display according to an embodiment of the invention. The organic EL display is used as an organic EL television or the like, and in the organic EL display, for example, a plurality of red organic EL elements 10R, a plurality of green organic EL elements 10G and a plurality of blue organic EL elements 10B which will be described later are arranged in a matrix form as a display region 110 on a substrate 11. A signal line drive circuit 120 and a scanning line drive circuit 130 as drivers for picture display are arranged around the display region 110.

Figure 2:
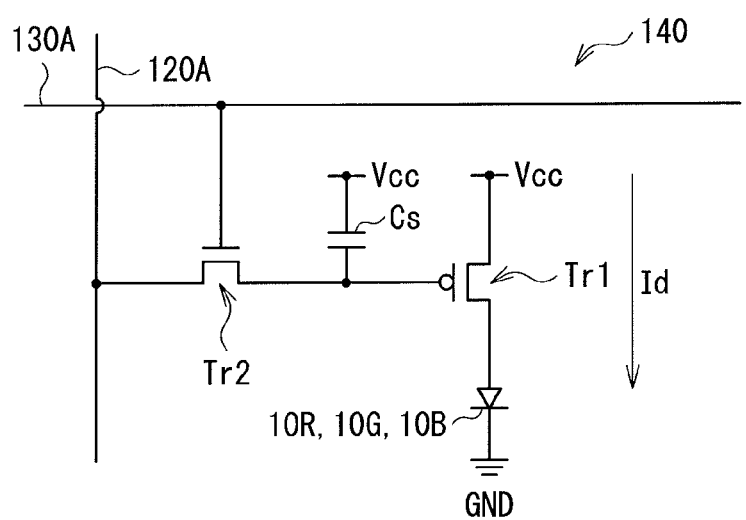
FIG. 2 is a diagram illustrating an example of a pixel drive circuit illustrated in FIG. 1.

A pixel drive circuit 140 is arranged in the display region 110. FIG. 2 illustrates an example of the pixel drive circuit 140. The pixel drive circuit 140 is an active drive circuit formed below a lower electrode 14 which will be described later. In other words, the pixel drive circuit 140 includes a driving transistor Tr1 and a writing transistor Tr2, a capacitor (retention capacitor) Cs between the driving transistor Tr1 and the writing transistor Tr2, and the organic light-emitting element 10R (or 10G or 10B) connected to the driving transistor Tr1 in series between a first power source line (Vcc) and a second power source line (GND). The driving transistor Tr1 and the writing transistor Tr2 each are configured of a typical thin film transistor (TFT), and the TFT may have, for example, an inverted stagger configuration (a so-called bottom gate type) or a stagger configuration (a top gate type), and the configuration of the TFT is not specifically limited.

In the pixel drive circuit 140, a plurality of signal lines 120A are arranged in a column direction, and a plurality of scanning lines 130A are arranged in a row direction. An intersection between each signal line 120A and each scanning line 130A corresponds to one (a subpixel) of the organic light-emitting elements 10R, 10G and 10B. Each signal line 120A is connected to the signal line drive circuit 120, and an image signal is supplied from the signal line drive circuit 120 to a source electrode of the writing transistor Tr2 through the signal line 120A. Each scanning line 130A is connected to the scanning line drive circuit 130, and a scanning signal is sequentially supplied from the scanning line drive circuit 130 to a gate electrode of the writing transistor Tr2 through the scanning line 130A.

Moreover, in the display region 110, the red organic EL elements 10R emitting red light, the green organic EL elements 10G emitting green light and the blue organic EL elements 10B emitting blue light are arranged in order in a matrix form as a whole. Note that a combination of the red organic EL element 10R, the green organic EL element 10G and the blue organic EL element 10B which are adjacent to one another configures one pixel.

Figure 3:
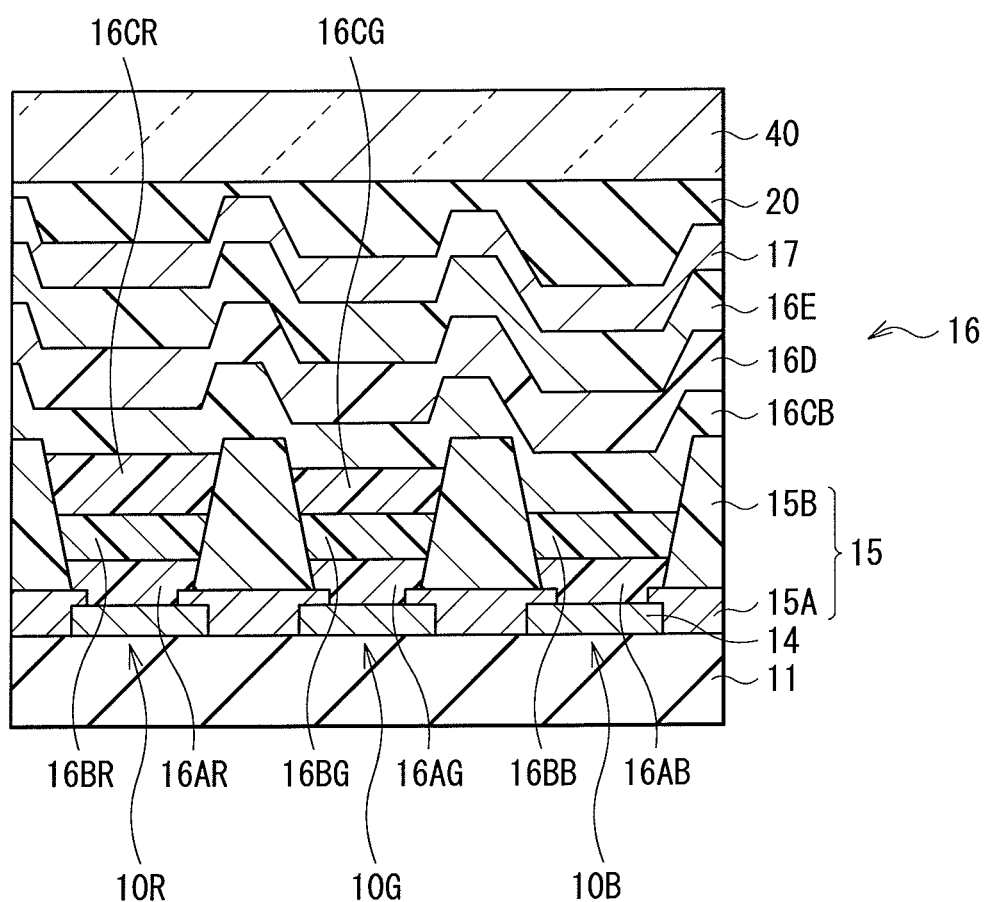
FIG. 3 is a sectional view illustrating a configuration of a display region illustrated in FIG. 1.

FIG. 3 illustrates a sectional configuration of the display region 110 illustrated in FIG. 1. The red organic EL elements 10R, the green organic EL elements 10G and the blue organic EL elements 10B each have a configuration in which the lower electrode 14 as an anode, a barrier rib 15, an organic layer 16 including a light-emitting layer 16C which will be described later, and an upper electrode 17 as a cathode are laminated in this order from the substrate 11 with the driving transistor Tr1 of the above-described pixel drive circuit 140 and a planarization insulating film (not illustrated) in between.

The red organic EL elements 10R, the green organic EL elements 10G and the blue organic EL elements 10B are covered with a protective layer 20, and a sealing substrate 40 made of glass or the like is bonded to a whole surface of the protective layer 20 with an adhesive layer (not illustrated) made of a thermosetting resin, an ultraviolet curable resin or the like in between to seal the red organic EL elements 10R, the green organic EL elements 10G and the blue organic EL elements 10B.

The substrate 11 is a supporting body where the red organic EL elements 10R, the green organic EL elements 10G and the blue organic EL elements 10B are formed in an array on a main surface thereof, and may be configured of a known substrate, and, for example, quartz, glass, metal foil, or a film or a sheet made of a resin is used. In particular, quartz or glass is preferable, and in the case where the substrate 11 is made of a resin, as the resin, a metacrylate resin typified by polymethyl methacrylate (PMMA), polyesters such as polyethylene terephthalate (PET), polyethylene naphthalate (PEN) and polybutylene naphthalate (PBN), a polycarbonate resin and the like are used, but to reduce water permeability and gas permeability, it is necessary for the substrate 11 to have a laminate configuration or to be subjected to surface treatment.

The lower electrodes 14 are arranged on the substrate 11 so as to correspond to the red organic EL elements 10R, the green organic EL elements 10G and the blue organic EL elements 10B, respectively. The lower electrodes 14 each have a thickness in a laminate direction (hereinafter simply referred to as thickness) of 10 nm to 1000 nm both inclusive, and is made of a simple substance or an alloy of a metal element such as chromium (Cr), gold (Au), platinum (Pt), nickel (Ni), copper (Cu), tungsten (W) or silver (Ag). Moreover, the lower electrodes 14 may have a laminate configuration including a metal film made of a simple substance or an alloy of any of these metal elements, and a transparent conductive film made of an oxide of indium and tin (ITO), InZnO (indium-zinc oxide) or an alloy of zinc oxide (ZnO) and aluminum (Al). Note that in the case where the lower electrodes 14 are used as anodes, the lower electrodes 14 are preferably made of a material with high hole injection properties. However, even a material such as an aluminum (Al) alloy in which a hole injection barrier due to the presence of an oxidized coating film on a surface thereof or a small work function causes an issue is allowed to be used as the lower electrodes 14 by arranging an appropriate hole injection layer.

The barrier rib 15 is provided to secure insulation between the lower electrodes 14 and the upper electrode 17 and to form a light emission region in a desired shape. Moreover, the barrier rib 15 has a function as a barrier rib in the case where coating by ink-jet printing or a nozzle coating system is performed in a manufacturing step which will be described later. The barrier rib 15 includes, for example, an upper barrier rib 15B made of a photosensitive resin such as positive type photosensitive polybenzoxazole or a positive type photosensitive polyimide on a lower barrier rib 15A made of an inorganic insulating material such as $SiO_2$. In the barrier rib 15, an opening is arranged so as to correspond to each light emission region. Note that the organic layer 16 and the upper electrode 17 may be arranged not only in the opening but also on the barrier rib 15, but light is emitted only from the opening of the barrier rib 15.

The organic layer 16 of each red organic EL element 10R has, for example, a configuration in which a hole injection layer 16AR, a hole transport layer 16BR, a red light-emitting layer 16CR, a blue light-emitting layer 16CB, an electron transport layer 16D and an electron injection layer 16E are laminated in order from the lower electrode 14. The organic layer 16 of each green organic EL element 10G has, for example, a configuration in which a hole injection layer 16AG, a hole transport layer 16BG, a green light-emitting layer 16CG, the blue light-emitting layer 16CB, the electron transport layer 16D and the electron injection layer 16E are laminated in order from the lower electrode 14. The organic layer 16 of each blue organic EL element 10B has, for example, a configuration in which a hole injection layer 16AB, a hole transport layer 16BB, the blue light-emitting layer 16CB, the electron transport layer 16D and the electron injection layer 16E are laminated in order from the lower electrode 14. The blue light-emitting layer 16CB, the electron transport layer 16D and the electron injection layer 16E are arranged as common layers for the red organic EL elements 10R, the green organic EL elements 10G and the blue organic EL elements 10B.

The hole injection layers 16AR, 16AG and 16AB are buffer layers for enhancing hole injection efficiency and preventing leakage, and are arranged on the lower electrodes 14 of the red organic EL elements 10R, the green organic EL elements 10G and the blue organic EL elements 10B, respectively.

The thickness of each of the hole injection layers 16AR, 16AG and the 16AB is preferably within a range of 5 nm to 100 nm both inclusive, and more preferably within a range of 8 nm to 50 nm both inclusive. The materials of the hole injection layers 16AR, 16AG and 16AB may be selected as appropriate depending on the material of an electrode or an adjacent layer, and polyaniline, polythiophene, polypyrrole, polyphenylene vinylene, polythienylene vinylene, polyquinoline, polyquinoxaline or a derivative thereof, a conductive high polymer such as a polymer including an aromatic amine structure in a main chain or a side chain, metal phthalocyanine (such as copper phthalocyanine), carbon or the like is used.

In the case where the material used for the hole injection layers 16AR, 16AG and 16AB is a high-molecular material, the weight-average molecular weight (Mw) of the high-molecular material may be within a range of 5000 to 300000 both inclusive, and in particular, the weight-average molecular weight of the high-molecular material is preferably within a range of approximately 10000 to 200000. Moreover, an oligomer with an Mw of approximately 2000 to 10000 may be used. However, in the case where the Mw is smaller than 5000, when the hole transport layer and subsequent layers are formed, the hole injection layer may be melted. Moreover, in the case where the Mw is larger than 300000, the material may be gelated to cause a difficulty in film formation.

Examples of a typical conductive high polymer used as the material of the hole injection layers 16AR, 16AG and 16AB include polyaniline, oligoaniline and polydioxythiophene such as poly(3,4-ethylenedioxythiophene) (PEDOT). In addition, a commercially available polymer called Nafion (trademark) manufactured from H.C. Starck GmbH, a commertially available polymer in a dissolved form called Liquion (trademark) as a trade name, ELsource (trademark)

manufactured from Nissan Chemical Industries. Ltd., a conductive polymer called Verazol (trademark) manufactured from Soken Chemical & Engineering Co., Ltd. or the like is used.

The hole transport layers 16BR and 16BG of the red organic EL elements 10R and the green organic EL elements 10G are provided to enhance hole transport efficiency to the red light-emitting layer 16CR and the green light-emitting layer 16CG, respectively. The hole transport layers 16BR and 16BG are arranged on the hole injection layers 16AR and 16AG of the red organic EL elements 10R and the green organic EL elements 10G, respectively.

For example, the thicknesses of the hole transport layers 16BR and 16BG, depending on a whole element configuration, are preferably within a range of 10 nm to 200 nm both inclusive, and more preferably within a range of 15 nm to 150 nm both inclusive. As the high-molecular material forming the hole transport layers 16BR and 16BG, a light-emitting material which is soluble in an organic solvent, for example, polybinylcarbazole, polyfluorene, polyaniline, polysilane or a derivative thereof, a polysiloxane derivative having aromatic amine in a side chain or a main chain, polythiophene and a derivative thereof, and polypyrrole are allowed to be used.

In the case where the material used for the hole transport layers 16BR and 16BG is a high-molecular material, the weight-average molecular weight (Mw) of the high-molecular material is preferably 50000 to 300000 both inclusive, and more preferably 100000 to 200000 both inclusive. In the case where the Mw is smaller than 50000, when the light-emitting layers 16CR and 16CG are formed, a low-molecular component in the high-molecular material drops out to cause dot defects in the hole injection layers 16AR and 16AG and the hole transport layers 16BR and 16BG, and accordingly, a decline in initial performance of organic EL elements or deterioration in the elements may occur. On the other hand, in the case where the Mw is larger than 300000, the material may be gelated to cause a difficulty in film formation. Note that the weight-average molecular weight (Mw) is a value obtained by determining a polystyrene-equivalent weight-average molecular weight by gel permeation chromatography (GPC) using tetrahydrofuran as a solvent.

The red light-emitting layers 16CR and the green light-emitting layers 16CG emit light by the recombination of electrons and holes in response to the application of an electric field. For example, the thicknesses of each red light-emitting layer 16CR and each green light-emitting layer 16CG, depending on a whole element configuration, are preferably within a range of 10 nm to 200 nm both inclusive, and more preferably within a range of 15 nm to 150 nm both inclusive. The red light-emitting layers 16CR and the green light-emitting layers 16CG are made of a mixture material formed by adding a low-molecular material (a monomer or an oligomer) to a high-molecular (light-emitting) material.

Examples of the high-molecular material forming the red light-emitting layers 16CR and the green light-emitting layers 16CG include a polyfluorene-based high polymer derivative, a (poly)paraphenylene vinylene derivative, a polyphenylene derivative, a polyvinylcarbazole derivative, a polythiophene derivative, a perylene-based pigment, a coumarin-based pigment, a rhodamine-based pigment, or the above-described high-molecular material doped with an organic EL material. As a doping material, for example, rubrene, perylene, 9,10-diphenylanthracene, tetraphenyl butadiene, nile red or Coumarin6 is allowed to be used.

The low-molecular material added to the high-molecular material forming the red light-emitting layers 16CR and the green light-emitting layers 16CG is provided to improve hole or electron injection efficiency from the blue light-emitting layer 16CB as a common layer to the red light-emitting layers 16CR and the green light-emitting layers 16CG.

In an organic EL element in related art, the blue light-emitting layer 16CB as a common layer made of a low-molecular material is arranged over the red light-emitting layers 16CR and the green light-emitting layers 16CG made of only a high-molecular material, and a difference between the energy levels of the red light-emitting layers 16CR and the green light-emitting layers 16CG and the energy level of the blue light-emitting layer 16CB is large. Therefore, hole or electron injection efficiency between the blue light-emitting layer 16CB and each of the red light-emitting layers 16CR and the green light-emitting layers 16CG is very low, and as described above, there is an issue that intrinsic properties of light-emitting layers made of a high-molecular material are not sufficiently obtained. In the embodiment, to improve hole or electron injection properties, a low-molecular material (a monomer or an oligomer) for reducing a difference between the energy levels of the red light-emitting layers 16CR and the green light-emitting layers 16CG and the energy level of the blue light-emitting layer 16CB is added to the red light-emitting layers 16CR and the green light-emitting layers 16CG. Now, a relationship bewteen the highest occupied molecular orbital (HOMO) levels and the lowest unoccupied molecular orbital (LUMO) levels of the red light-emitting layers 16CR and green light-emitting layers 16CG, the HOMO level and the LUMO level of the blue light-emitting layer 16CB, and the HOMO level and the LUMO level of the low-molecular material added to the red light-emitting layers 16CR and the green light-emitting layers 16CG will be considered below. As a specific added low-molecular material, a compound having a value which is lower than the LUMO levels of the red light-emitting layer 16CR and the green light-emitting layer 16CG and higher than the LUMO level of the blue light-emitting layer, and a value which is higher than the HOMO levels of the red light-emitting layers 16CR and the green light-emitting layers 16CG and lower than the HOMO level of the blue light-emitting layer is selected.

Moreover, the low-molecular material added to the red light-emitting layer 16CR and the green light-emitting layer 16CG indicates a low-molecular material with a substantially single molecular weight except for a compound configured of molecules of a polymer or a condensation product having a high molecular weight which is produced by repeating the same or similar reaction in chain by a low-molecular compound. Moreover, in the low-molecular material, a new chemical bond between molecules does not occur by heating, and the low-molecular material is present in a single molecular form. The weight-average molecule weight (Mw) of the low-molecular material is preferably 50000 or less, because compared to a material with a large molecular weight of, for example, larger than 50000, a material with a small molecular weight to some extent has various properties, and hole or electron mobility, a band gap, solubility to a solvent, or the like in the material is easily adjusted. Moreover, as the additive amount of the low-molecular material, a mixture ratio between the high-molecular material and the low-molecular material used in the red light-emitting layers 16CR or the green light-emitting layers 16CG is preferably within a range of 10:1 to 1:2 both inclusive in weight ratio. In the case where the mixture ratio between the high-molecular material and the low-molecular material is smaller than 10:1, an effect by addition of the low-molecular material is reduced. Moreover, in the case where the mixture ratio is larger than 1:2, it is difficult to obtain properties of the high-molecular material as the light-emitting material.

As such a low-molecular material, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugated monomer or oligomer such as a polysilane-based compound, a vinylcarbazole-based compound, a thiophene-based compound or an aniline-based compound is allowed to be used.

More specifically, α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)p-phenylenediamine, N,N,N',N'-tetraphenyl-4,4'-diaminobiphenyl, N-phenylcarbazole, 4-di-p-tolylaminostilbene, poly(paraphenylene vinylene), poly(thiophene vinylene), and poly(2,2'-thienylpyrrole) or the like is used, but the low-molecular material is not limited thereto.

More preferably, low-molecular materials represented by the following formulas (1) to (3) are used.

Chemical Formula 1

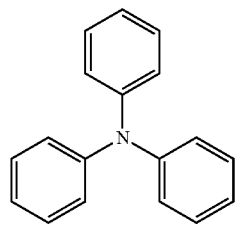

(1)

where A1 to A3 each are an aromatic hydrocarbon group, a heterocyclic group or a derivative thereof Chemical Formula 2

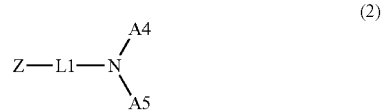

(2)

where Z is a nitrogen-containing hydrocarbon group or a derivative thereof, L1 is a group in which 1 to 4 divalent aromatic ring groups are bonded, more specifically a divalent group in which 1 to 4 aromatic rings are connected, or a derivative thereof, A4 and A5 each are an aromatic hydrocarbon group, an aromatic heterocyclic group or a derivative thereof, and A4 and A5 may be bonded to each other to form a cyclic structure.

Chemical Formula 3

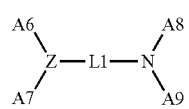

(3)

where L2 is a group in which 2 to 6 divalent aromatic ring groups are bonded, more specifically a bivalent group in which 2 to 6 aromatic rings are connected, or a derivative thereof, A6 to A9 each are a group in which 1 to 10 aromatic hydrocarbon groups, 1 to 10 heterocyclic groups or 1 to 10 derivatives thereof are bonded.

Specific examples of a compound represented by the formula (1) include compounds represented by the following formulas (I-1) to (1-48).

Chemical Formula 4

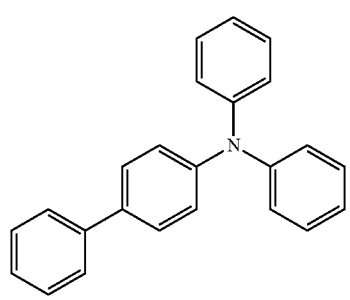

(1-1)

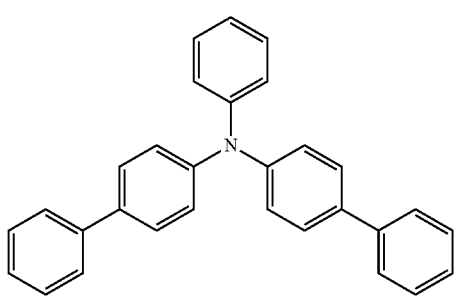

(1-2)

(1-3)

(1-4)

-continued
(1-5)
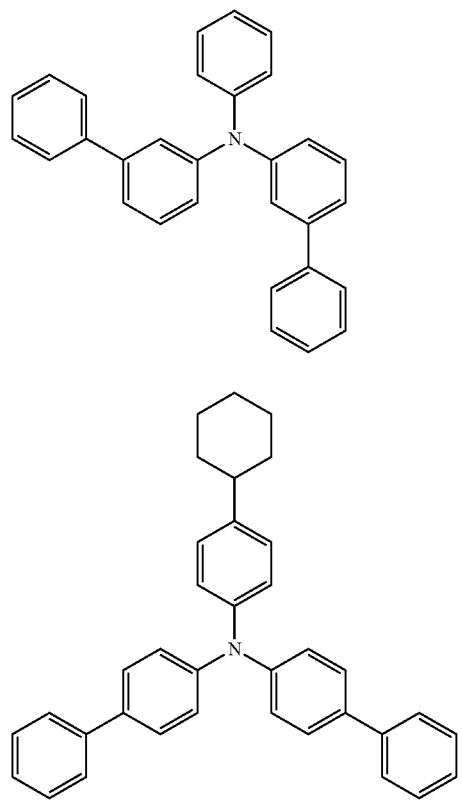
(1-6)
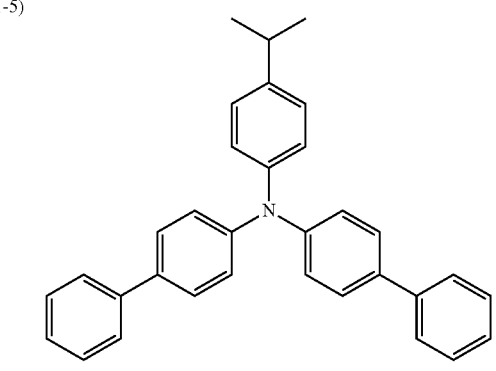
(1-7)
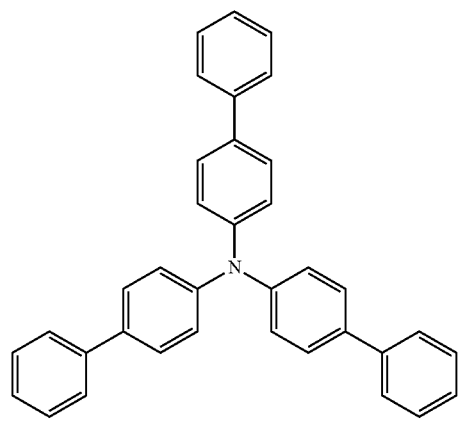
(1-8)
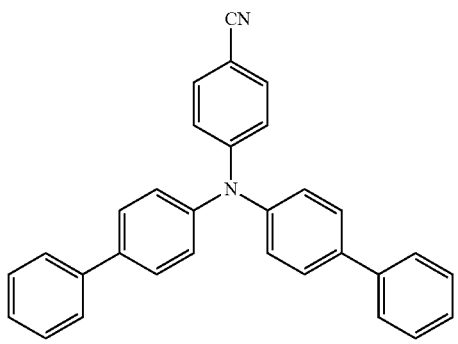
(1-9)
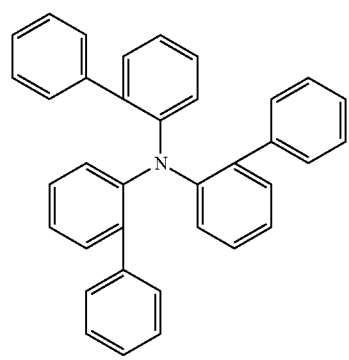
(1-10)
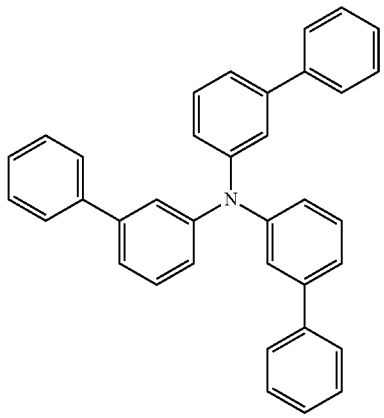
(1-11)
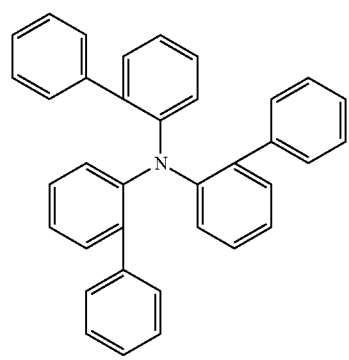
(1-12)
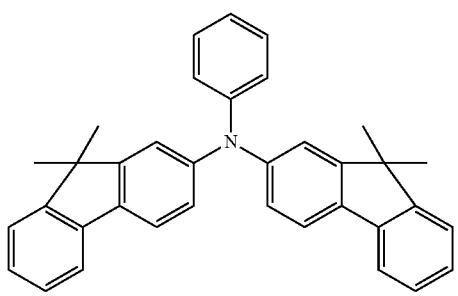

-continued
(1-13)
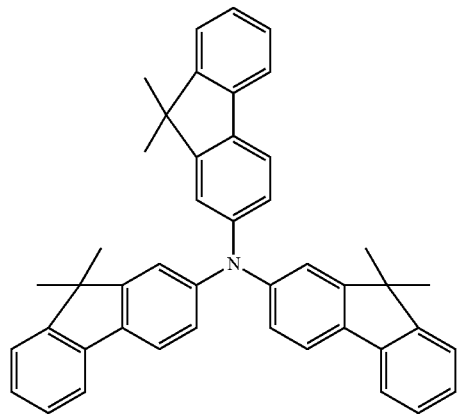
(1-14)
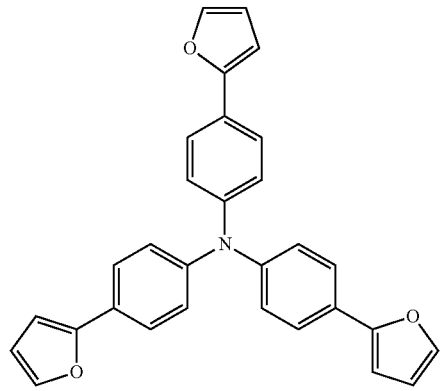
(1-15)
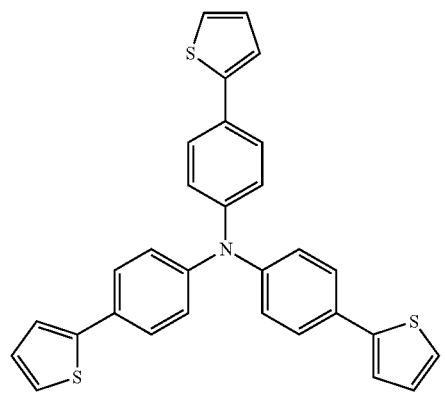
(1-16)
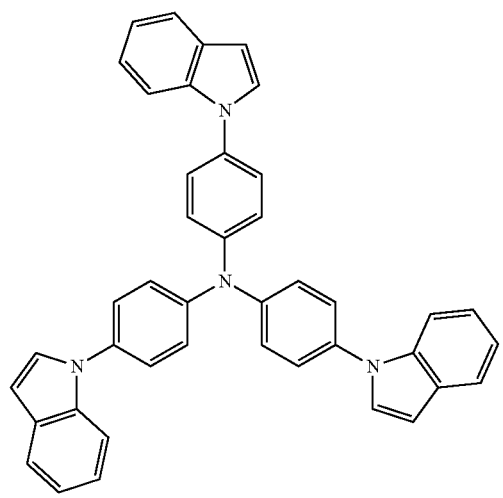
(1-17)
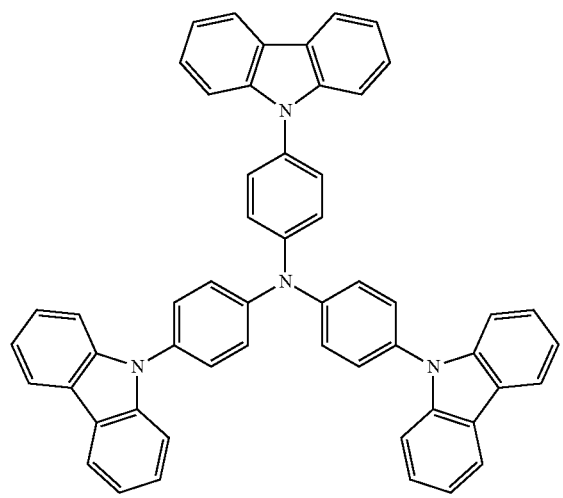
(1-18)
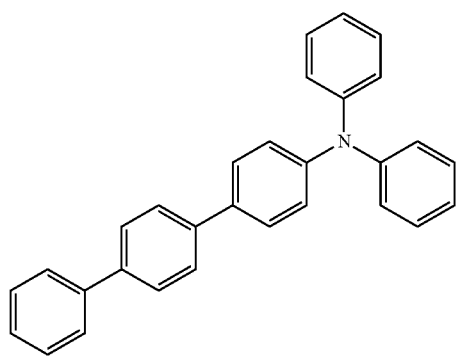

Chemical Formula 5
(1-19)
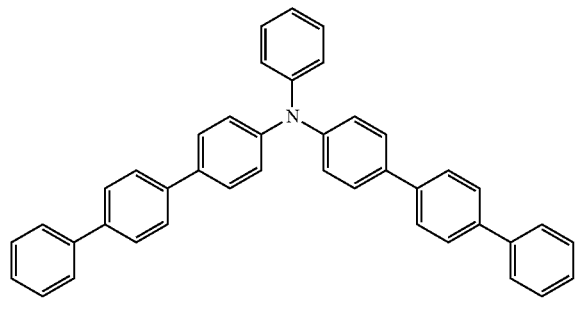
(1-20)
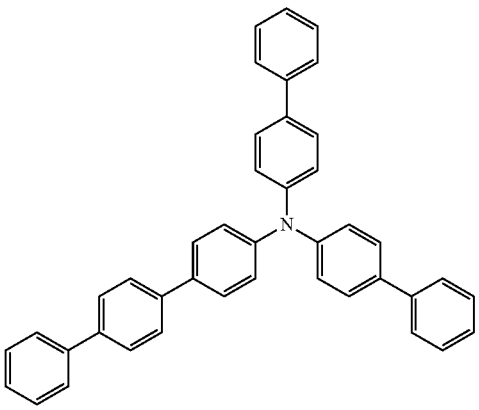
(1-21)
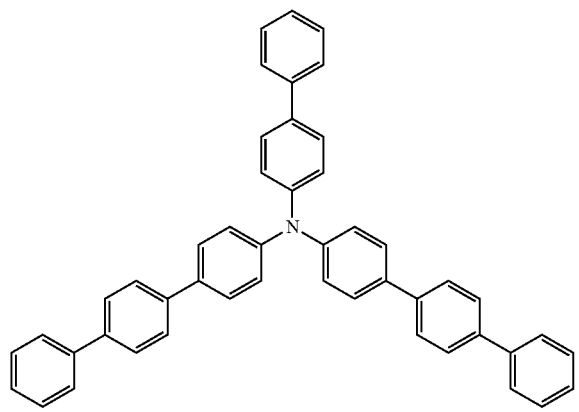
(1-22)
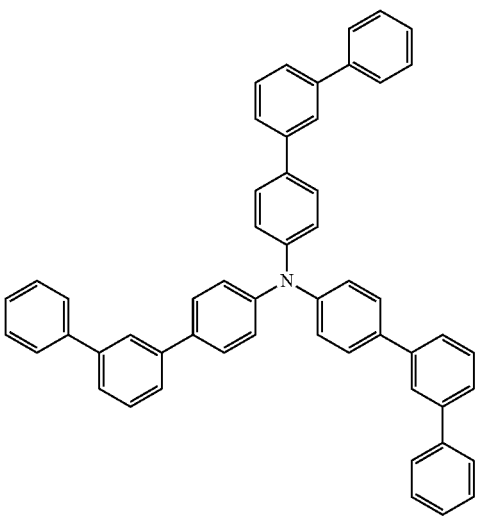
(1-23)
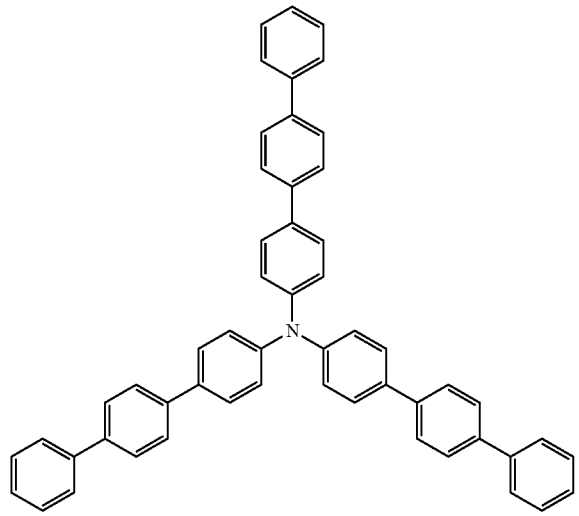
(1-24)
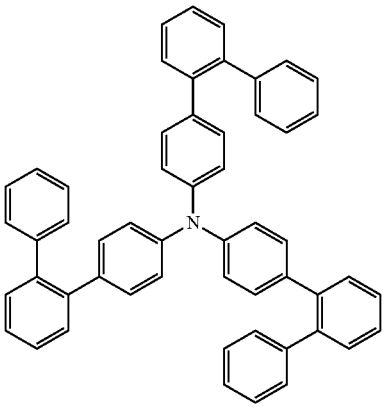

(1-25)
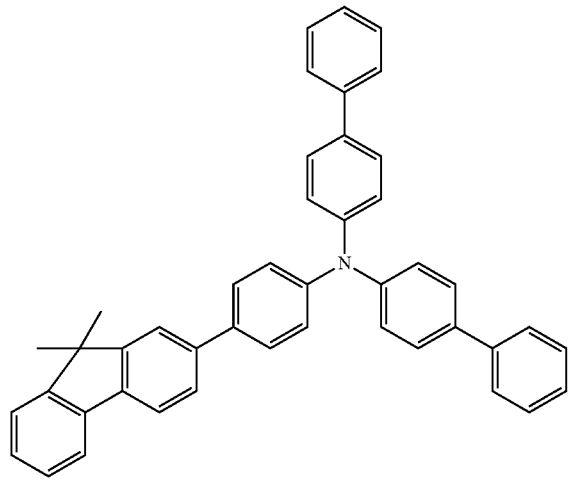
(1-26)
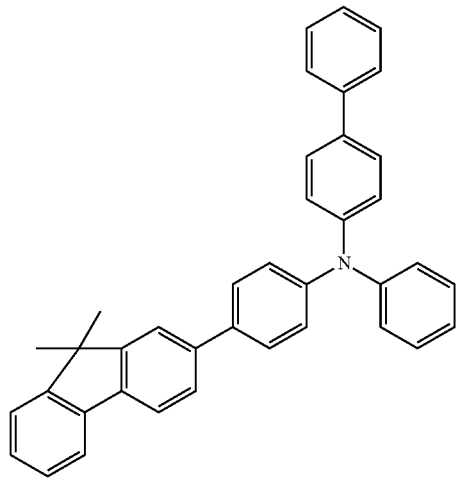
(1-27)
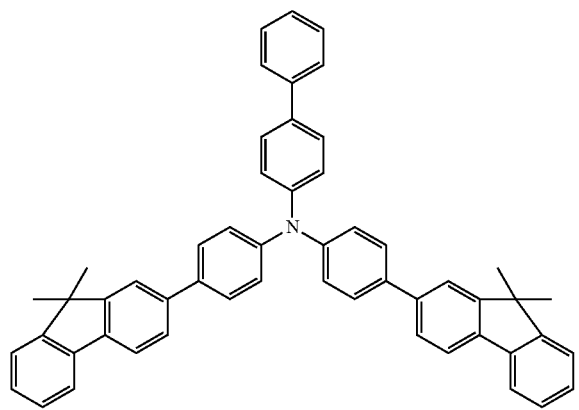
(1-28)
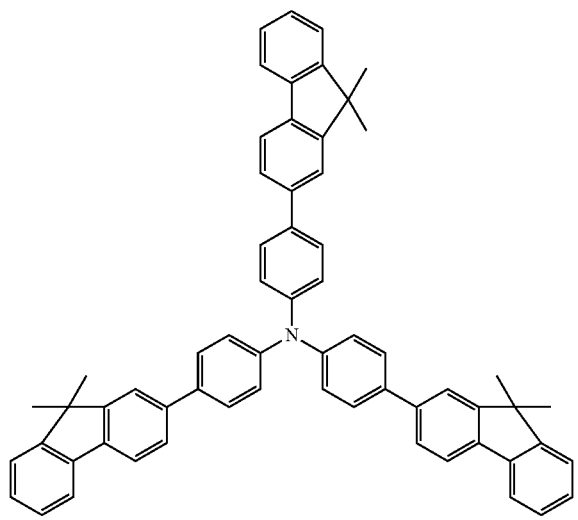
(1-29)
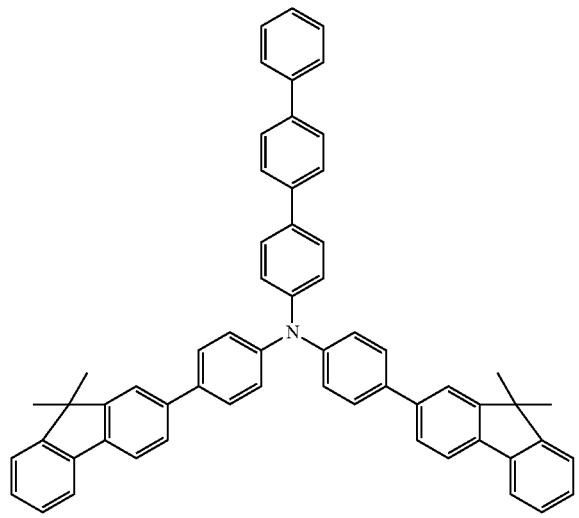
(1-30)
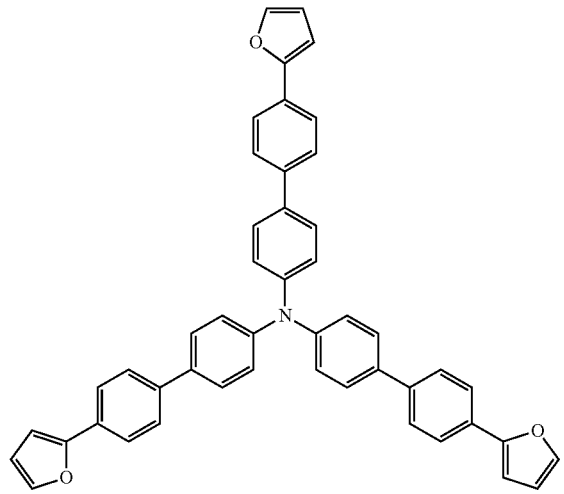

(1-31)
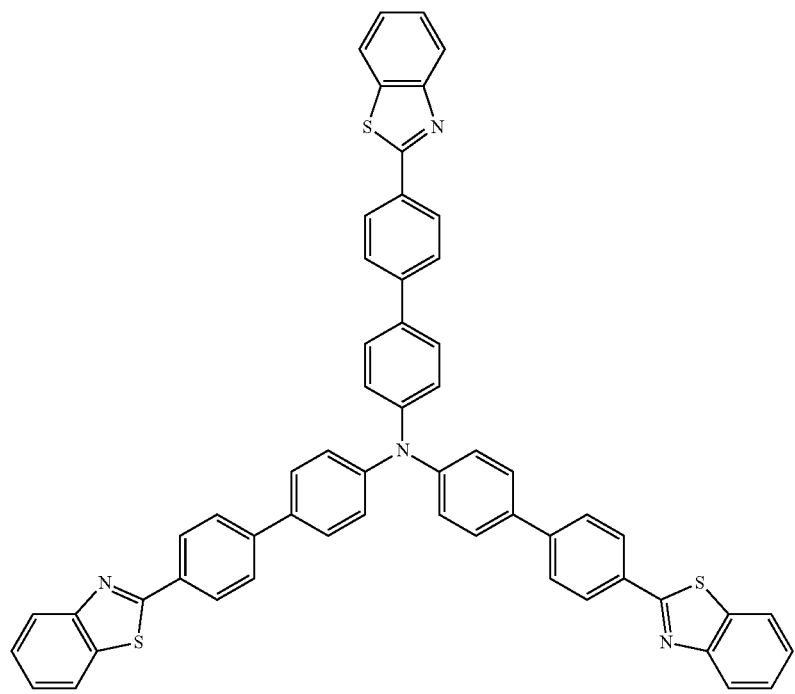
(1-32)
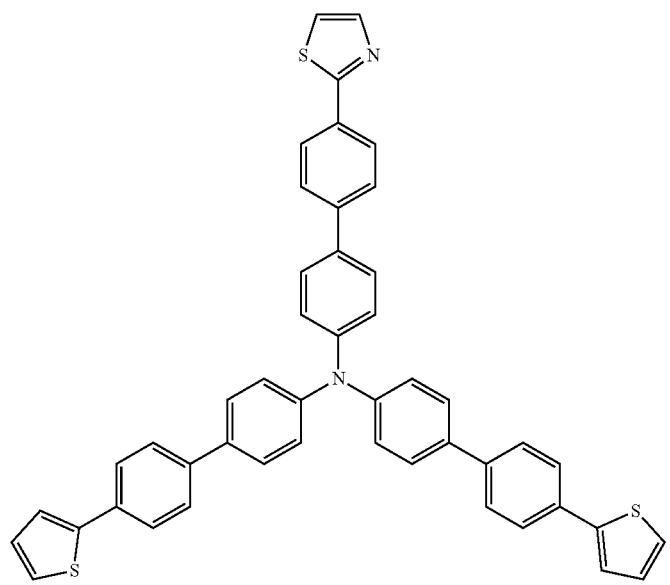

Chemical Formula 6
(1-33)
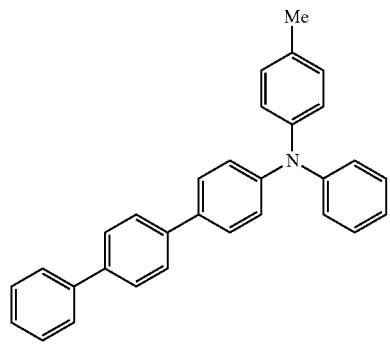
(1-34)
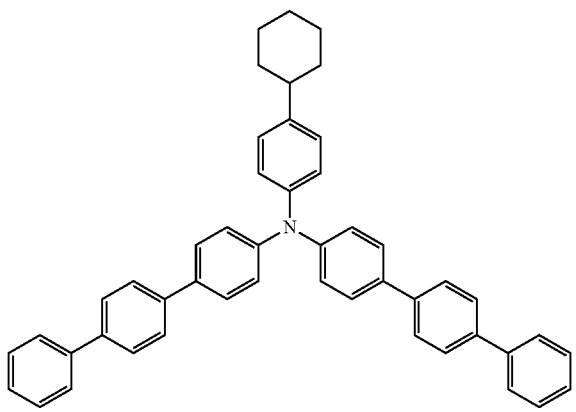
(1-35)
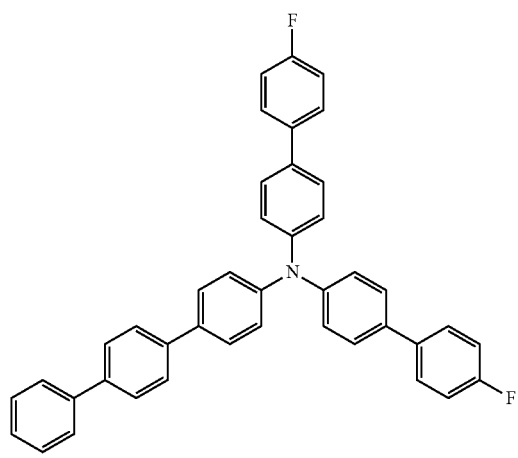
(1-36)
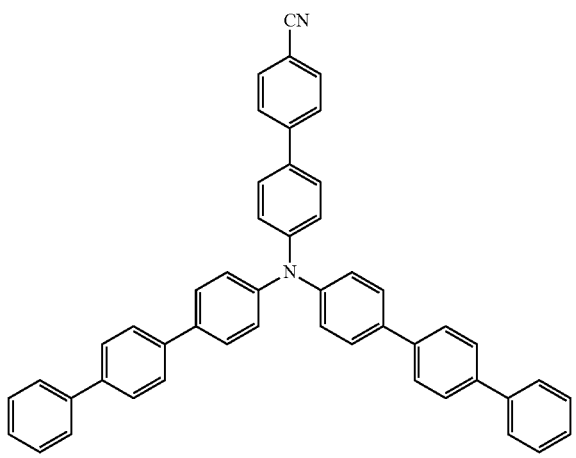
(1-37)
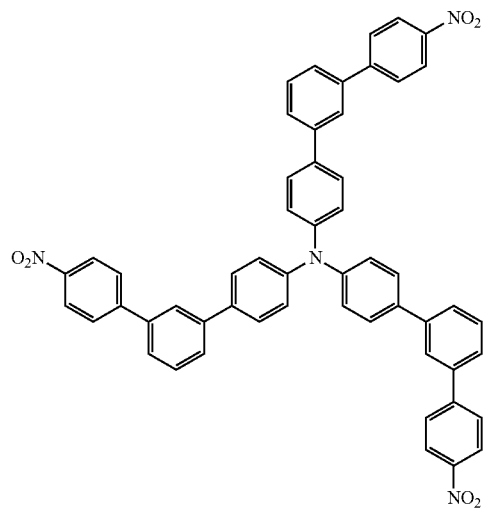
(1-38)
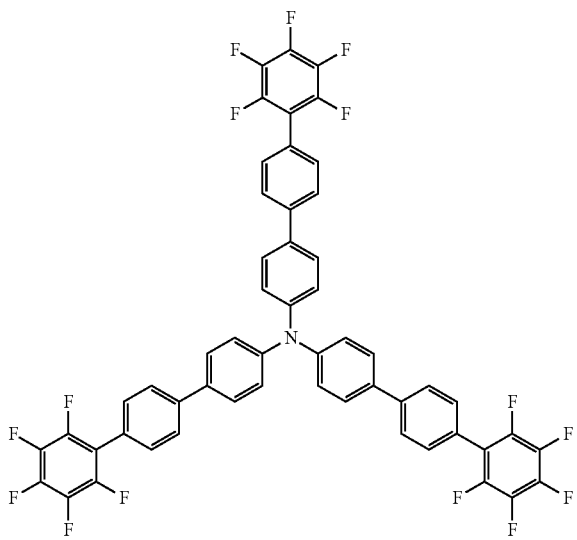

(1-39)
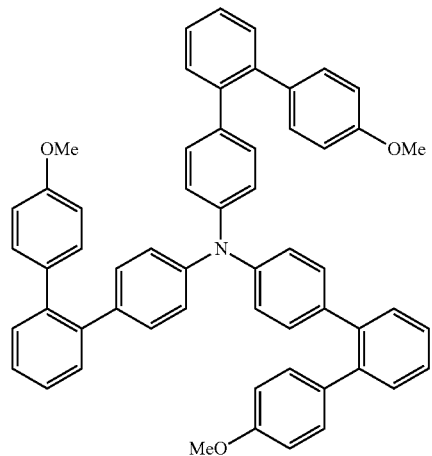
(1-40)
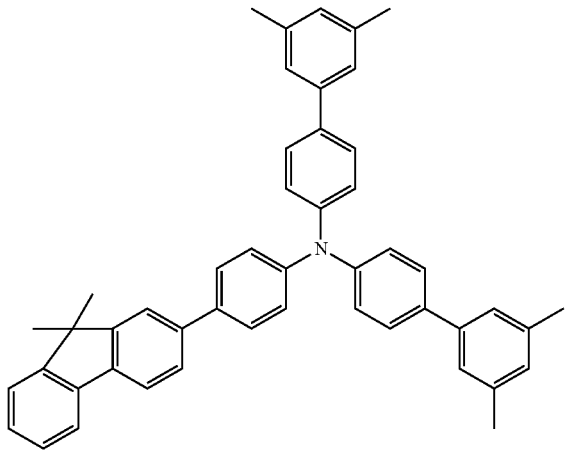
(1-41)
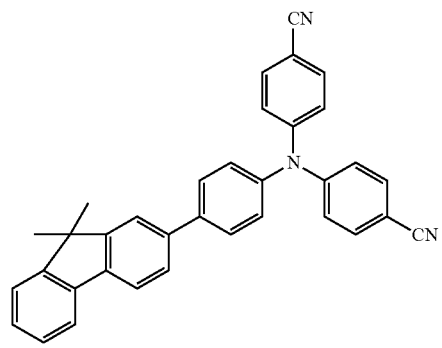
(1-42)
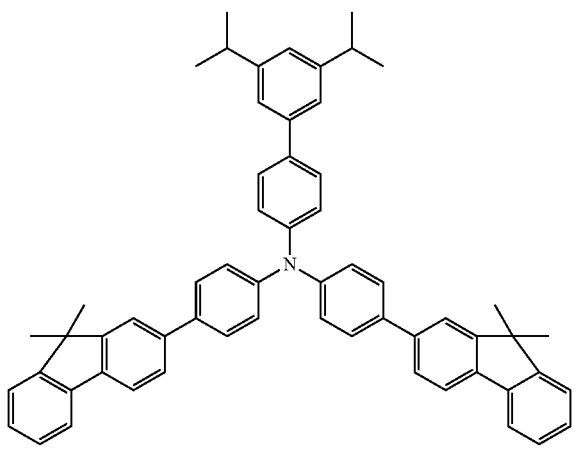
(1-43)
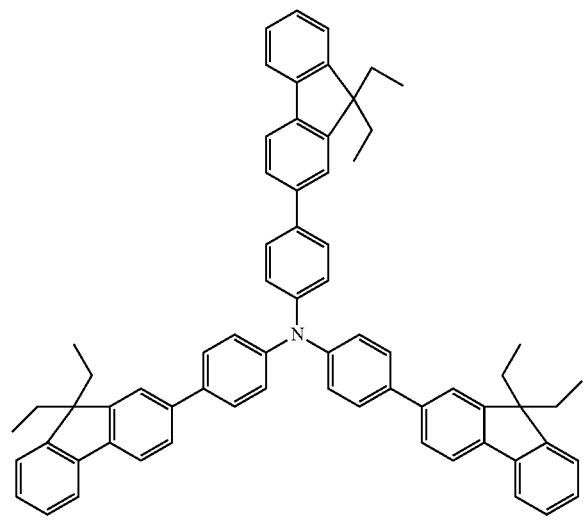
(1-44)
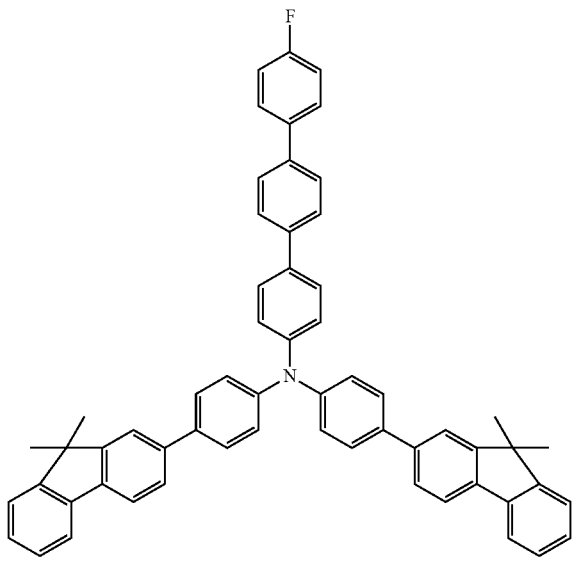

(1-45)
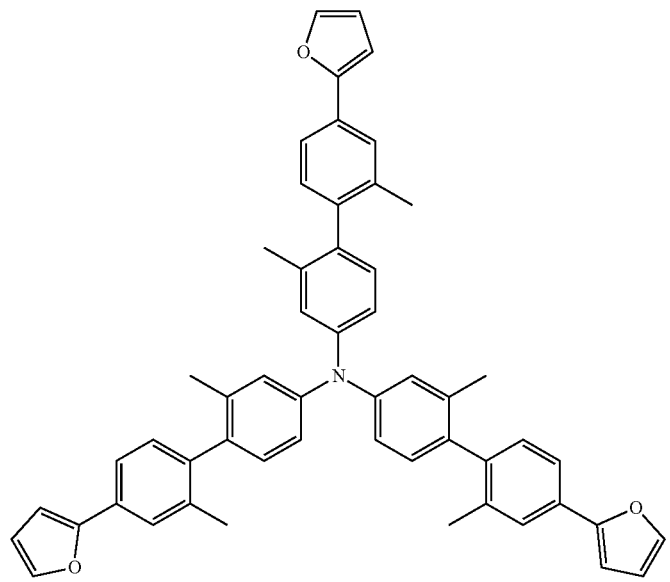
(1-46)
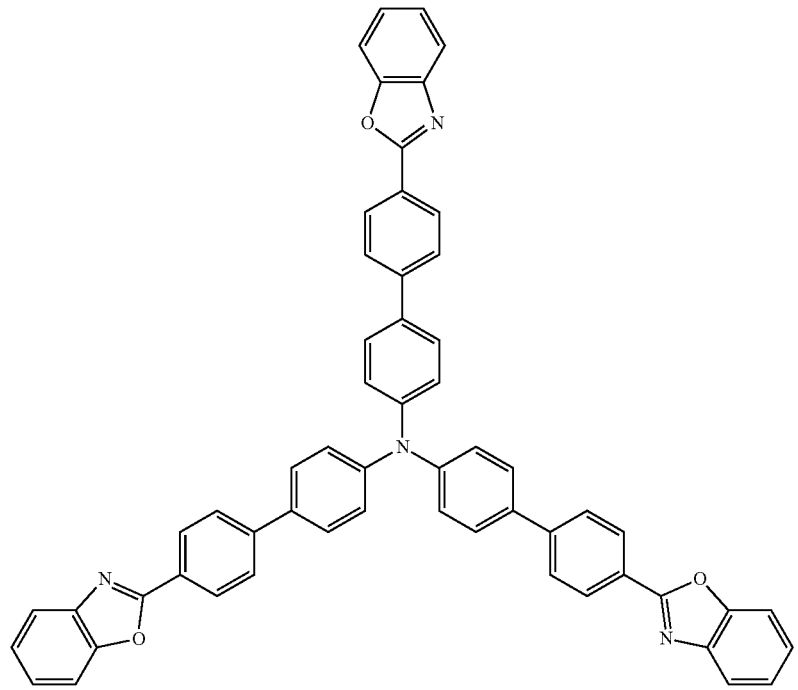

(1-47)

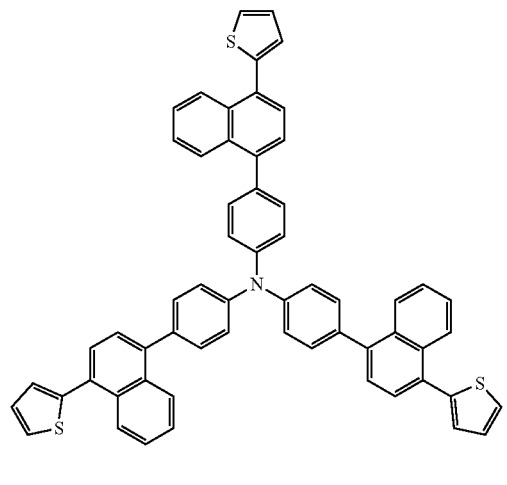

(1-48)

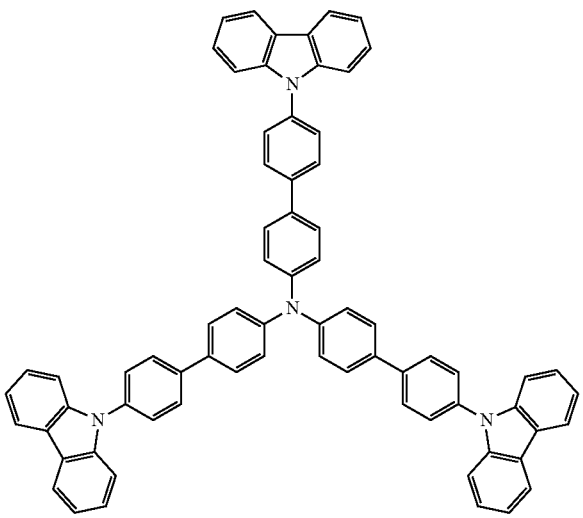

Specific examples of a compound represented by the formula (2) include compounds represented by the following formulas (2-1) to (2-69). Note that as a nitrogen-containing hydrocarbon group bonded to L1, for example, a compound including a carbazole group or an indole group is described herein, but the nitrogen-containing hydrocarbon group is not limited thereto. For example, an imidazole group may be used.

Chemical Formula 7

(2-1)

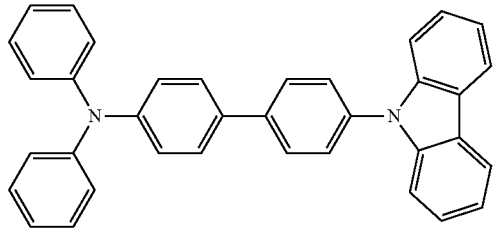

(2-2)

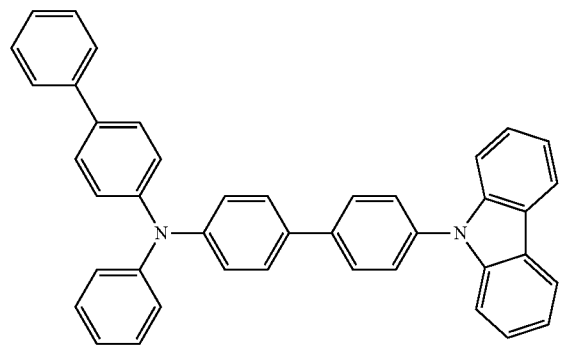

(2-3)

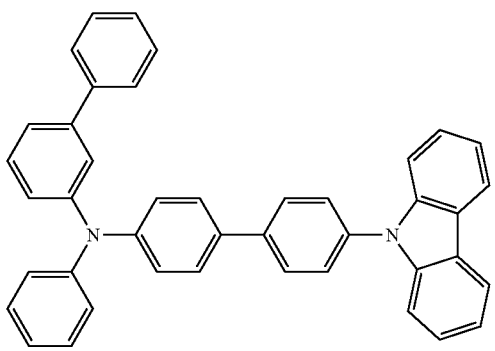

(2-4)

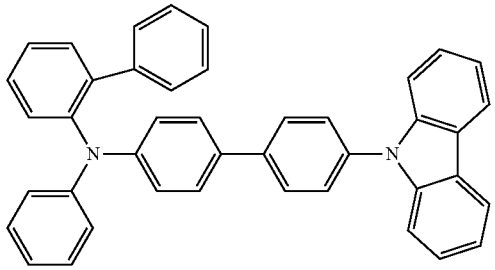

(2-5)
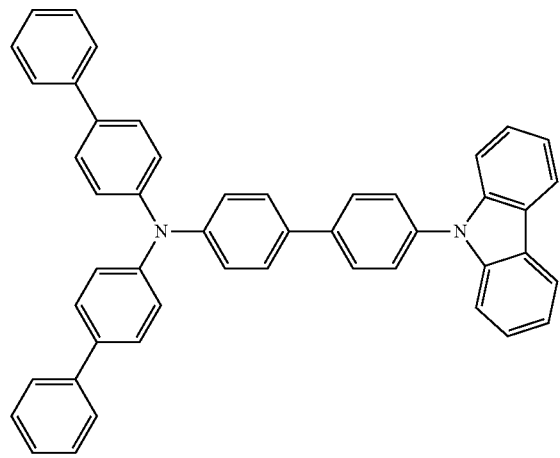
(2-6)
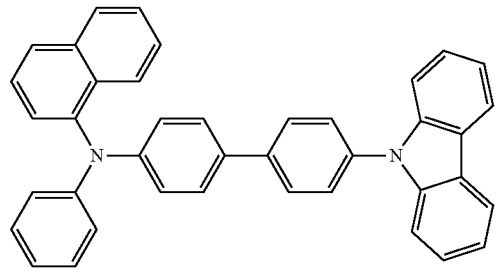
(2-7)
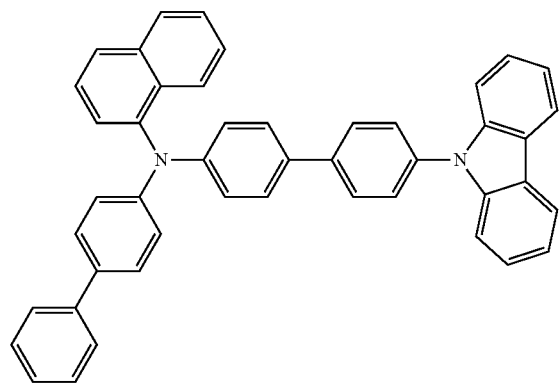
(2-8)
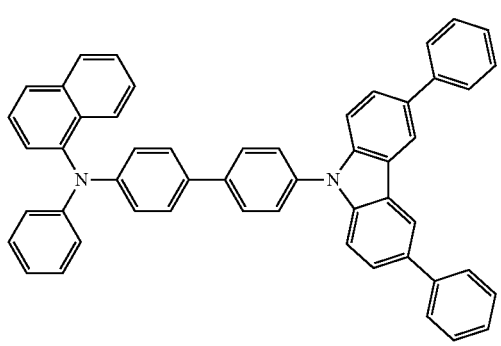
(2-9)
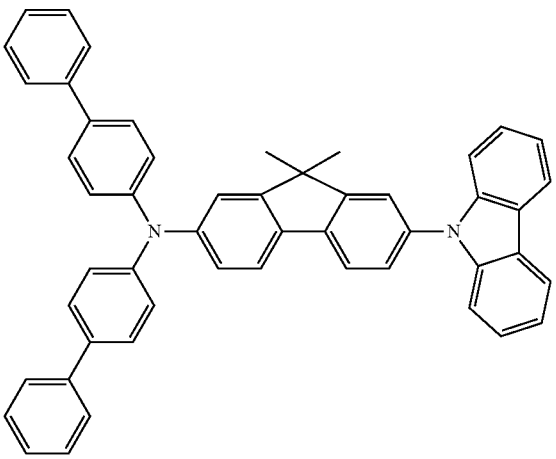
(2-10)
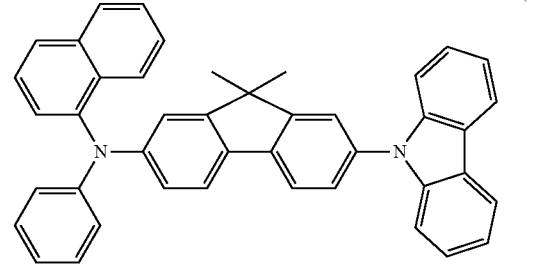
(2-11)
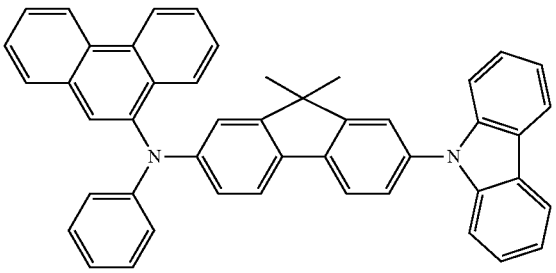
(2-12)
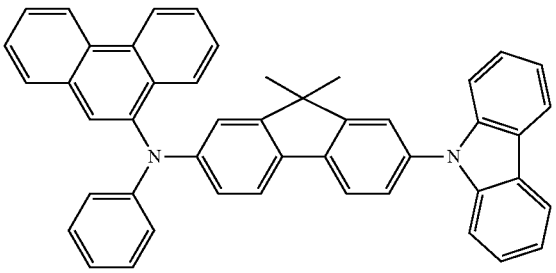

(2-13)
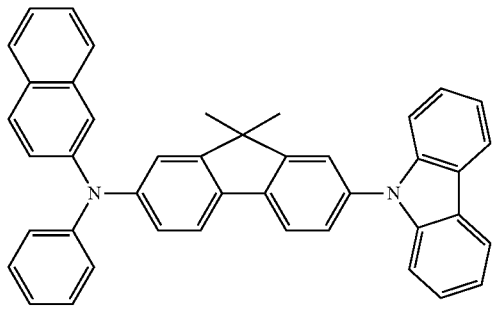
(2-14)
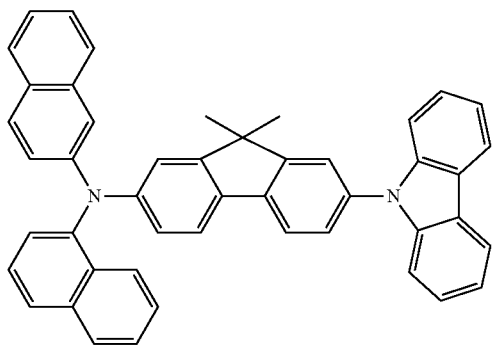
(2-15)
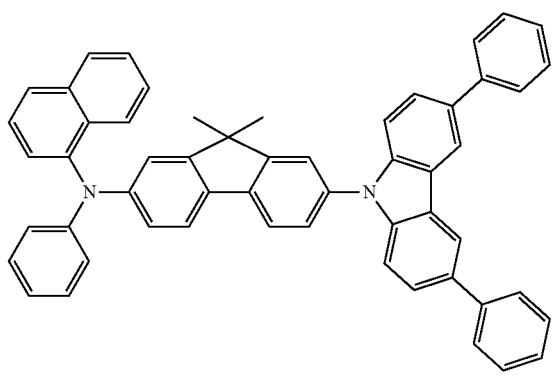
(2-16)
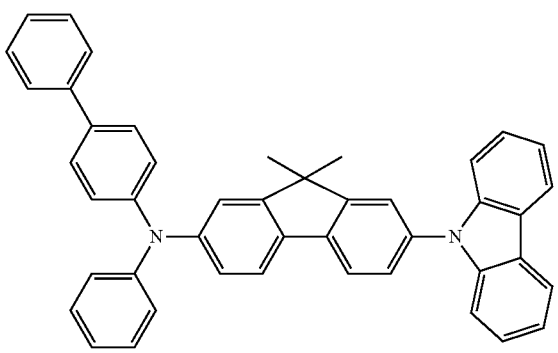
Chemical Formula 8
(2-17)
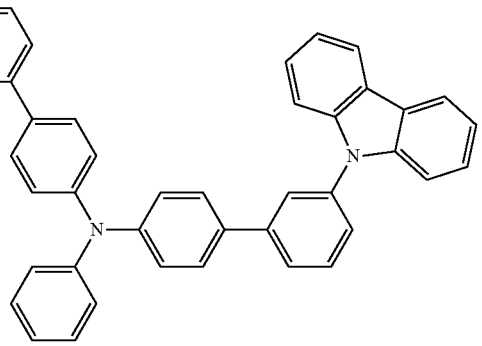
(2-18)
(2-19)
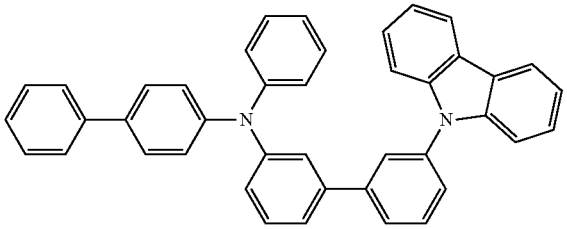
(2-20)

(2-21)
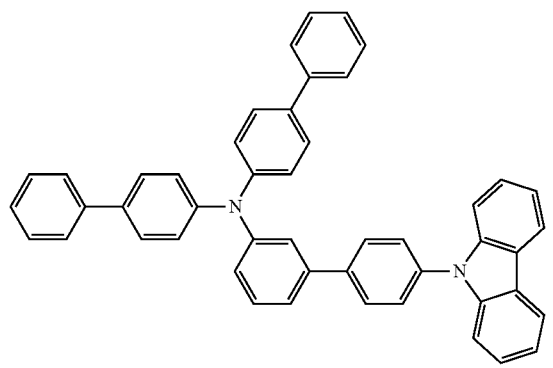
(2-25)
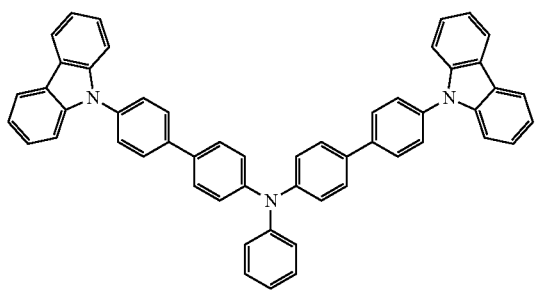
(2-22)
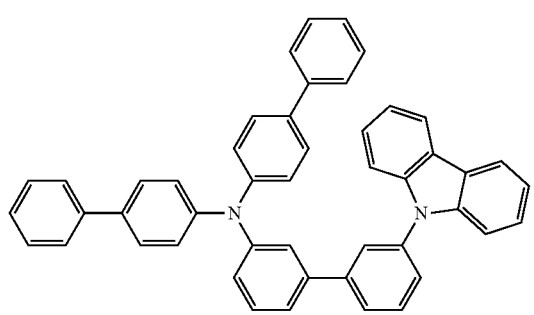
(2-26)
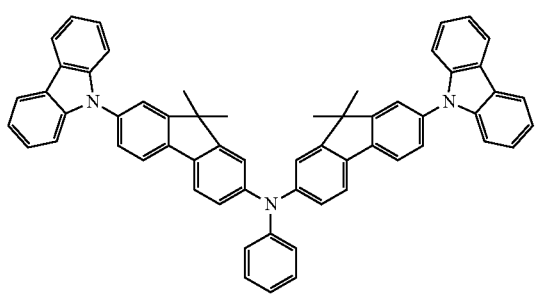
(2-23)
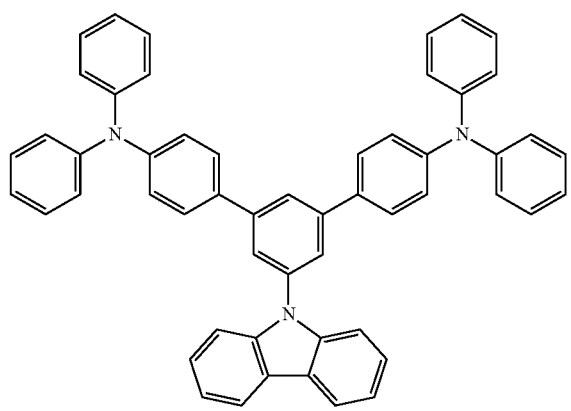
(2-27)
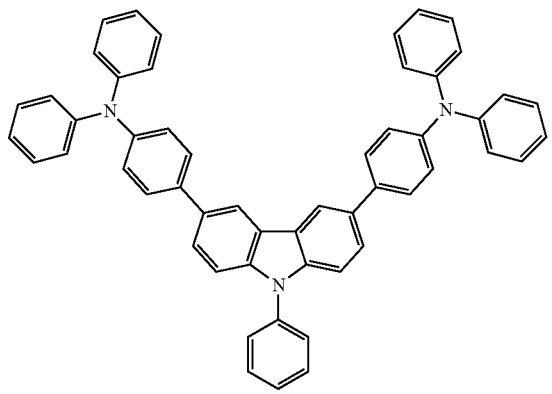
(2-24)
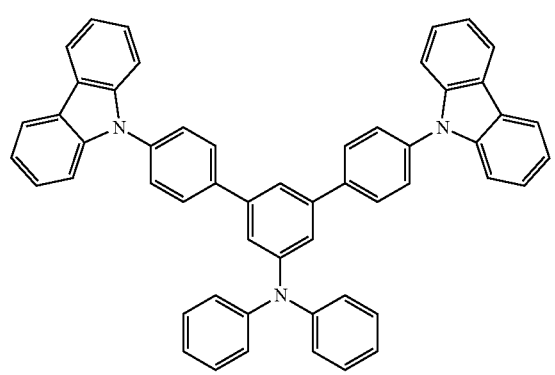
(2-28)
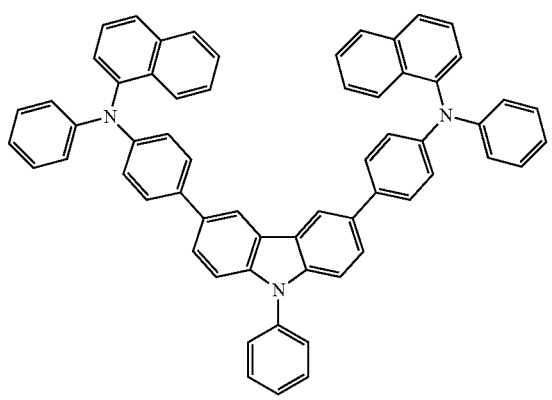

Chemical Formula 9
(2-29) 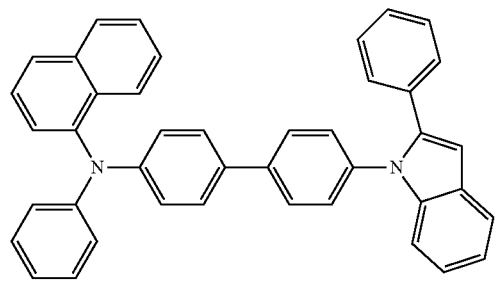
(2-30) 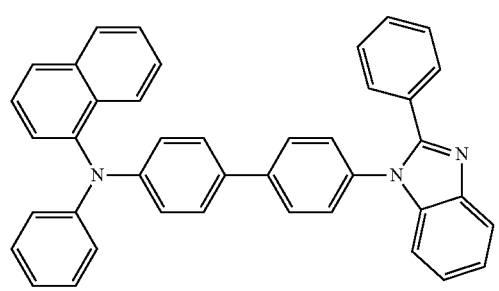
(2-31) 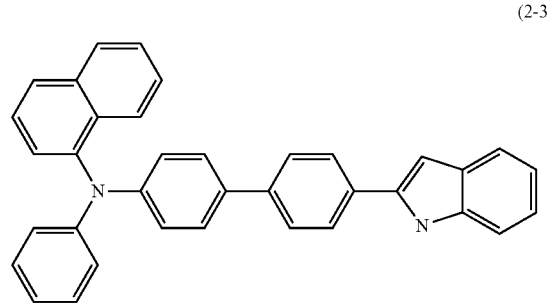
(2-32) 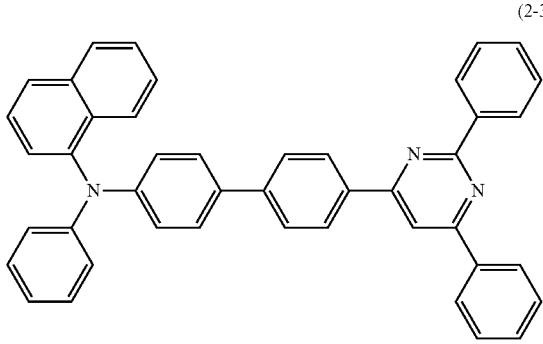
(2-33) 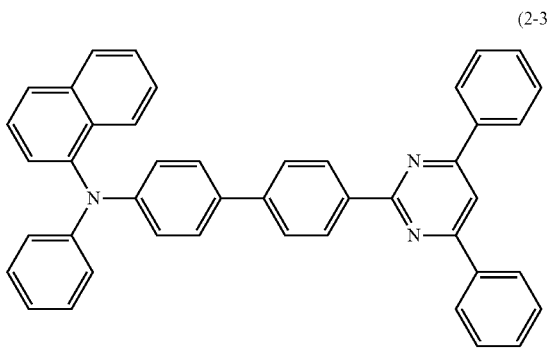
(2-34) 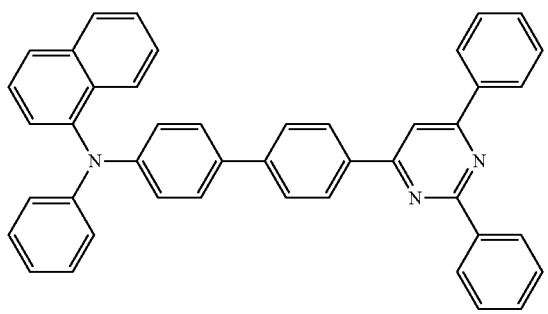
(2-35) 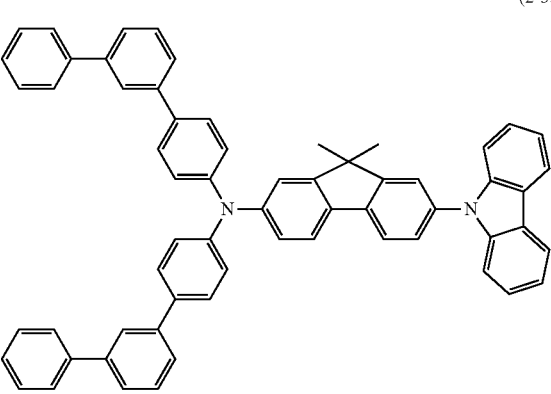
(2-36) 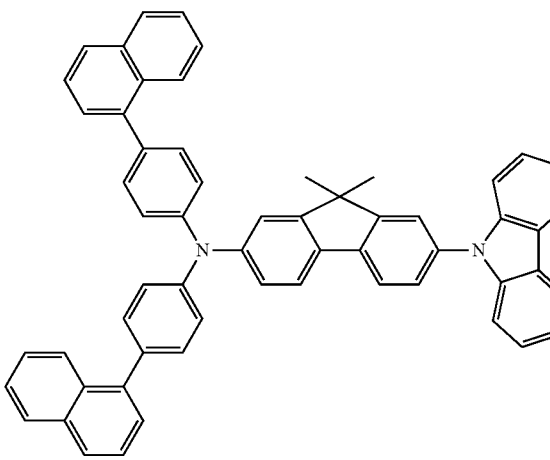
(2-37) 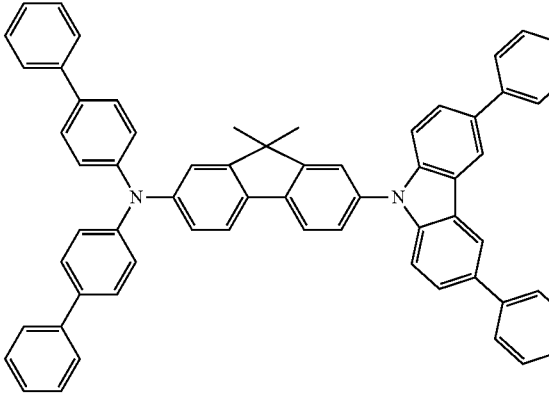

(2-38)
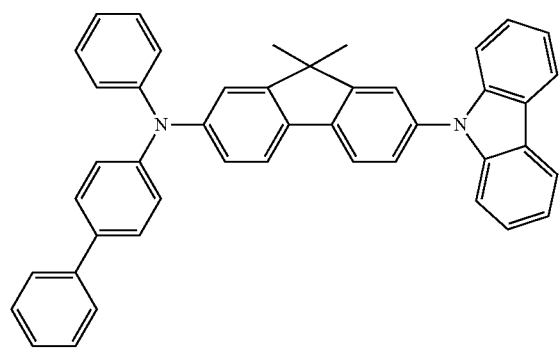
(2-41)
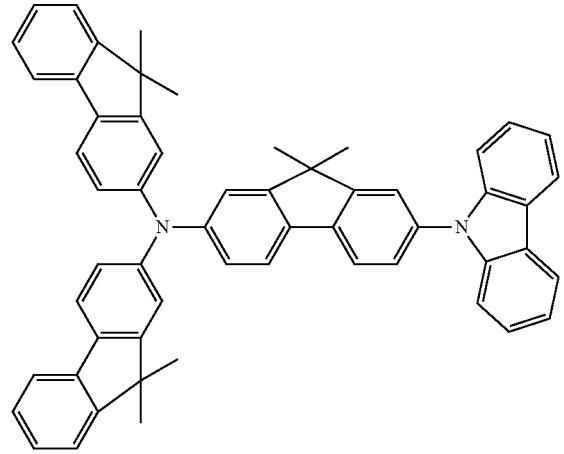
(2-39)
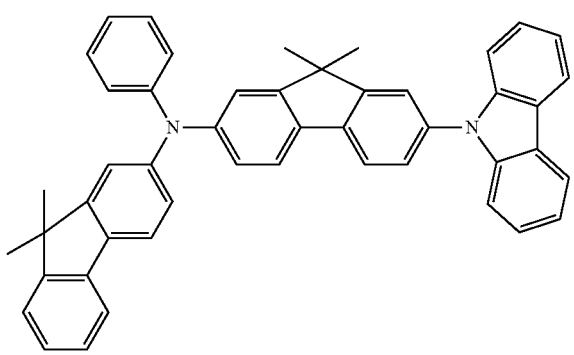
(2-42)
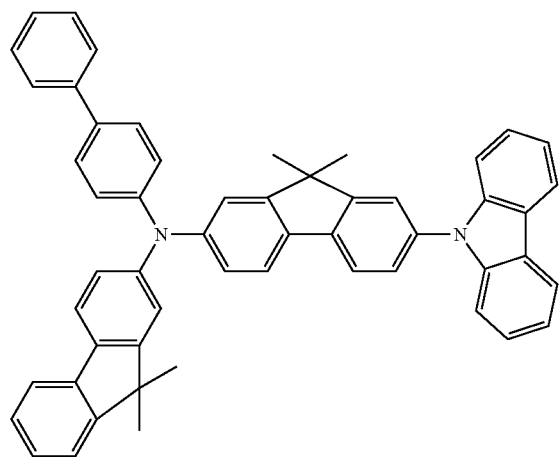
Chemical Formula 10
(2-43)
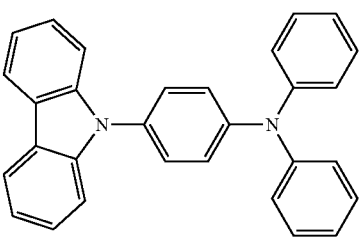
(2-40)
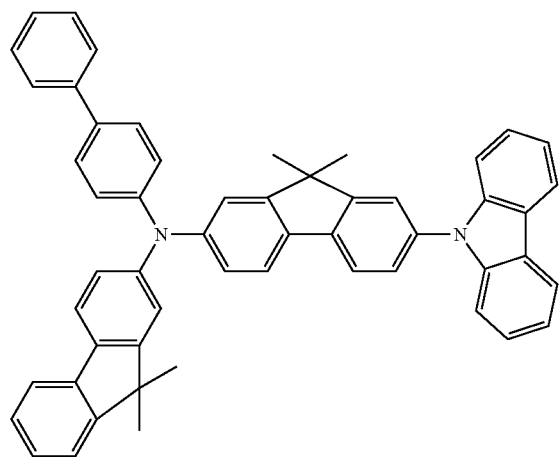
(2-44)
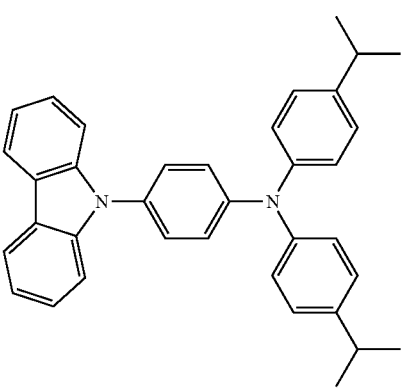

-continued
(2-45)
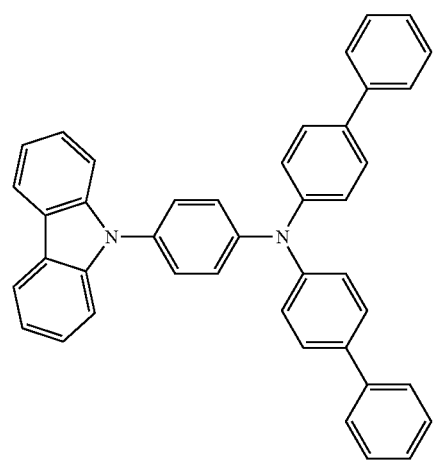
(2-46)
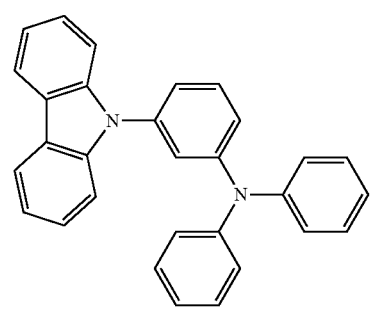
(2-47)
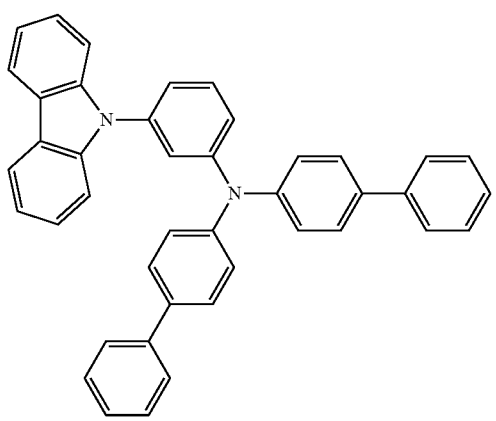
(2-48)
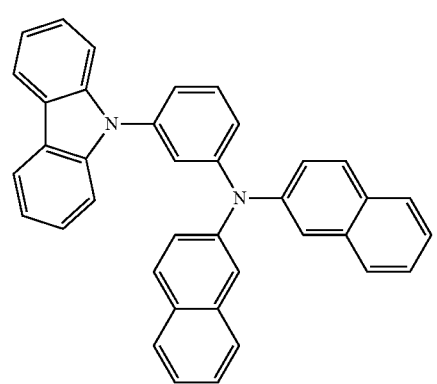
-continued
(2-49)
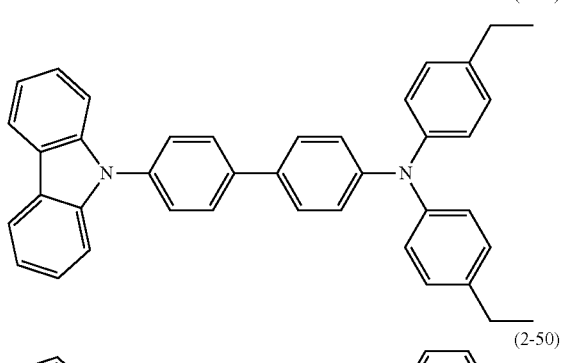
(2-50)
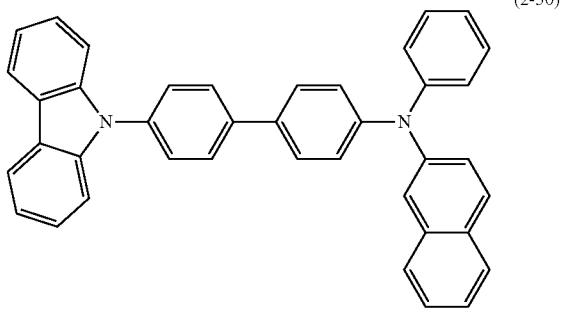
(2-51)
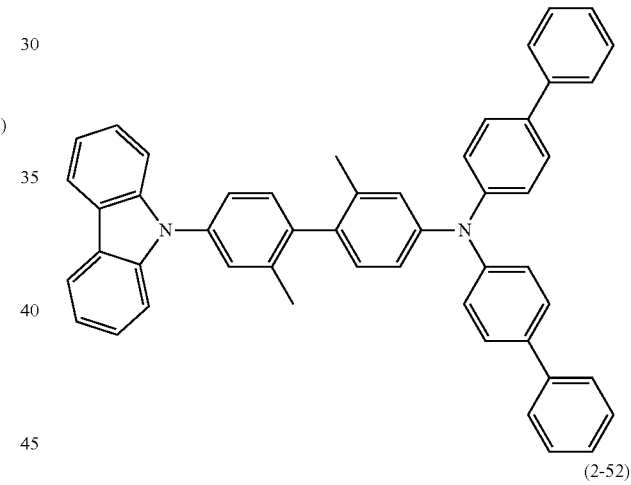
(2-52)
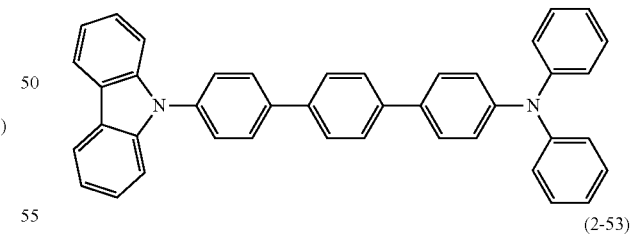
(2-53)
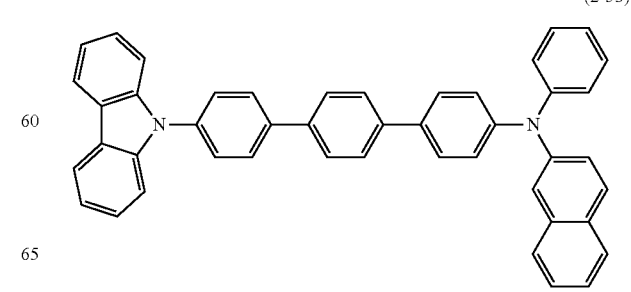

(2-54)
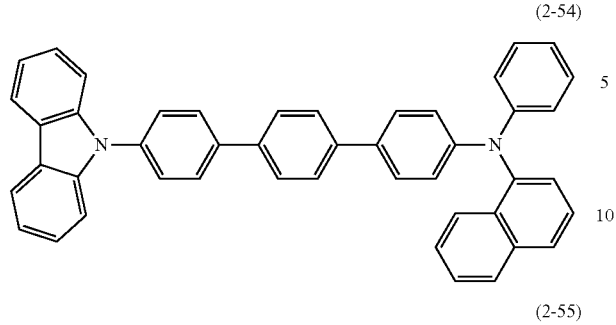
(2-55)
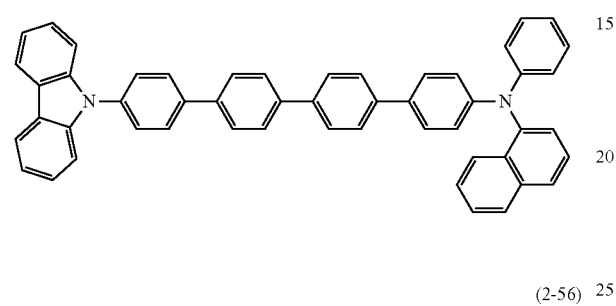
(2-56)
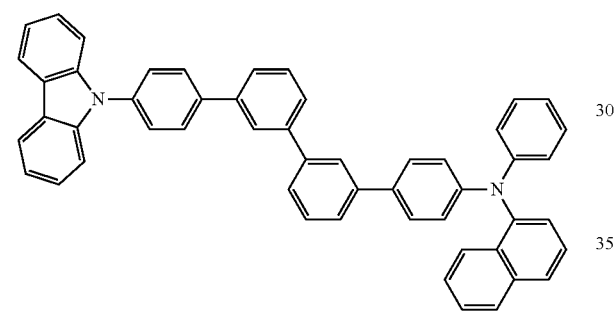
(2-57)
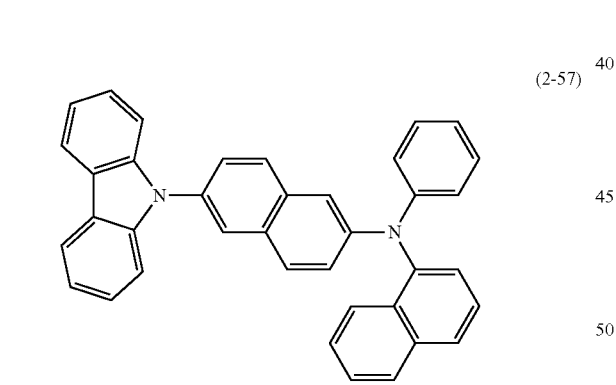
Chemical Formula 11
(2-58)
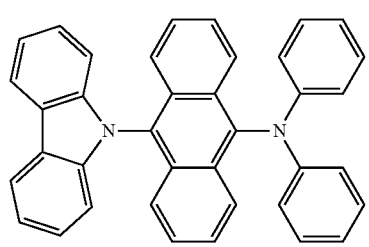
(2-59)
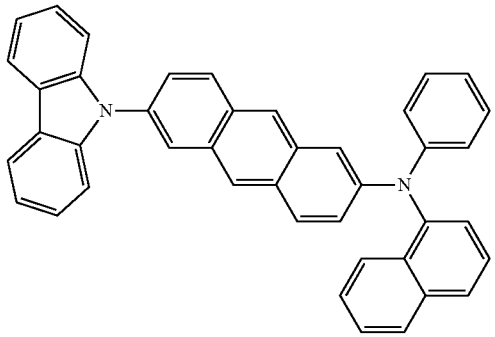
(2-60)
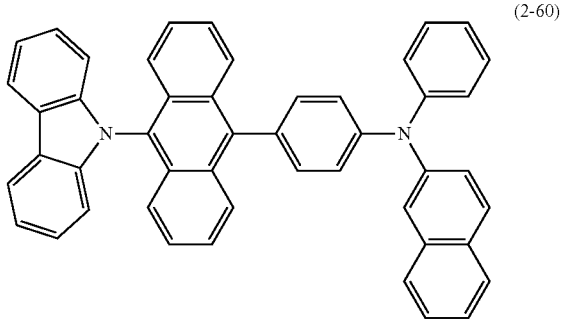
(2-61)
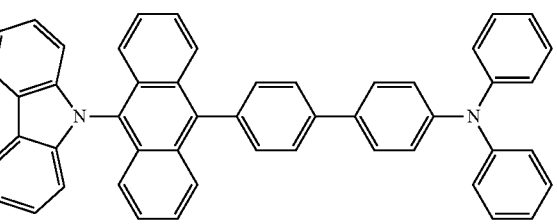
(2-62)
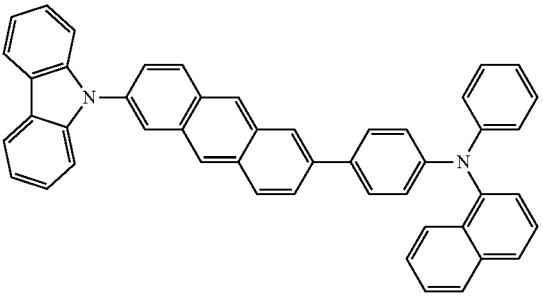
(2-63)

(2-64)
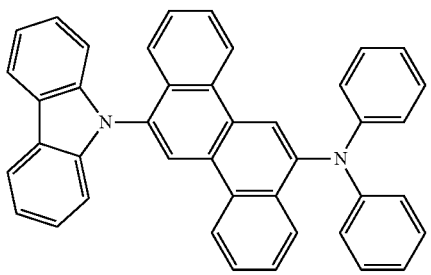
(2-65)
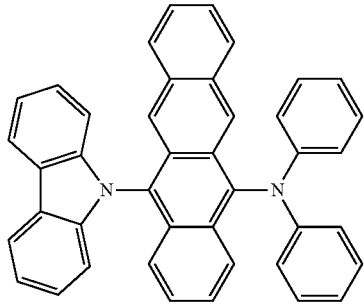
(2-66)
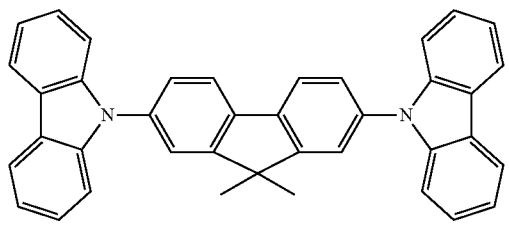
(2-67)
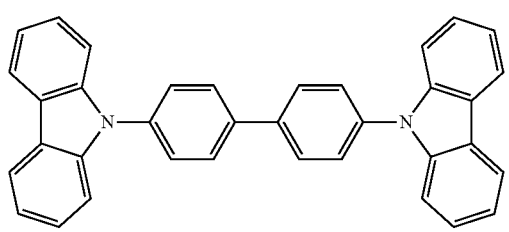
(2-68)
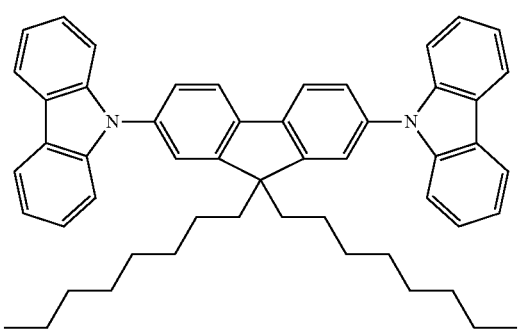
(2-69)
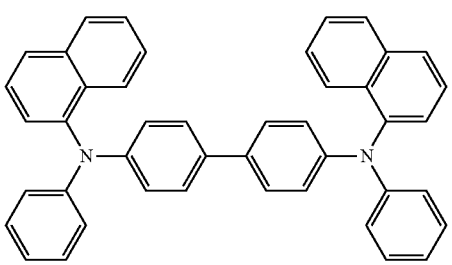
Specific examples of a compound represented by the formula (3) include compounds represented by the following formulas (3-1) to (3-45).
Chemical Formula 12
(3-1) (3-2)
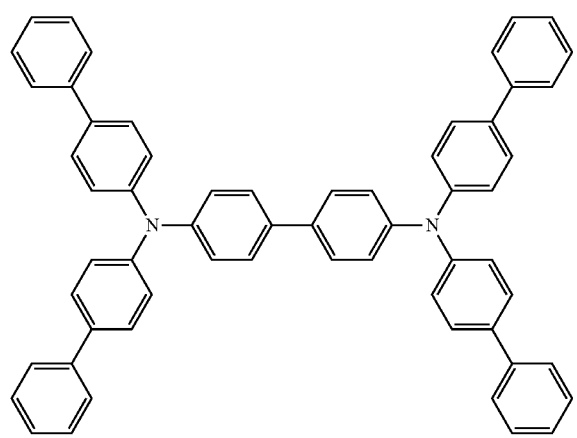

-continued
(3-3)
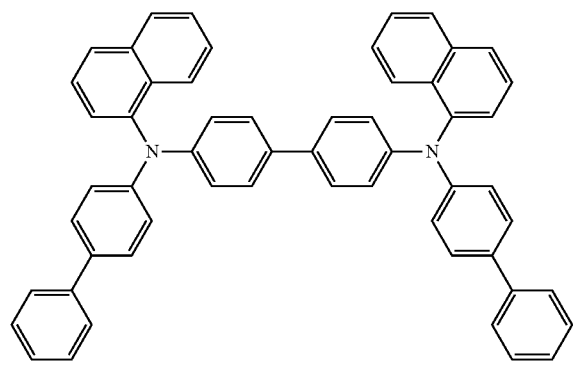
(3-4)
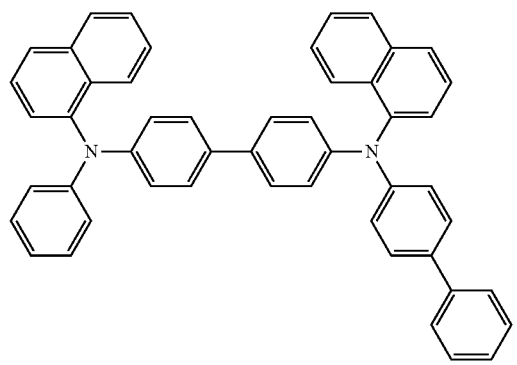
(3-5)
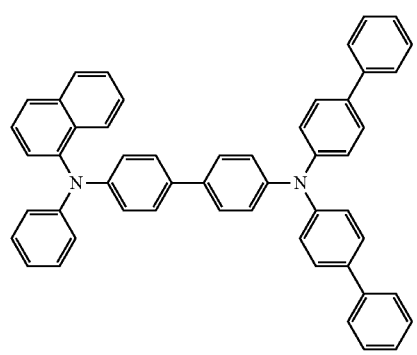
(3-6)
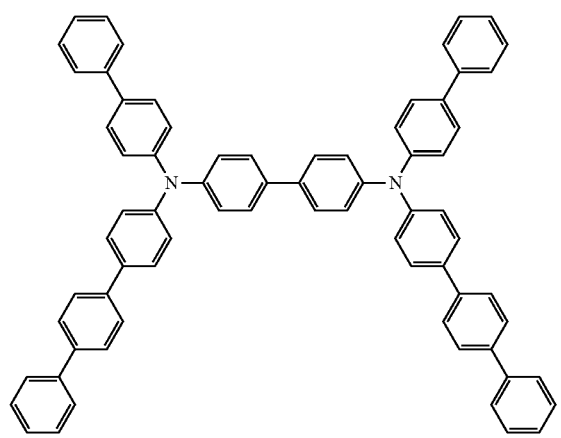
(3-7)
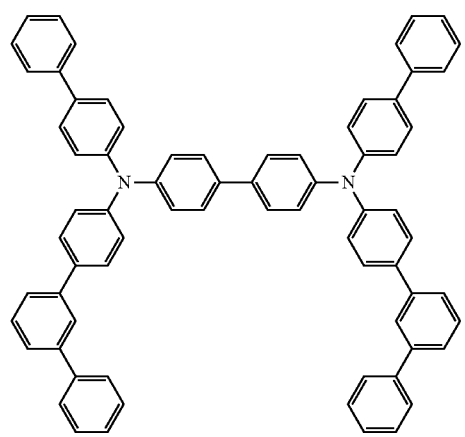
(3-8)
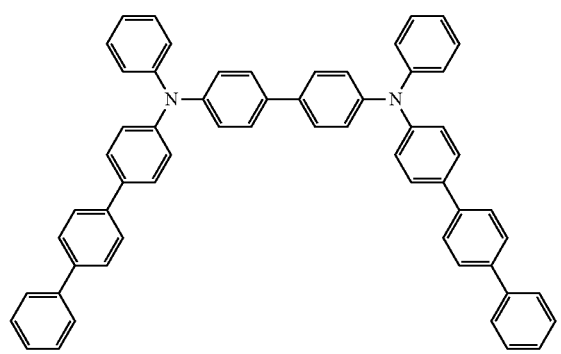

-continued
(3-9)
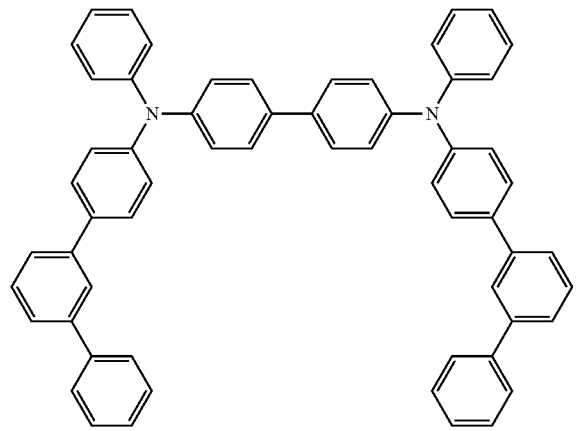
(3-10)
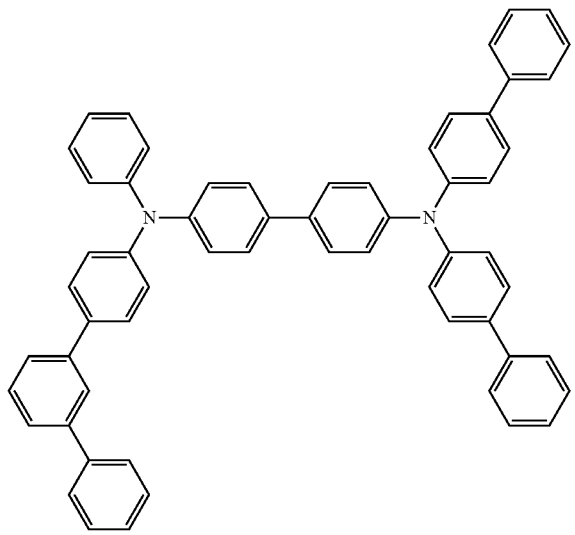
(3-11)
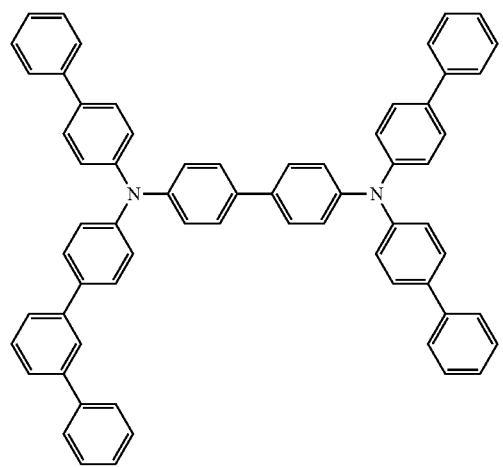
(3-12)
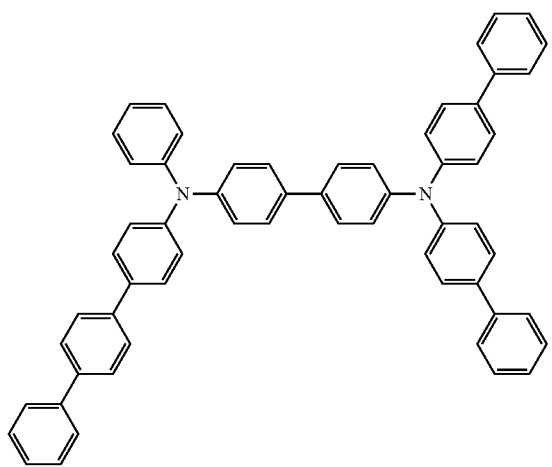
Chemical Formula 13
(3-13)
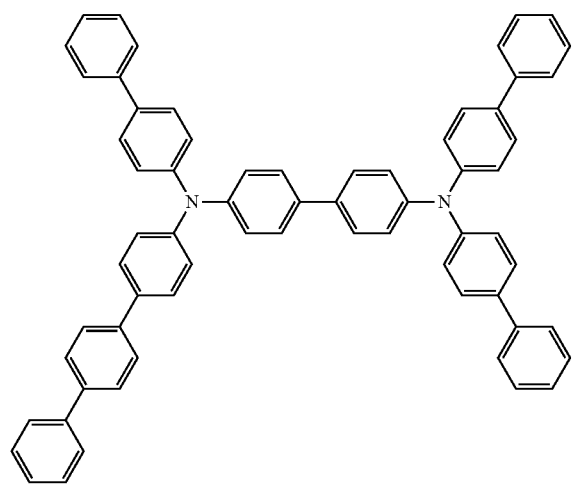
(3-14)
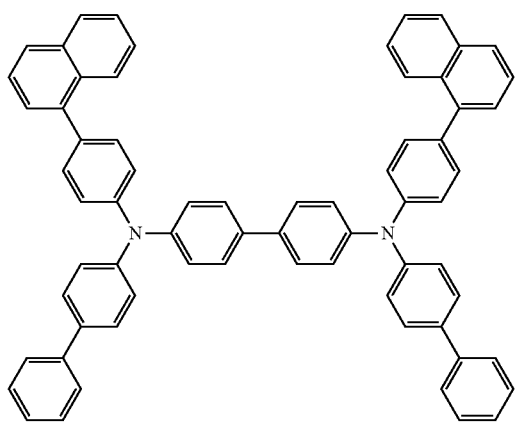

-continued
(3-15)
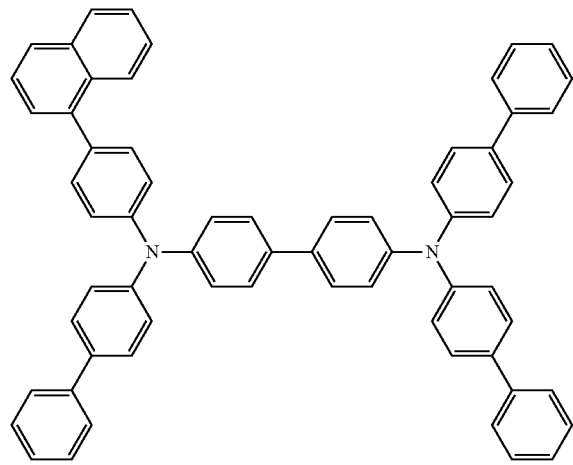
(3-16)
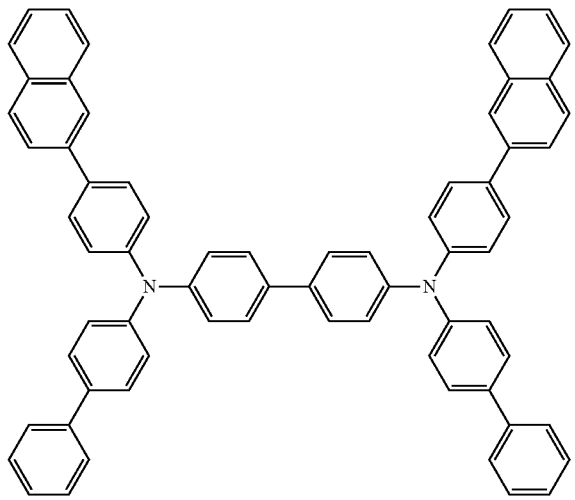
(3-17)
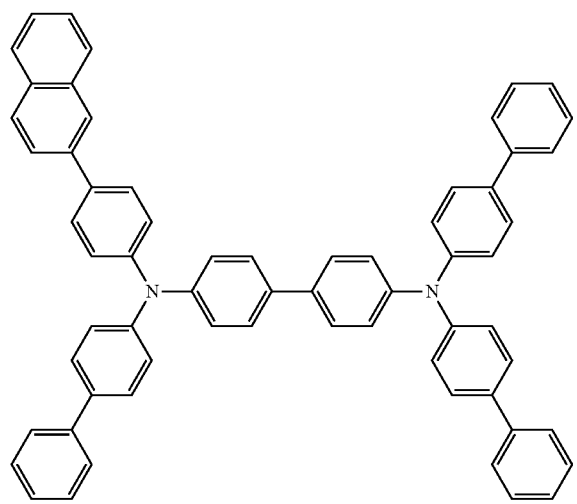
(3-18)
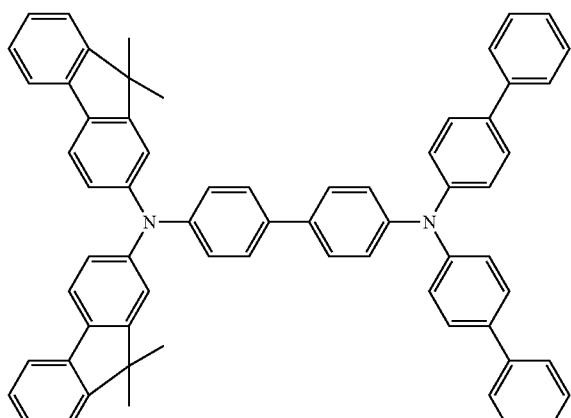
(3-19)
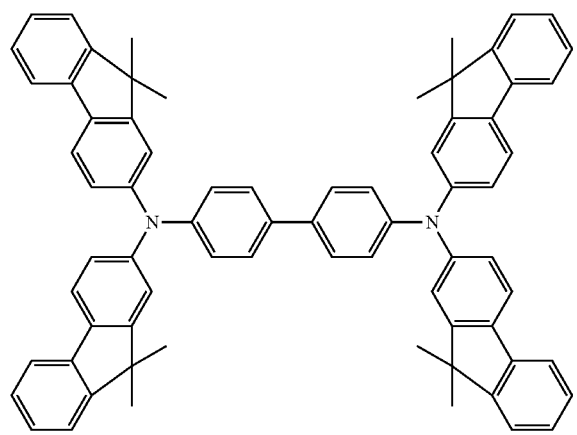
(3-20)
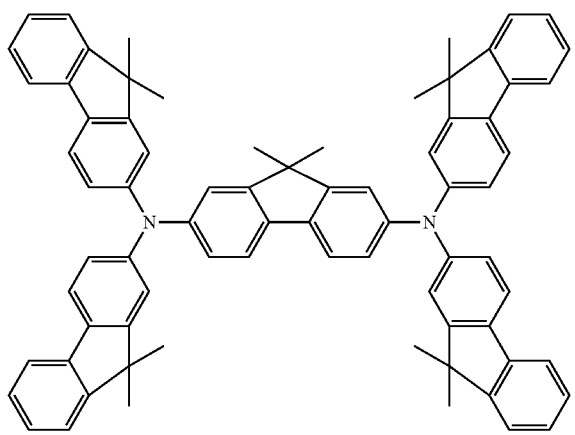

(3-21)
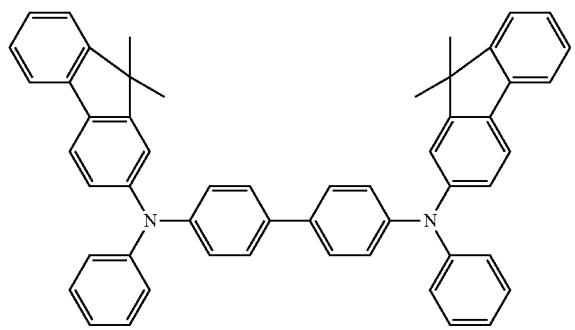
(3-22)
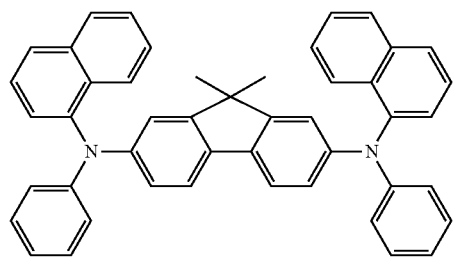
Chemical Formula 14
(3-23)
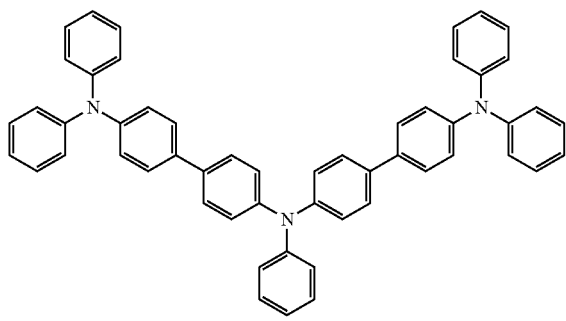
(3-24)
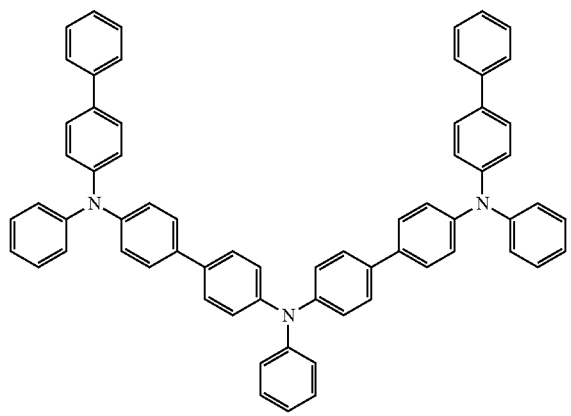
(3-25)
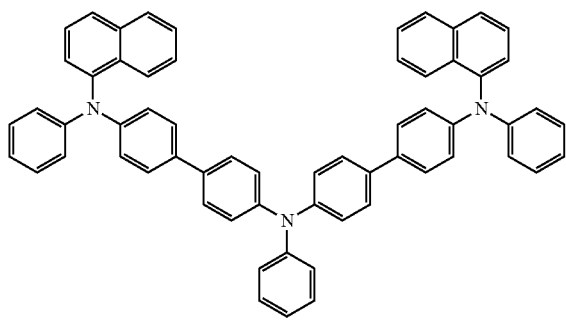
(3-26)
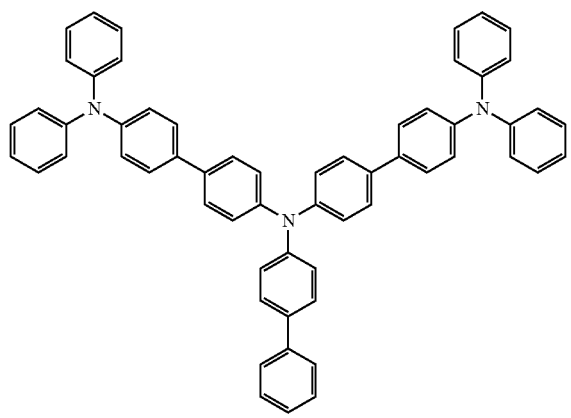

(3-27)
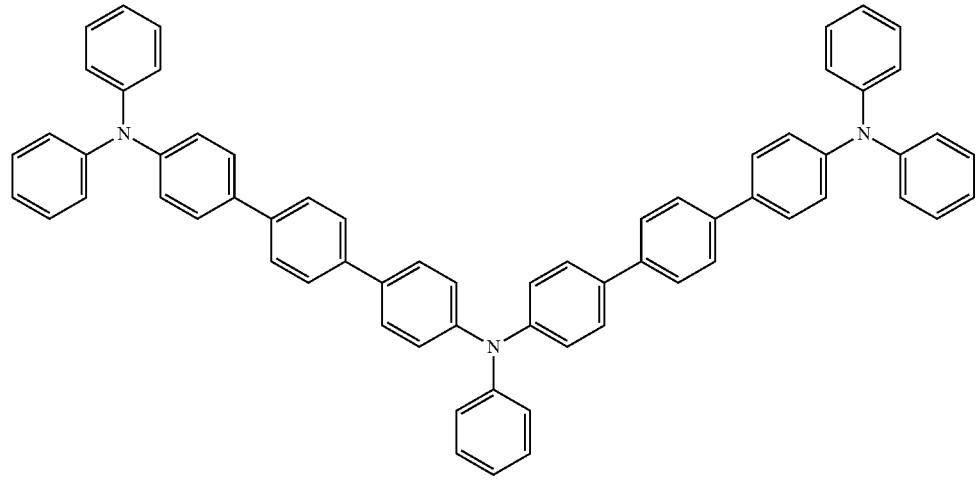
(3-28)
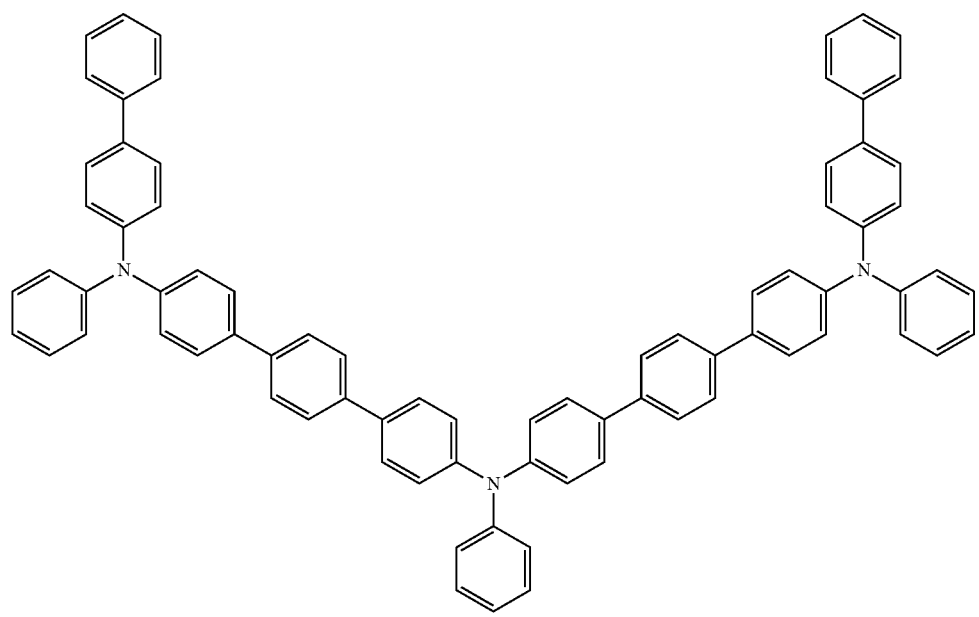

(3-29)
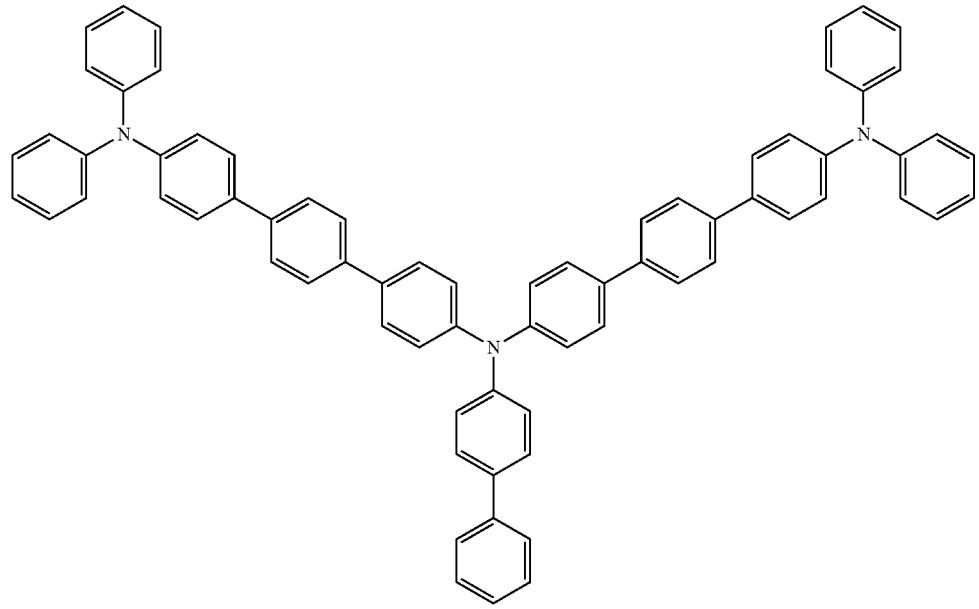
(3-30)
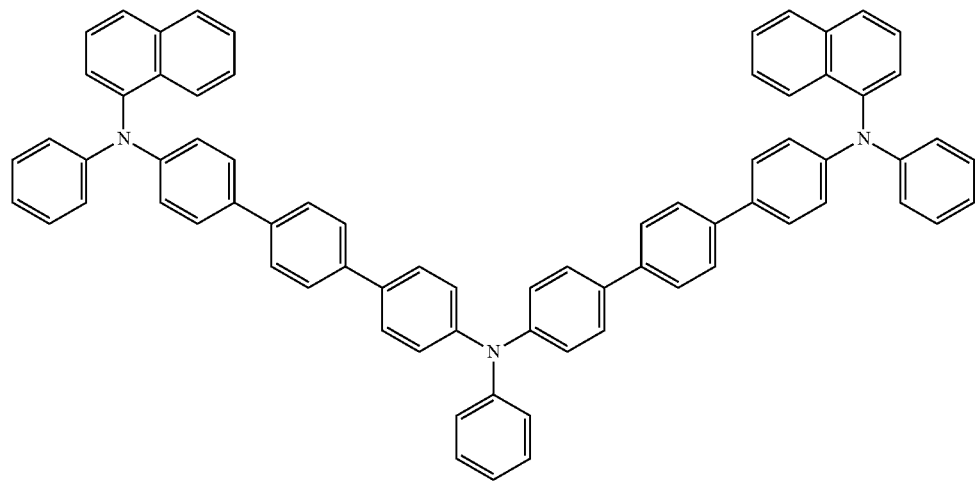
(3-31)
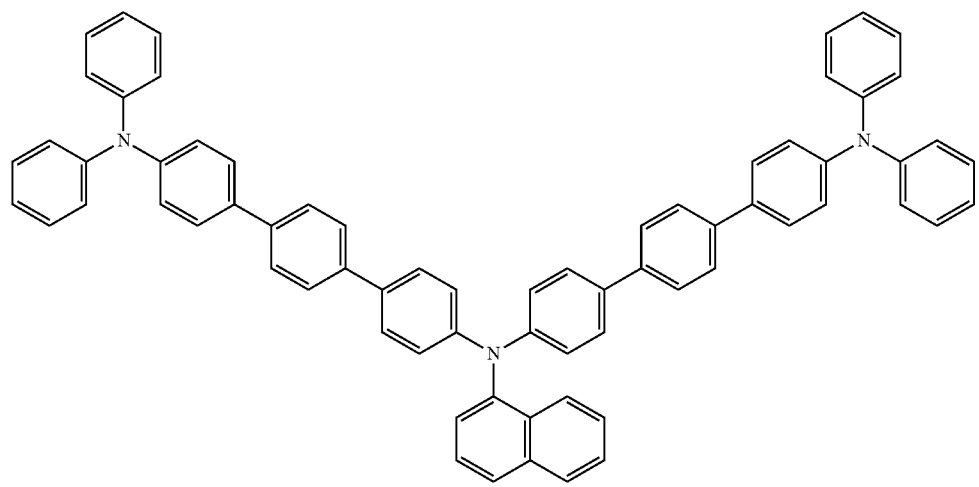

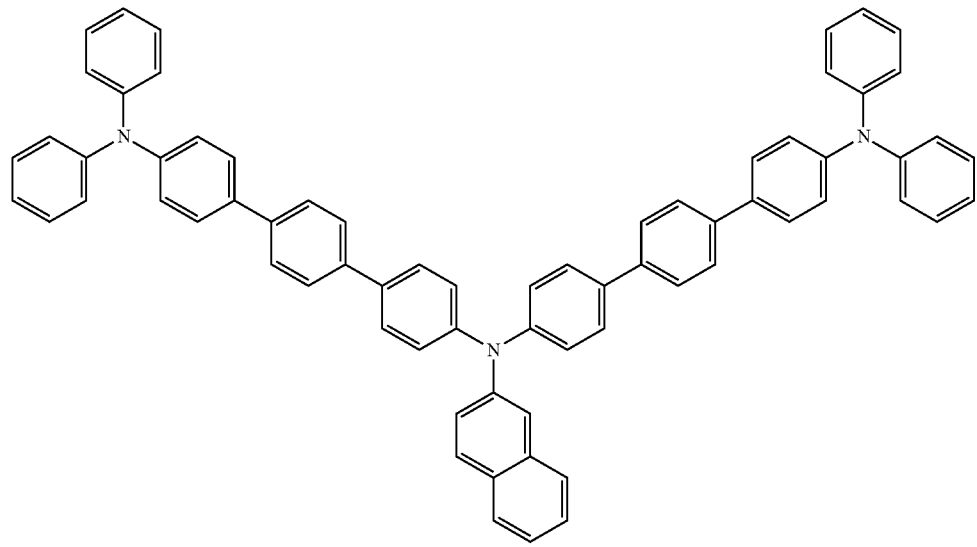
(3-32)
Chemical Formula 15
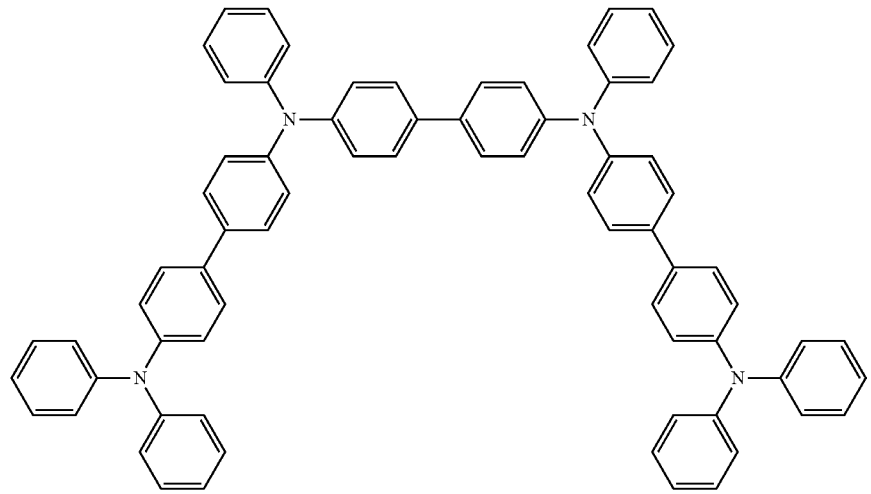
(3-33)
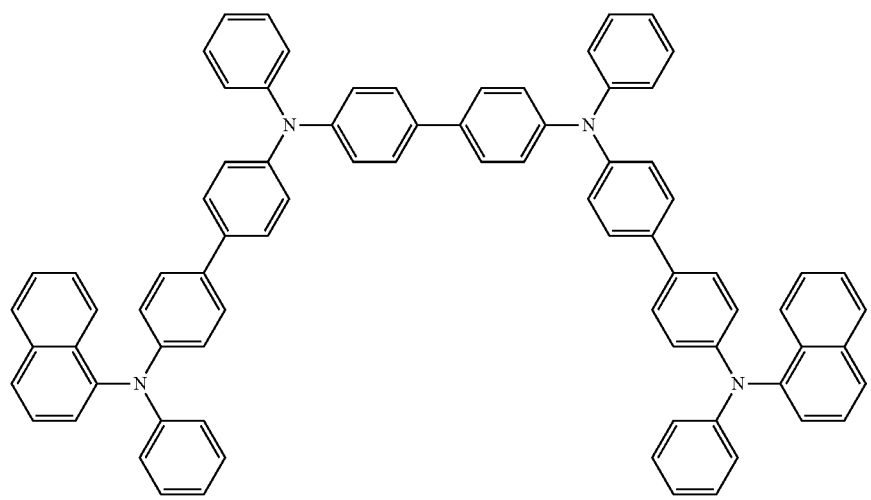
(3-34)

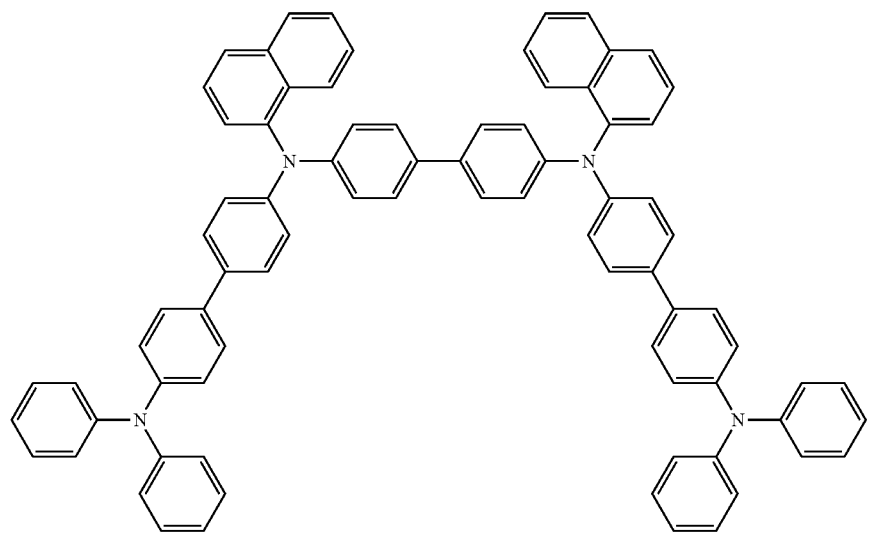
(3-35)
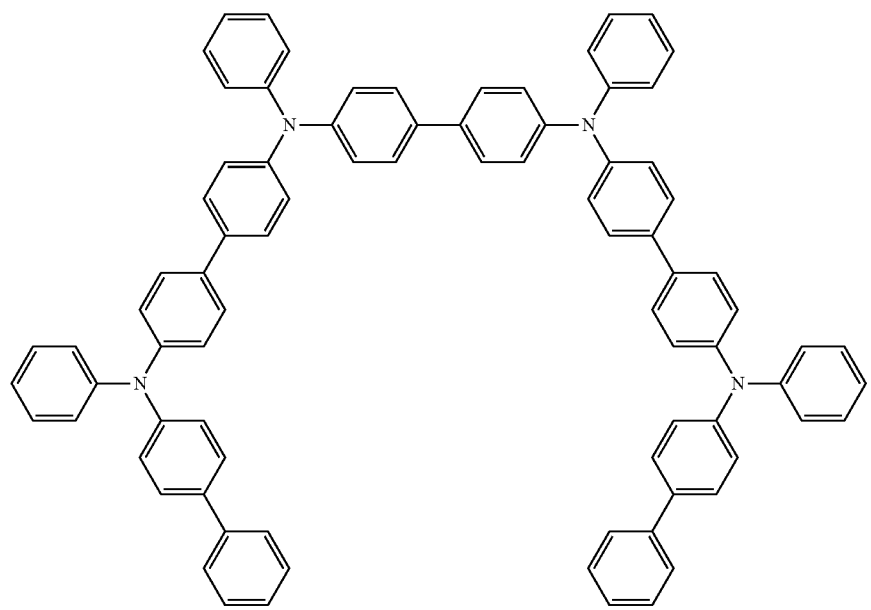
(3-36)
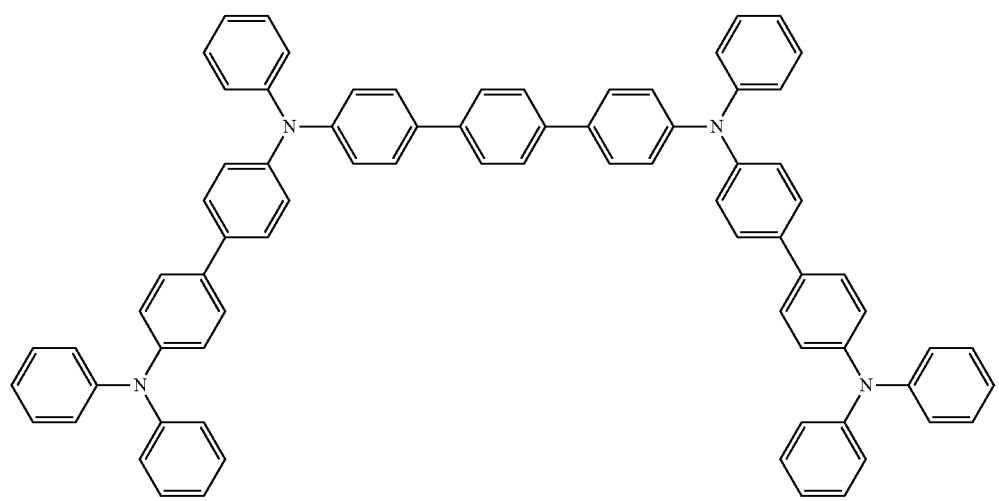
(3-37)

(3-38)
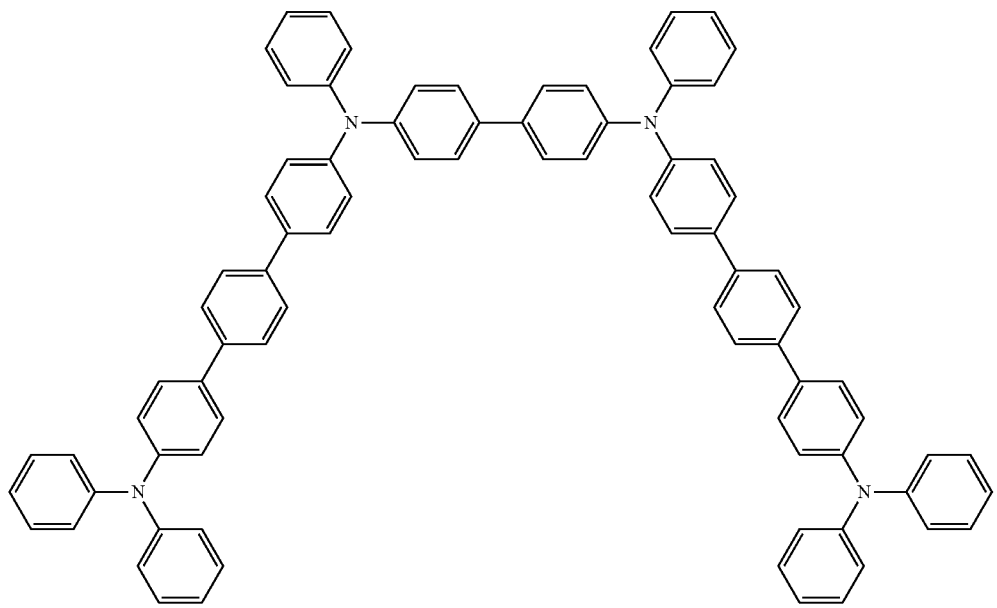
(3-39) (3-40)
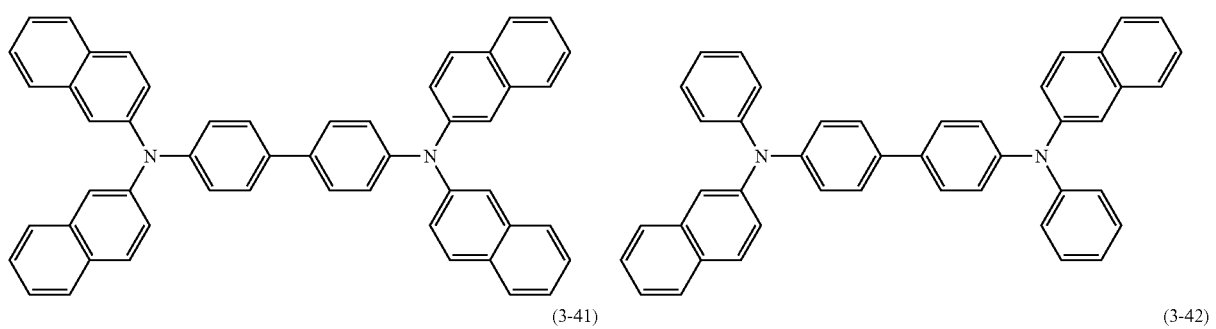
(3-41) (3-42)
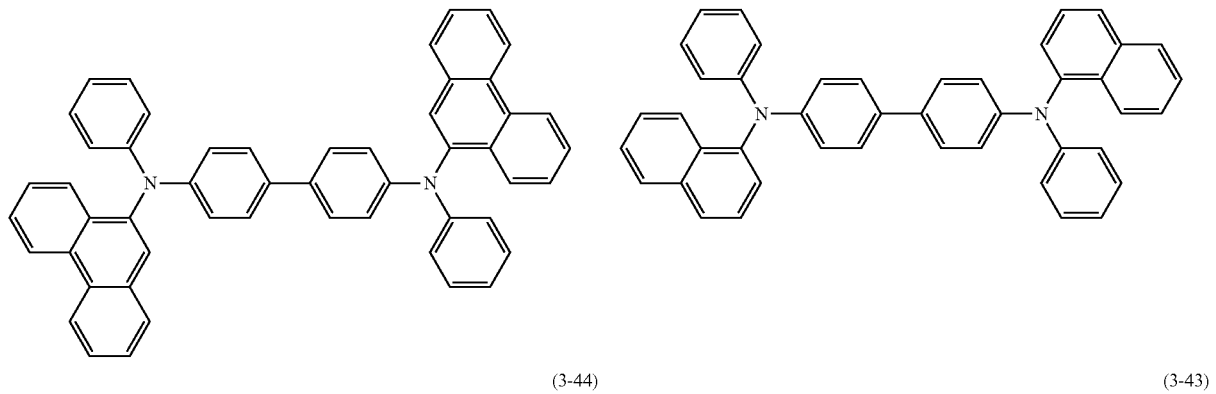
(3-44) (3-43)
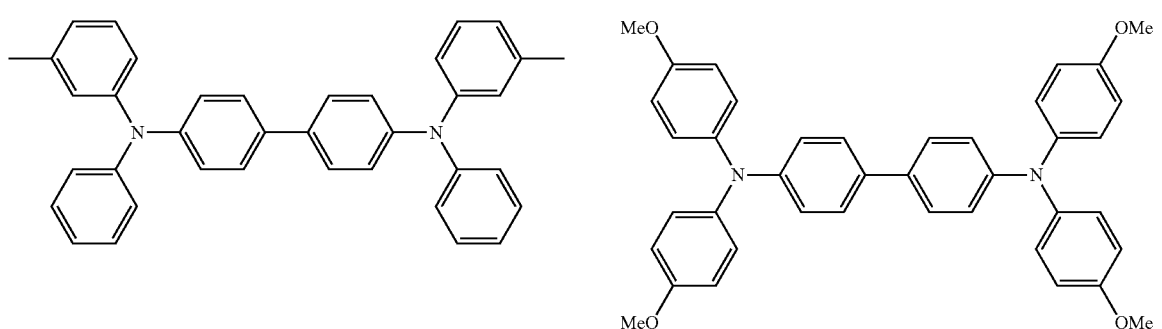

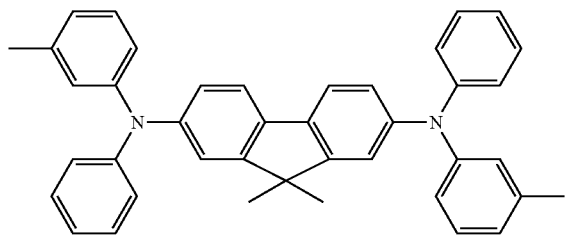

(3-45)

The hole transport layers 16BB of the blue organic EL elements 10B are provided to enhance hole transport efficiency to the blue light-emitting layer 16CB, and are arranged on the hole injection layers 16AB, respectively. For example, the thickness of each hole transport layer 16BB, depending on a whole element configuration, is preferably within a range of 10 nm to 200 nm both inclusive, and more preferably 15 nm to 150 nm both inclusive.

The hole transport layers 16BB include at least a low-molecular material. Therefore, in the organic EL display, improvements in blue light emission efficiency and lifetime are achievable. Moreover, as in the case of the low-molecular material added to the red light-emitting layers 16CR and the green light-emitting layers 16CG, the low-molecular material used herein is a low-molecular material with a single molecular weight except for a compound such as a polymer or a condensation product of a low-molecular compound, and the low-molecular material is present in a single molecular form.

As the low-molecular material used in the hole transport layers 16BB, for example, benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene or a derivative thereof, or a heterocyclic conjugated monomer, oligomer or polymer such as a polysilane-based compound, vinylcarbazole-based compound, an thiophene-based compound or an aniline-based compound is allowed to be used.

More specifically, α-naphthyl phenyl phenylenediamine, porphyrin, metal tetraphenyl porphyrin, metal naphthalocyanine, hexacyanoazatriphenylene, 7,7,8,8-tetracyanoquinodimethane (TCNQ), 7,7,8,8-tetracyano-2,3,5,6-tetrafluoroquinodimethane (F4-TCNQ), tetracyano-4,4,4-tris(3-methylphenylphenylamino)triphenylamine, N,N,N',N'-tetrakis(p-tolyl)$_p$-phenylenediamine, N,N,N',N'-tetraphenyl-4,4'-diaminobiphenyl, N-phenylcarbazole, 4-di-p-tolylaminostilbene, poly(paraphenylene vinylene), poly (thiophene vinylene), or poly(2,2'-thienylpyrrole) is used, but the low-molecular material is not limited thereto.

Moreover, the hole transport layers 16BB are preferably formed with use of any of the low-molecular materials represented by the above-described formulas (1) to (3), and specific examples include compounds represented by the above-described formulas (1-1) to (1-48), (2-1) to (2-69) and (3-1) to (3-45).

The blue light-emitting layer 16CB emits light by the recombination of electrons and holes in response to the application of an electric field, and the blue-light emitting layer 16CB is arranged as a common layer on whole surfaces of the red light-emitting layers 16CR, the green light-emitting layers 16CG and the hole transport layers 16BB for the blue organic EL elements 10B. The blue light-emitting layer 16CB includes an anthracene compound as a host material doped with a blue or green fluorescent pigment as a guest material to emit blue or green light.

As the host material forming the blue light-emitting layer 16CB, a compound represented by a formula (4) is preferably used.

Chemical Formula 16

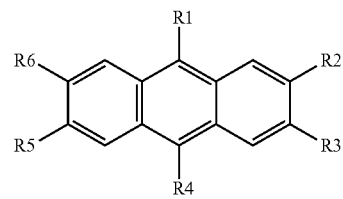

(4)

where R1 to R6 each are a hydrogen atom, a halogen atom, a hydroxyl group, a cyano group, a nitro group, or a group including a carbonyl group with 20 or less carbon atoms, a group including a carbonyl ester group, an alkyl group, an alkenyl group, an alkoxyl group, a group including a silyl group with 30 or less carbon atoms, a group including an aryl group, a group including a heterocyclic group, a group including an amino group, or a derivative thereof.

Examples of the group including an aryl group indicated by R1 to R6 in the compound represented by the formula (4) include a phenyl group, a 1-naphthyl group, a 2-naphthyl group, a fluorenyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 1-chrysenyl group, a 6-chrysenyl group, a 2-fluoranthenyl group, a 3-fluoranthenyl group, a 2-biphenylyl group, a 3-biphenylyl group, a 4-biphenylyl group, a o-tolyl group, a m-tolyl group, a p-tolyl group, and a p-t-butylphenyl group.

Moreover, the group including a heterocyclic group indicated by R1 to R6 is a five- or six-membered ring aromatic ring group containing an oxygen atom (O), a nitrogen atom (N) and a sulfur atom (S) as hetero atoms, or a condensed polycyclic aromatic ring group with 2 to 20 carbon atoms. Examples of such a heterocyclic group include a thienyl group, a furyl group, a pyrrolyl group, a pyridyl group, a quinolyl group, a quinoxalyl group, an imidazopyridyl group and a benzothiazole group. Representative examples include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, a 8-quinolyl group, a 1-isoquinolyl group, a 3-isoquinolyl group, a 4-isoquinolyl group, a 5-isoquinolyl group, a 6-isoquinolyl group, a 7-isoquinolyl group, a 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, a 8-phenanthridinyl group, a 9-phenanthridinyl group, a 10-phenanthridinyl group, a 1-acridinyl group, a 2-acridinyl group, a 3-acridinyl group, a 4-acridinyl group and a 9-acridinyl group.

The group including an amino group indicated by R1 to R6 may be any one of an alkylamino group, an arylamino group, an aralkylamino group and the like. They preferably include an aliphatic hydrocarbon group with 1 to 6 carbon atoms and/or an aromatic ring group with 1 to 4 carbon atoms. Such groups include a dimethylamino group, a diethylamino group, a dibutylamino group, a diphenylamino group, a ditolylamino group, a bisbiphenylylamino group and a dinaphthylamino group. Note that the above-described substituent group may form a condensed ring configured of two or more substituent groups, and further, the above-described substituent group may be a derivative thereof.

Specific examples of the compound represented by the formula (4) include compounds represented by the following formulas (4-1) to (4-51).

Chemical Formual 17

(4-1)
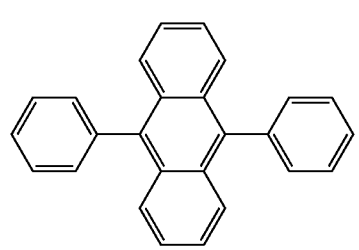

(4-2)
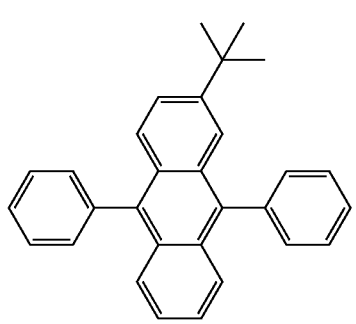

(4-3)
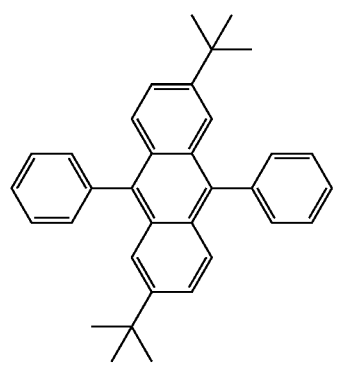

(4-4)
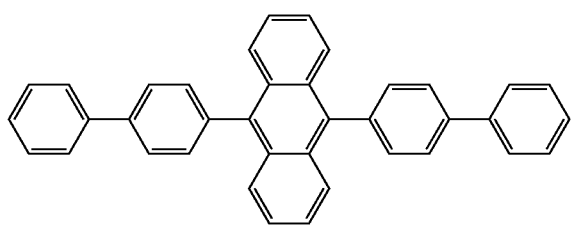

(4-5)
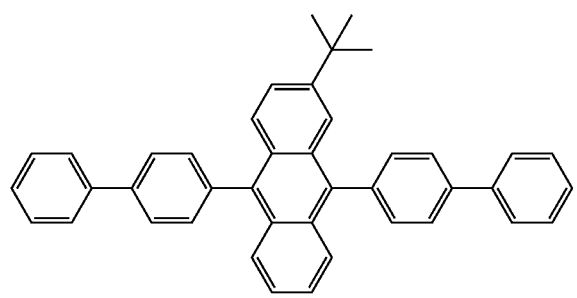

(4-6)
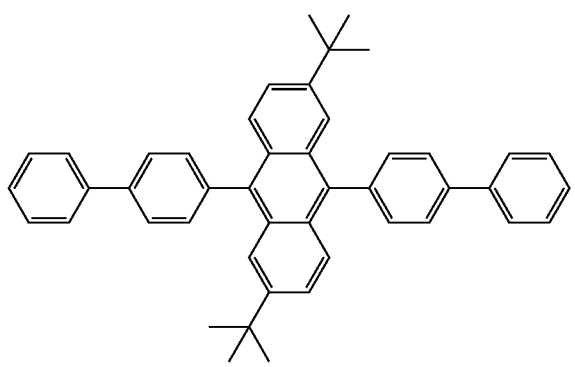

-continued
(4-7)
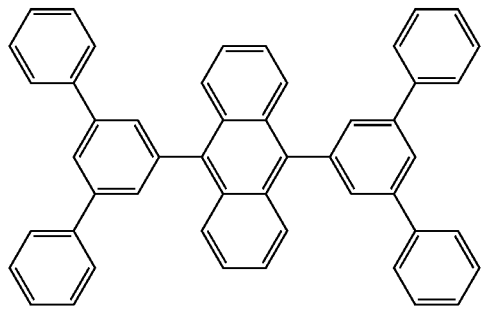
(4-8)
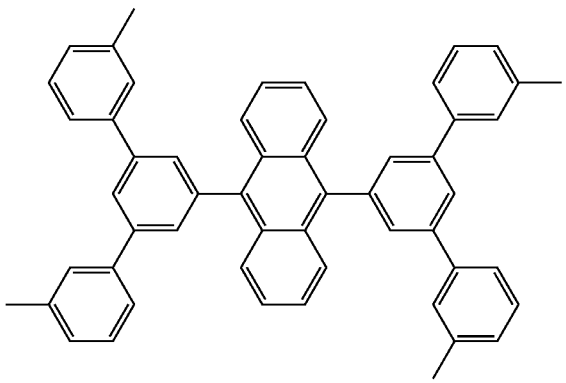
(4-9)
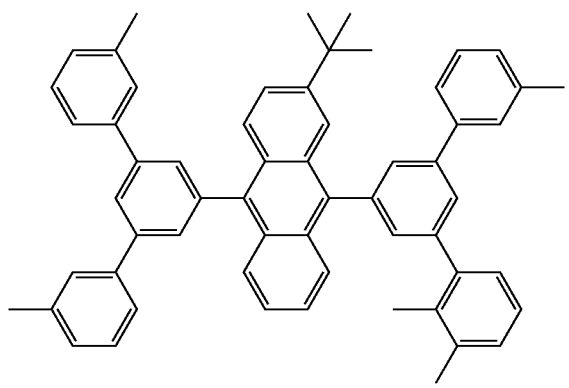
(4-10)
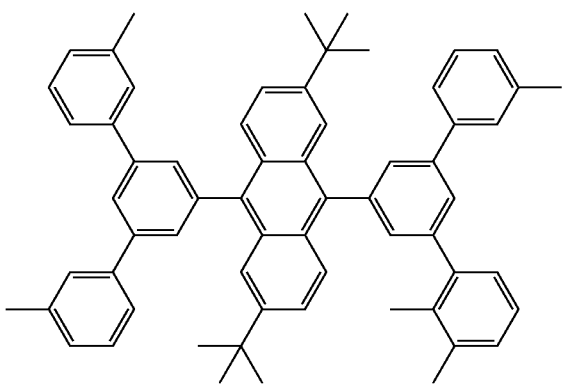
(4-11)
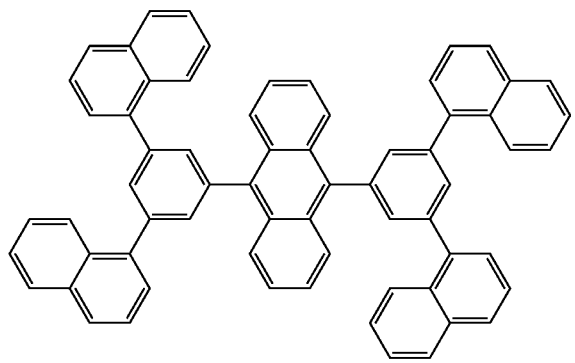
(4-12)
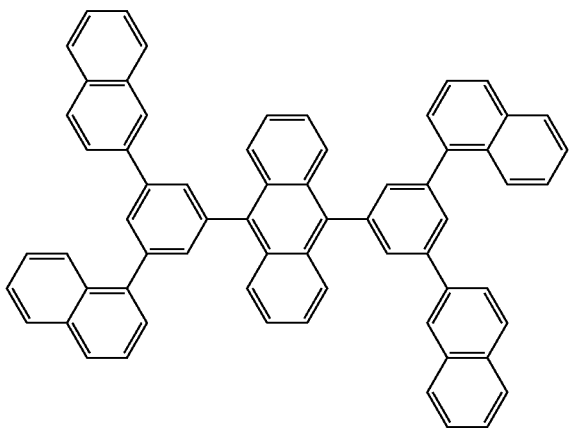
(4-13)
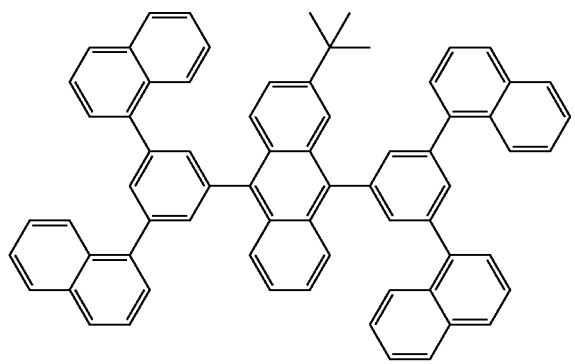
(4-14)
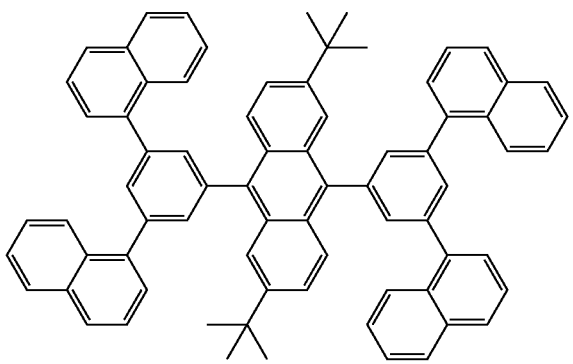

-continued
(4-15)
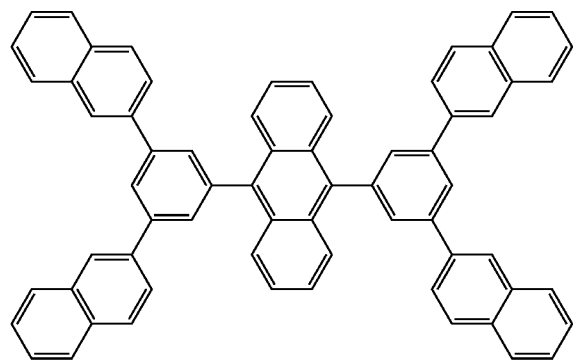
(4-16)
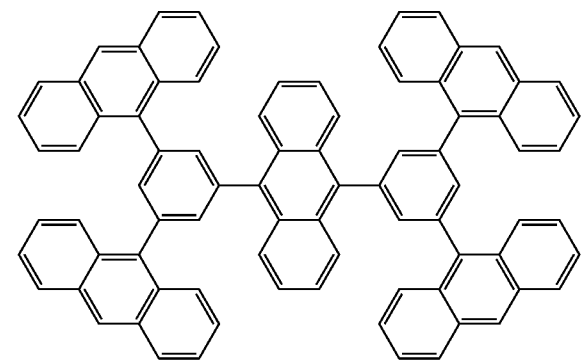
(4-17)
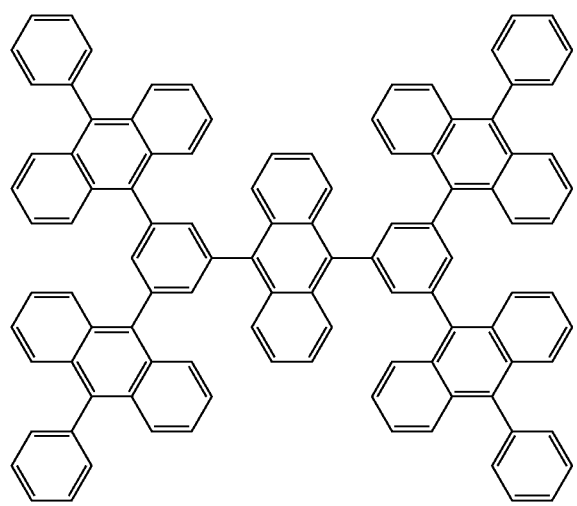
(4-18)
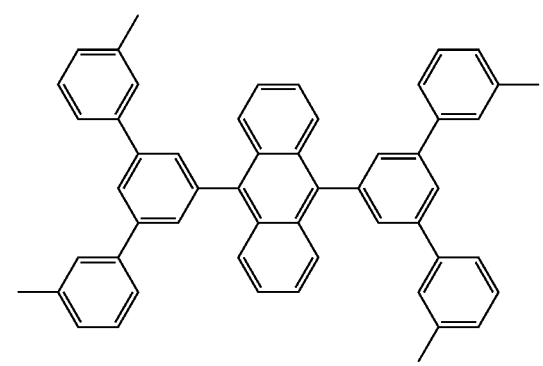
Chemical Formula 18
(4-19)
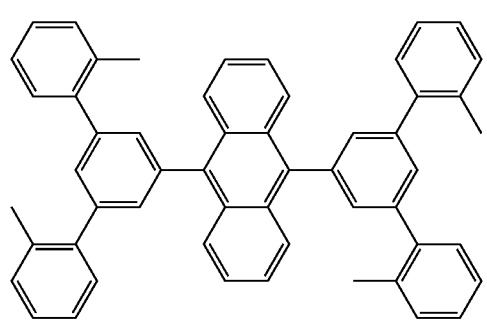
(4-20)
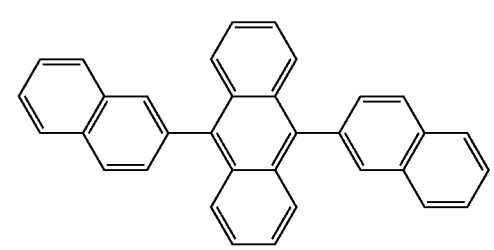
(4-21)
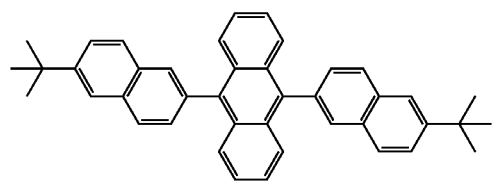
(4-22)
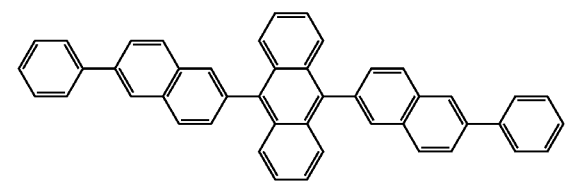

(4-23)
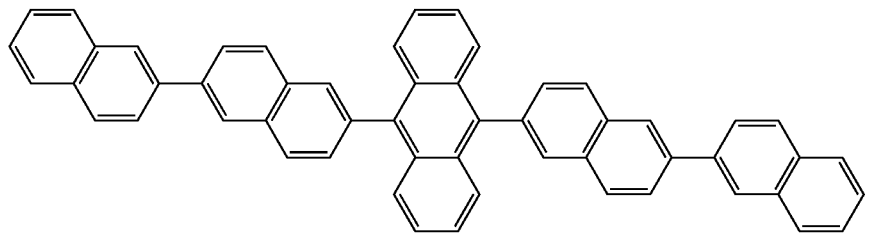
(4-24)
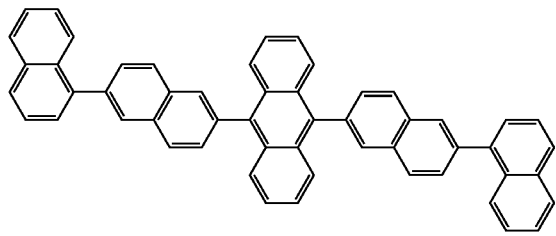
(4-25)
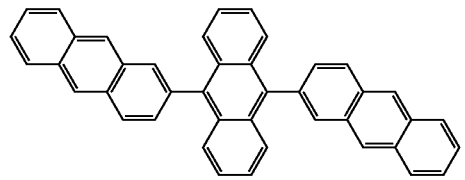
(4-26)
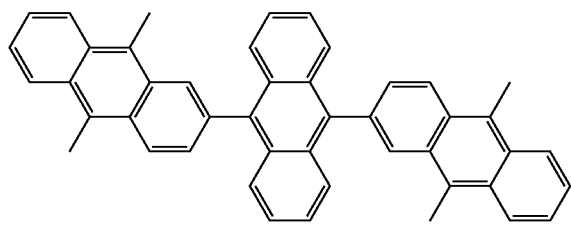
(4-27)
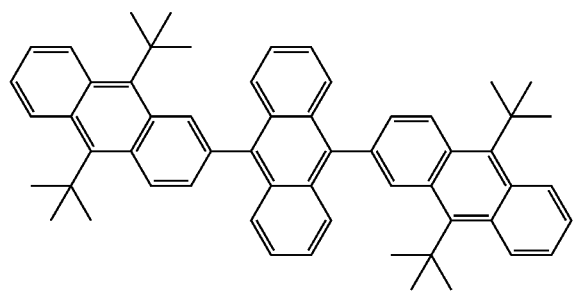
(4-28)
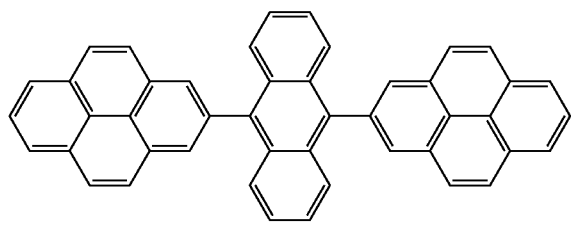
(4-29)
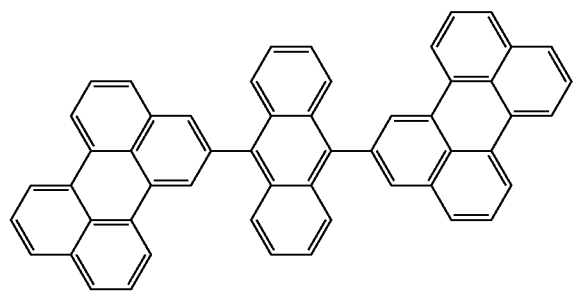
(4-30)
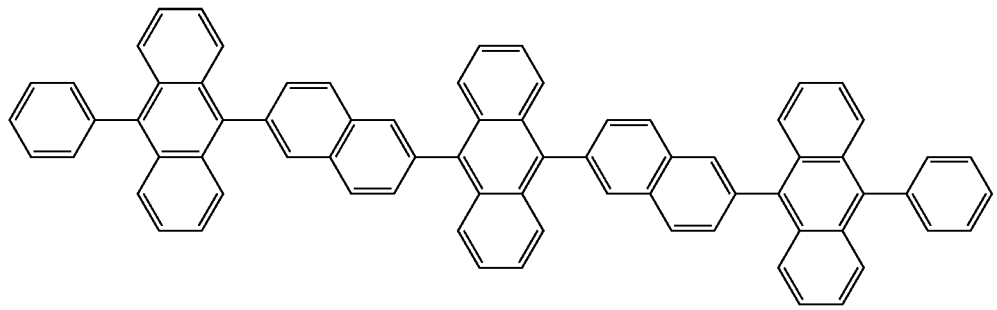

-continued (4-31)
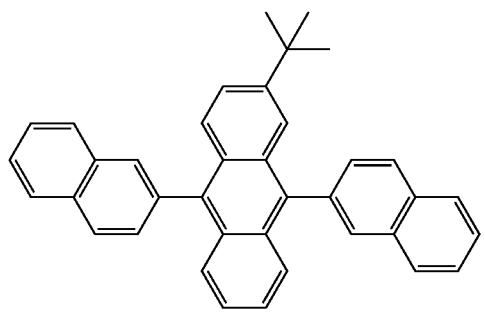

(4-32)
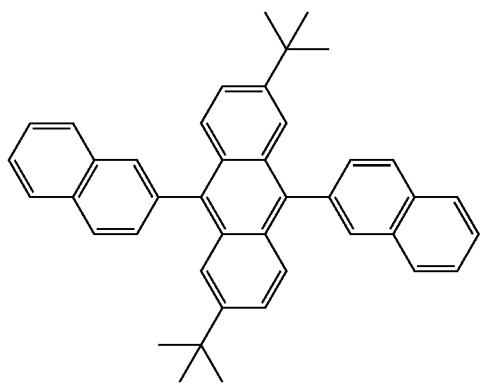

(4-33)
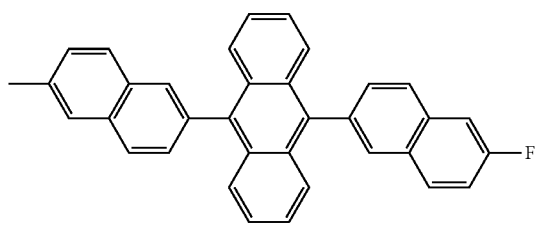

(4-34)
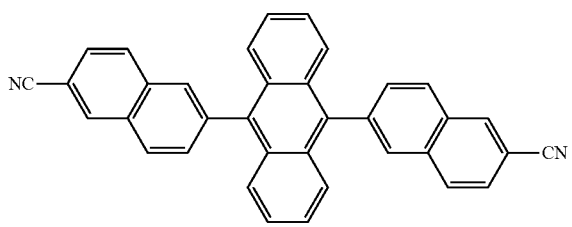

(4-35)
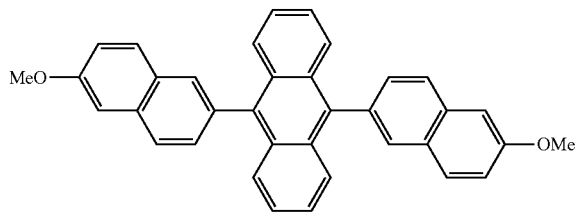

(4-36)
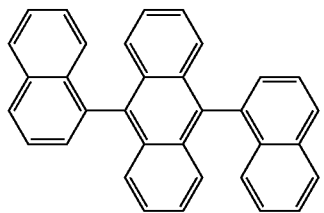

Chemical Formula 19

On the other hand, as a luminescent guest material forming the blue light-emitting layer 16CB, for example, an organic light-emitting material such as a low-molecular fluorescent material, a phosphorescent dye or a metal complex is used.

A blue luminescent guest material herein indicates a compound having a peak in a light emission wavelength range of approximately 400 nm to 490 nm. As such a compound, an organic material such as a naphthalene derivative, an anthracene derivative, a naphthacene derivative, a styrylamine derivative or a bis(azinyl)methene boron complex is used. In particular, as the compound, it is preferable to select one from the group consisting of an aminonaphthalene derivative, an aminoanthracene derivative, an aminochrysene derivative, an aminopyrene derivative, a styrylamine derivative and a bis(azinyl)methene boron complex.

The electron transport layer 16D is provided to enhance electron transport efficiency to the red light-emitting layers 16CR, the green light-emitting layers 16CG and the blue light-emitting layer 16CB, and is arranged on a whole surface of the blue light-emitting layer 16CB as a common layer. Examples of the material of the electron transport layer 16D include quinoline, perylene, phenanthroline, bisstyryl, pyrazine, triazole, oxazole, fullerene, oxadiazole, fluorenone, a derivative thereof and a metal complex thereof. More specifically, tris(8-hydroxyquinoline)aluminum (Alq3 for short), anthracene, naphthalene, phenanthrene, pyrene, anthracene, perylene, butadiene, coumarin, C60, acridine, stilbene, 1,10-phenanthroline, or a derivative thereof or a metal complex thereof is used.

The electron injection layer 16E is provided to enhance electron injection efficiency, and is arranged on a whole surface of the electron transport layer 16D. As the material of the electron injection layer 16E, lithium oxide ($Li_2O$) which is an oxide of lithium (Li), cesium carbonate ($Cs_2CO_3$) which is a complex oxide of cesium (Cs), or a mixture of the oxide and the complex oxide may be used. Moreover, the material of the electron injection layer 16E is not limited thereto, and, for example, an alkali-earth metal such as calcium (Ca) or barium (Ba), an alkali metal such as lithium or cesium, and further a metal with a small work function such as indium (In) or magnesium (Mg), or an oxide, a complex oxide or a fluoride of any of these metals may be used singly, or a mixture or an alloy thereof for improving stability may be used.

The upper electrode 17 has, for example, a thickness of 2 nm to 15 nm both inclusive, and is configured of a metal conductive film. More specifically, an alloy of Al, Mg, Ca or Na is used. In particular, an alloy of magnesium and silver (an Mg—Ag alloy) is preferable, because the Mg—Ag alloy has both of electrical conductivity and small absorption in a thin film. The ratio between magnesium and silver in the Mg—Ag alloy is not specifically limited, but the ratio is preferably within a range of Mg:Ag=20:1 to 1:1 both inclusive in film thickness ratio. Moreover, the material of the upper electrode 17 may be an alloy of Al and Li (an Al—Li alloy).

Moreover, the upper electrode 17 may be configured of a mixture layer including an organic light-emitting material such as an aluminum quinoline complex, a styrylamine derivative or a phthalocyanine derivative. In this case, the upper electrode 17 may further include a layer including light transmittance such as MgAg. Note that in the case of an active matrix drive system, the upper electrode 17 is formed on the whole substrate 11 so as to be insulated from the lower electrodes 14 by the organic layer 16 and the barrier rib 15, and is used as a common electrode for the red organic EL elements 10R, the green organic EL elements 10G and the blue organic EL elements 10B.

The protective layer 20 has, for example, a thickness of 2 to 3 μm both inclusive, and may be made of an insulating material or a conductive material. As the insulating material, an organic amorphous insulating material, for example, amorphous silicon (α-Si), amorphous silicon carbide (α-SiC), amorphous silicon nitride (α-$Si_{1-x}N_x$), amorphous carbon (α-C) or the like is preferable. Such an inorganic amorphous insulating material does not form grains, so the inorganic amorphous insulating material forms a good protective film with low water permeability.

The sealing substrate 40 is arranged on a side close to the upper electrode 17 of the red organic EL elements 10R, the green organic EL elements 10G and the blue organic EL elements 10B, and is provided to seal the red organic EL elements 10R, the green organic EL elements 10G and the blue organic EL elements 10B with an adhesive layer (not illustrated). The sealing substrate 40 is made of a transparent material to light emitted from the red organic EL elements 10R, the green organic EL elements 10G and the blue organic EL elements 10B such as glass. In the sealing substrate 40, for example, a color filter and a light-shielding film as a black matrix (both not illustrated) are arranged to extract light emitted from the red organic EL elements 10R, the green organic EL elements 10G and the blue organic EL elements 10B and absorb outside light reflected from the red organic EL elements 10R, the green organic EL elements 10G and the blue organic EL elements 10B and wiring therebetween, thereby improving contrast.

The color filter includes red filters, green filters and blue filters (all not illustrated) which are arranged in order so as to correspond to the red organic EL elements 10R, the green organic EL elements 10G and the blue organic EL elements 10B, respectively. The red filters, the green filters and the blue filters have, for example, a rectangular shape, and are formed without space. The red filters, the green filters and the blue filters are made of a resin mixed with a pigment of a corresponding color, and are adjusted by selecting the pigment so that light transmittance in a target red, green or blue wavelength range is high and light transmittance in other wavelength ranges is low.

Moreover, the wavelength range with high transmittance in the color filter and a peak wavelength λ of a spectrum of light to be extracted from a resonator configuration are equal to each other. Therefore, only light of a wavelength equal to the peak wavelength λ of the spectrum of light to be extracted in outside light entering from the sealing substrate 40 passes through the color filter, and outside light of other wavelengths is prevented from entering into the red, green and blue organic EL elements 10R, 10G and 10B.

The light-shielding film is configured of, for example, a black resin film mixed with a black colorant with an optical density of 1 or over, or a thin-film filter utilizing interference of a thin film. In particular, the light-shielding film is preferably configured of the black resin film, because the light-shielding film is easily formed at low cost. The thin-film filter is formed, for example, by laminating one or more thin films made of metal, a metal nitride or a metal oxide, and utilizes interference of the thin film to attenuate light. More specifically, as the thin-film filter, a thin-film filter formed by alternately laminating chromium and chromium (III) oxide ($Cr_2O_3$) is used.

The organic EL display is allowed to be manufactured by, for example, the following steps.

Figure 4:
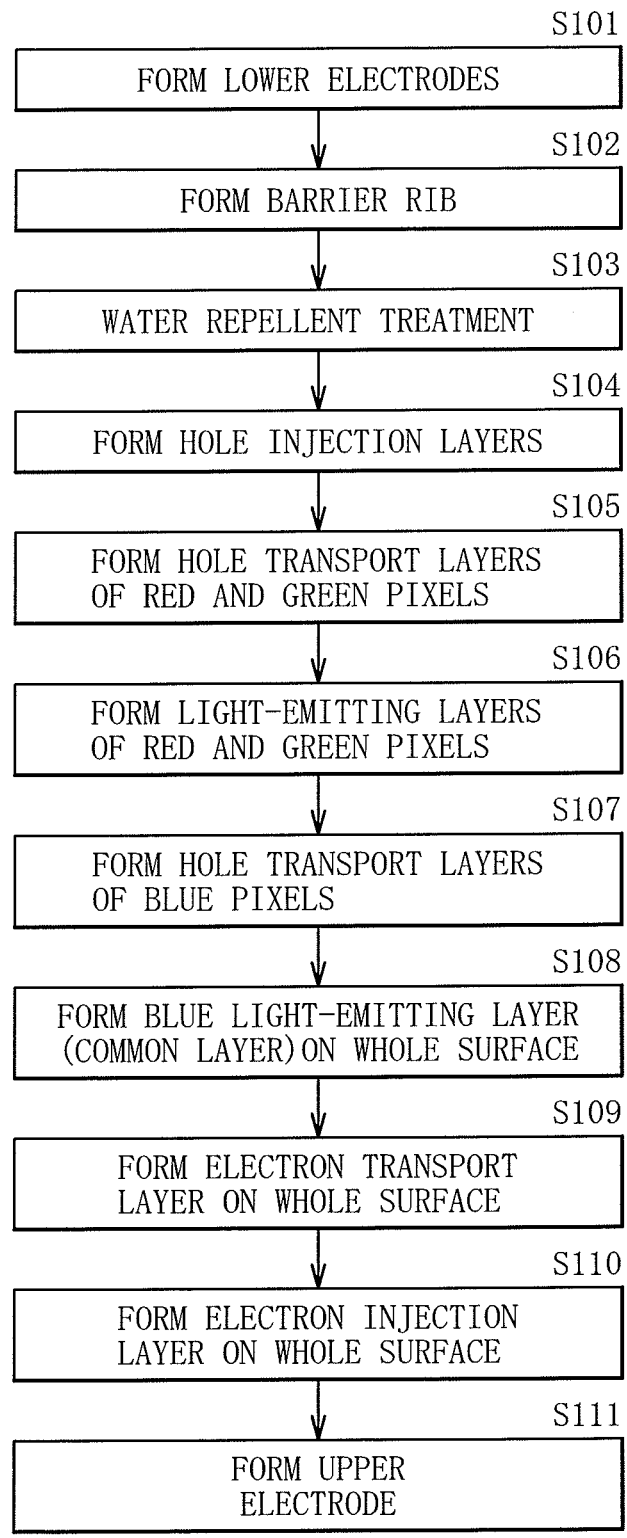
FIG. 4 is a diagram illustrating a flow of a method of manufacturing the organic EL display illustrated in FIG. 1.

FIG. 4 illustrates a flow of a method of manufacturing the organic EL display, and FIGS. 5A to 5C to FIGS. 7A to 7C illustrate the manufacturing method illustrated in FIG. 4 in order of steps. First, the pixel drive circuit 140 including the driving transistor Tr1 is formed on the substrate 11 made of the above-described material, and, for example, an planarization insulating film (not illustrated) made of a photosensitive resin is arranged.

Step of Forming Lower Electrodes 14

Figure 5A:
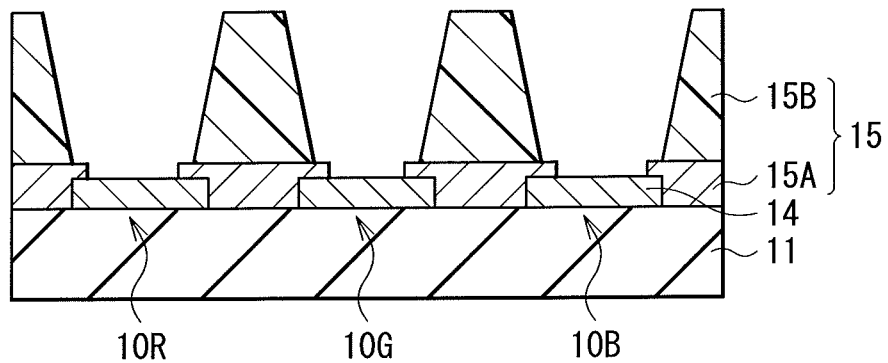
FIGS. 5A to 5C are sectional views illustrating the manufacturing method illustrated in FIG. 4 in order of steps.

Next, for example, a transparent conductive film made of ITO is formed on a whole surface of the substrate 11, and the transparent conductive film is patterned to form the lower electrodes 14 for the red organic EL elements 10R, the green organic EL elements 10G and the blue organic EL elements 10B, respectively, as illustrated in FIG. 5A (step S101). At this time, the lower electrodes 14 each are electrically connected to a drain electrode of the driving transistor Tr1 through a contact hole (not illustrated) of the planarization insulating film (not illustrated).

Step of Forming Barrier Rib 15

Next, also as illustrated in FIG. 5A, a film made of an inorganic insulating material such as $SiO_2$ is formed on the lower electrodes 14 and the planarization insulating film (not illustrated) by, for example, a CVD (Chemical Vapor Deposition) method, and is patterned with use of a photolithography technique and an etching technique to form the lower barrier rib 15A.

After that, also as illustrated in FIG. 5A, the upper barrier rib 15B made of the above-described photosensitive resin is formed in a predetermined position of the lower barrier rib 15A, more specifically a position around a light emission region of each pixel. Therefore, the barrier rib 15 including the upper barrier rib 15A and the lower barrier rib 15B is formed (step S102).

After the barrier rib 15 is formed, a surface where the lower electrodes 14 and the barrier rib 15 are formed of the substrate 11 is subjected to oxygen plasma treatment to remove a contaminant such as an organic matter adhered to the surface, thereby improving wettability. More specifically, the substrate 11 is heated at a predetermined temperature, for example, approximately 70 to 80° C., and then is subjected to plasma treatment ($O_2$ plasma treatment) using oxygen as a reactive gas under atmospheric pressure.

Step of Performing Water Repellent Treatment After the plasma treatment is performed, water repellent treatment (liquid repellent treatment) is performed (step S103) so as to reduce wettabilitiy of specifically a top surface and a side surface of the upper barrier rib 15B. More specifically, plasma treatment ($CF_4$ plasma treatment) using tetrafluoromethane as a reactive gas is performed under atmospheric pressure, and after that, the substrate 11 heated for the plasma treatment is cooled to a room temperature so as to make the top surface and the side surface of the upper barrier rib 15B liquid-repellent, thereby reducing wattability thereof.

In the $CF_4$ plasma treatment, a little influence is exerted on exposed surfaces of the lower electrodes 14 and the lower barrier rib 15A, but ITO which is the material of the lower electrodes 14, $SiO_2$ which is the material of the lower barrier rib 15A, and the like have poor affinity for fluorine, so the wettability of the surface with improved wettability by the oxygen plasma treatment is maintained as it is.

Step of Forming Hole Injection Layers 16AR, 16AG and 16AB

Figure 5B:
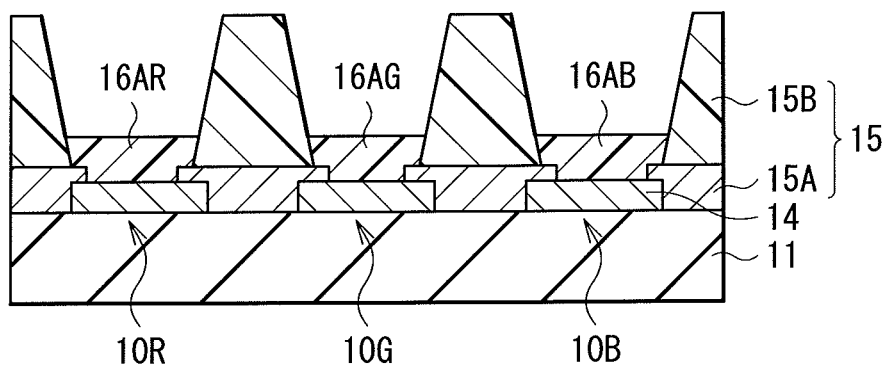

After the water repellent treatment is performed, as illustrated in FIG. 5B, the hole injection layers 16AR, 16AG and 16AB made of the above-described material are formed in regions surrounded by the upper barrier rib 15B (step S104). The hole injection layers 16AR, 16AG and 16AB are formed by a coating method such as a spin coating method or a liquid droplet discharging method. In particular, as it is necessary to selectively arrange the forming material of the hole injection layers 16AR, 16AG and 16AB in regions surrounded by the upper barrier rib 15B, an ink-jet printing method which is the liquid droplet discharging method, or a nozzle coating method is preferably used.

More specifically, a solution or a dispersion liquid such as polyaniline or polythiophene which is the forming material of the hole injection layers 16AR, 16AG and 16AB is discharged to the exposed surfaces of the lower electrodes 14 by, for example, the ink jet printing method. After that, heat treatment (drying treatment) is performed to form the hole injection layers 16AR, 16AG and 16AB.

In the heat treatment, a solvent or a dispersion medium is dried, and then heated at high temperature. In the case where a conductive high polymer such as polyaniline or polythiophene is used, the heat treatment is preferably performed in an air or oxygen atmosphere, because electrical conductivity is easily developed by oxidation of the conductive high polymer by oxygen.

The heating temperature is preferably within a range of 150° C. to 300° C. both inclusive, and more preferably within a range of 180° C. to 250° C. both inclusive. The heating time, depending on temperature and atmosphere, is preferably within a range of approximately 5 minutes to 300 minutes, and more preferably within a range of 10 minutes to 240 minutes both inclusive. The thickness of a dried film is preferably within a range of 5 nm to 100 nm both inclusive, and more preferably within a range of 8 nm to 50 nm both inclusive.

Figure 5C:
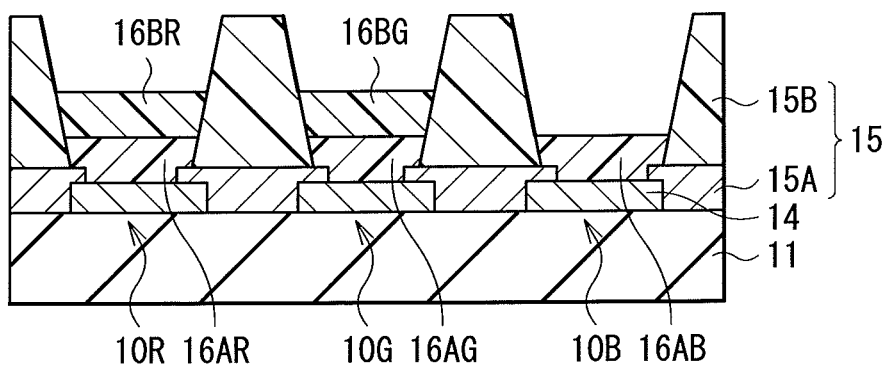

Step of Forming Hole Transport Layers 16BR and 16BG of Red Organic EL Elements 10R and Green Organic EL Elements 10G After the hole injection layers 16AR, 16AG and 16AB are formed, as illustrated in FIG. 5C, the hole transport layers 16BR and 16BG made of the above-described material are formed on the hole injection layers 16AR and 16AG of the red organic EL elements 10R and the green organic EL elements 10G, respectively (step S105). The hole transport layers 16BR and 16BG are formed by a coating method such as a spin coating method or a liquid droplet discharging method. In particular, as it is necessary to selectively arrange the forming material of the hole transport layers 16BR and 16BG in regions surrounded by the upper barrier rib 15B, the ink-jet printing method which is the liquid droplet discharging method, or the nozzle coating method is preferably used.

More specifically, a solution or a dispersion liquid of a high polymer which is the forming material of the hole transport layers 16BR and 16BG is discharged to exposed surfaces of the hole injection layers 16AR and 16AG by, for example, a ink-jet pringint method. After that, heat treatment (drying treatment) is performed to form the hole transport layers 16BR and 16BG of the red organic EL elements 10R and the green organic EL elements 10G.

In the heat treatment, a solvent or a dispersion liquid is dried, and then heated at high temperature. As an atmosphere for coating or an atmosphere for drying and heating the solvent, an atmosphere including nitrogen ($N_2$) as a main component is preferable, because when oxygen or water is included in the atmosphere, the light emission efficiency or lifetime of the formed organic EL display may be reduced. In particular, in a heating step, the influence of oxygen or water is large, so it is necessary to pay attention to oxygen or water. The oxygen concentration is preferably within a range of 0.1 ppm to 100 ppm both inclusive, and more preferably within a range of 50 ppm or less. When the oxygen concentration is larger than 100 ppm, an interface of a formed thin film may be contaminated to reduce the light emission efficiency and lifetime of the obtained organic EL display. Moreover, in the case where the oxygen concentration is smaller than 0.1 ppm, such a low concentration does not cause an issue in properties of the elements, but in a present mass-production process, the cost of an apparatus for maintaining an atmosphere with an oxygen concentration of smaller than 0.1 ppm may be high.

Moreover, the dew point of water is preferably within a range of, for example, −80° C. to −40° C. both inclusive, more preferably −50° C. or less, and more preferably −60° C. or less. When water with a dew point of higher than −40° C. is present, an interface of a formed thin film may be contaminated to reduce the light emission efficiency or lifetime of the obtained organic EL display. Moreover, in the case of water with a dew point of lower than −80° C., such a low temperature does not cause the properties of the elements, but as a present mass-production process, the cost of an apparatus for keeping an atmosphere at lower than −80° C. may be high.

The heating temperature is preferably within a range of 100° C. to 230° C. both inclusive, and more preferably within a range of 100° C. to 200° C. both inclusive. At least the heating temperature is preferably lower than a temperature for forming the hole injection layers 16AR, 16AG and 16AB. The heating time, depending on temperature or atmosphere, is preferably within a range of approximately 5 minutes to 300 minutes, and more preferably within a range of 10 minutes to 240 minutes both inclusive. The thickness of a dried film, depending on a whole element configuration, is preferably within a range of 10 nm to 200 nm both inclusive and more preferably within a range of 15 nm to 150 nm both inclusive.

Figure 6A:
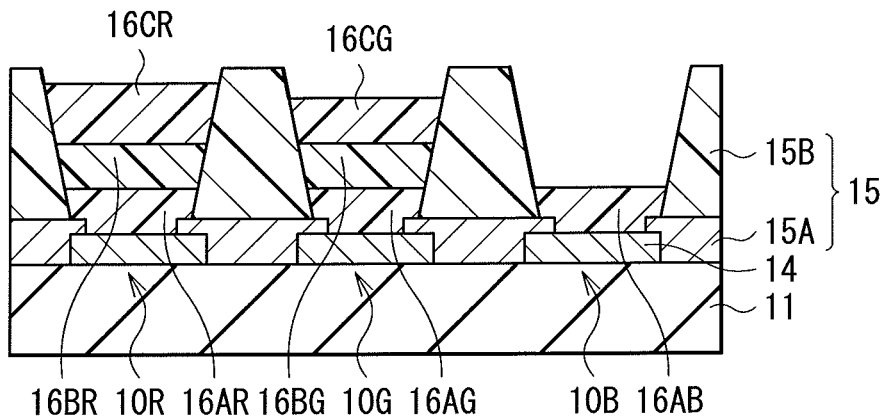
FIGS. 6A to 6C are sectional views illustrating steps following FIGS. 5A to 5C.

Step of Forming Red Light-Emitting Layers 16CR and Green Light-Emitting Layers 16CG After the hole transport layers 16BR and 16BG of the red organic EL elements 10R and the green organic EL elements 10G are formed, as illustrated in FIG. 6A, the red light-emitting layers 16CR made of a mixture material of the above-described high-molecular material and the above-described low-molecular material are formed on the hole transport layers 16BR of the red organic EL elements 10R. Moreover, the green light-emitting layers 16CG made of a mixture material of the above-described high-molecular material and the above-described low-molecular material are formed on the hole transport layers 16BG of the green organic EL elements 10G (step S106). The red light-emitting layers 16CR and the green light-emitting layers 16CG are formed by a coating method such as a spin coating method or a liquid droplet discharging method. In particular, as it is necessary to selectively discharge the forming materials of the red light-emitting layers 16CR and the green light-emitting layers 16CG in regions surrounded by the upper barrier rib 15B, the ink-jet printing method which is the liquid droplet discharging method, or the nozzle coating method is preferably used.

More specifically, a solution or a dispersion liquid of a high polymer which is the forming material of the red light-emitting layers 16CR or the green light-emitting layers 16CG is discharged on exposed surfaces of the hole transport layers 16BR or 16BG by, for example, the ink-jet printing method. After that, heat treatment by the same method under the same conditions as in the heat treatment (drying treatment) described in the step of forming the hole transport layers 16BR and 16BG of the above-described red organic EL elements 10R and the above-described green organic EL elements 10G is performed to form the red light-emitting layers 16BR and the green light-emitting layers 16BG.

Step of Forming Hole Transport Layers 16BB of Blue Organic EL Elements 10B

Figure 6B:
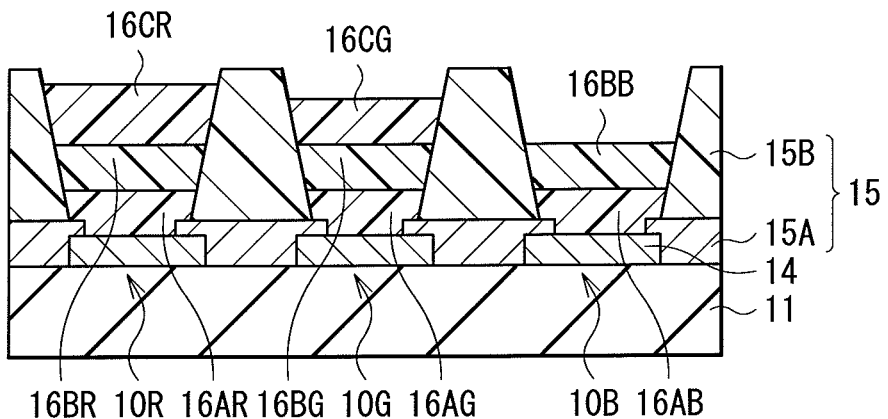

After the red light-emitting layers 16CR and the green light-emitting layers 16CG are formed, as illustrated in FIG. 6B, the hole transport layers 16BB made of the above-described low-molecular material is formed on the hole injection layers 16AB for the blue organic EL elements 10B (step S107). The hole transport layers 16BB are formed by a coating method such as a spin coating method or a liquid droplet discharging method. In particular, as it is necessary to selectively discharge the forming material of the hole transport layers 16BB in regions surrounded by the upper barrier rib 15B, the ink-jet printing method which is the liquid droplet discharging method, or the nozzle coating method is preferably used.

More specifically, a solution or a dispersion liquid of the low-molecular material which is the forming material of the hole transport layers 16BB is discharged on exposed surfaces of the hole injection layers 16AB by, for example, the ink jet printing method. After that, heat treatment by the same method under the same conditions as in the heat treatment (drying treatment) described in the step of forming the hole transport layers 16BR and 16BG of the above-described red organic EL elements 10R and the above-described green organic EL elements 10G is performed to form the hole transport layers 16BB.

Order of Steps

The step of forming the hole transport layers 16BR and 16BG of the red organic EL elements 10R and the green organic EL elements 10G, the step of forming the hole transport layers 16BB of the blue organic EL elements 10B, and the step of forming the red light-emitting layers 16CR and the green light-emitting layers 16CG may be performed in any order, but it is necessary to previously form a base where layers to be formed are developed and to undergo a heating step in each heating and drying step. Moreover, it is necessary to perform coating at a temperature in the heating step equal to or lower than a temperature in a previous step. For example, in the case where the temperature for heating the red light-emitting layers 16CR and the green light-emitting layers 16CG is 130° C. and the temperature for heating the hole transport layers 16BB of the blue organic EL elements 10B are the same, that is, 130° C., coating may be performed to form the red light-emitting layers 16CR and the green light-emitting layers 16CG, and then without drying the red light-emitting layers 16CR and the green light-emitting layers 16CG, coating may be performed to form the hole transport layers 16BB of the blue organic EL elements 10B, and after that, the step of drying and heating the red light-emitting layers 16CR, the green light-emitting layers 16CG and the hole transport layers 16BB of the blue organic EL elements 10B may be performed.

Moreover, in each of the above-described steps, the drying step and the heating step are preferably performed separately, because in the drying step, a coated wet film easily flows, thereby easily forming the film uneven. A preferable drying step is a method of uniformly drying a film in a vacuum at normal pressure, and more preferably, the film is dried with keeping wind off the film. In the heating step, a solvent is removed to some extent to reduce fluidity, and the film is hardened. Then, when the film is slowly heated, a small amount of the remaining solvent is allowed to be removed, or the light-emitting material or the material of the hole transport layer is allowed to be rearranged at a molecular level.

Step of Forming Blue Light-Emitting Layer 16CB

Figure 6C:
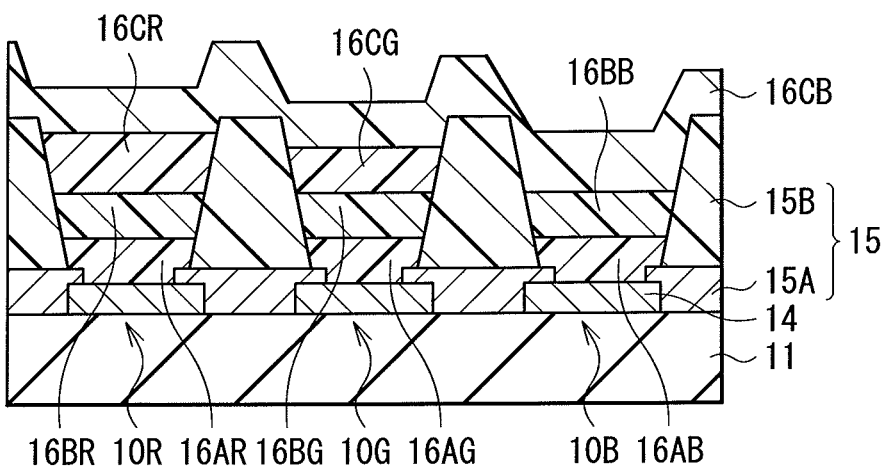

After the hole transport layers 16BB of the blue organic EL elements 10B and the red light-emitting layers 16CR and the green light-emitting layers 16CG are formed, as illustrated in FIG. 6C, the blue light-emitting layer 16CB made of the above-described low-molecular material is formed as a common layer on the whole surfaces of the red light-emitting layers 16CR, the green light-emitting layers 16CG and the hole transport layers 16BB of the blue organic EL elements 10B (step S108).

Step of Forming Electron Transport Layer 16D, Electron Injection Layer 16E and Upper Electrode 17

Figure 7A:
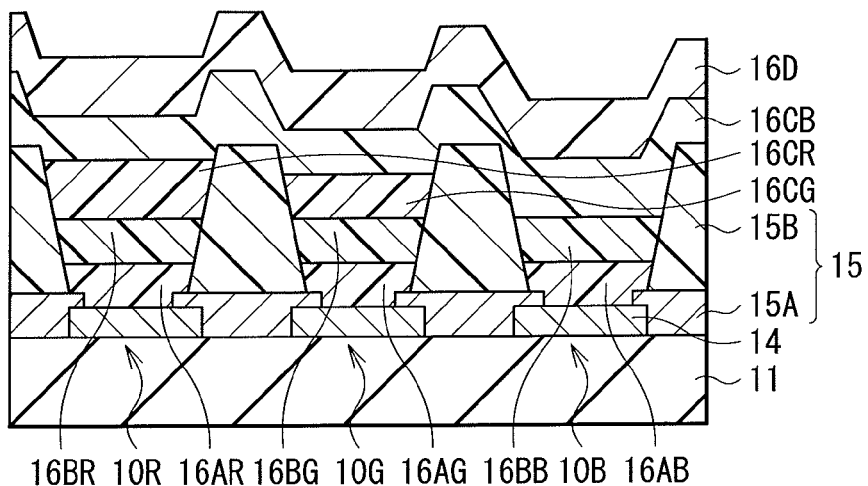
FIGS. 7A to 7C are sectional views illustrating steps following FIGS. 6A to 6C.
Figure 7B:
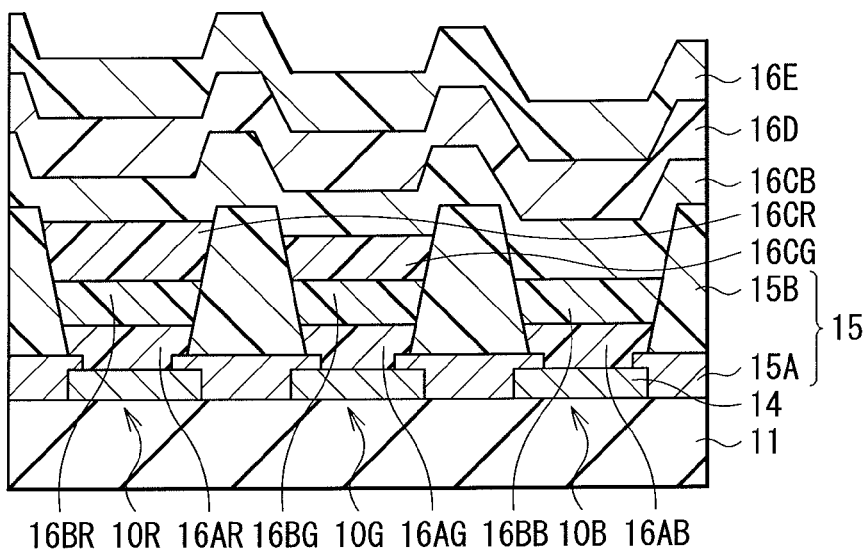
Figure 7C:
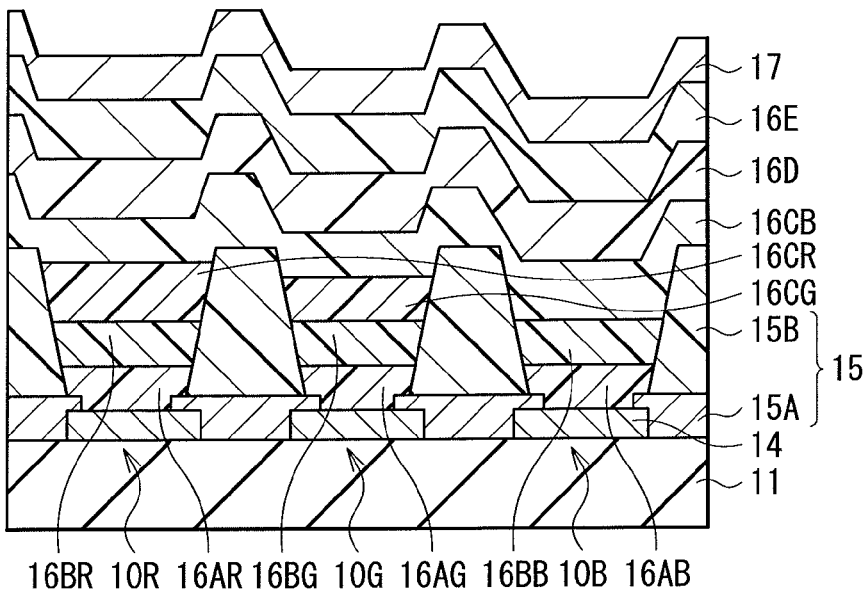

After the blue light-emitting layer 16CB is formed, as illustrated in FIGS. 7A, 7B and 7C, the electron transport layer 16D, the electron injection layer 16E and the upper electrode 17 made of the above-described materials are formed by an evaporation method on a whole surface of the blue light-emitting layer 16CB (step S109, S110 and S111).

After the upper electrode 17 is formed, as illustrated in FIG. 3, the protective layer 20 is formed by a film formation method with small energy of film formation particles, for example, an evaporation method or a CVD method so as not to exert an influence on the base. For example, in the case where the protective layer 20 made of amorphous silicon nitride is formed, the protective layer 20 is formed by the CVD method so as to have a thickness of 2 to 3 µm both inclusive. At this time, to prevent a decline in luminance due to deterioration in the organic layer 16, it is preferable that the film formation temperature is set to room temperature and a film is formed under a condition in which stress on the film is minimized to prevent peeling of the protective layer 20.

The blue light-emitting layer 16CB, the electron transport layer 16D, the electron injection layer 16E, the upper electrode 17 and the protective layer 20 are formed on a whole surface without using a mask. Moreover, the blue light-emitting layer 16CB, the electron transport layer 16D, the electron injection layer 16E, the upper electrode 17 and the protective layer 20 are preferably formed sequentially in one and the same film formation apparatus without being exposed to air. Therefore, deterioration in the organic layer 16 due to water in air is preventable.

In the case where an auxiliary electrode (not illustrated) is formed in the same step as the step of forming the lower electrodes 14, the organic layer 16 formed on a whole top surface of the auxiliary electrode may be removed by a technique such as laser ablation before forming the upper electrode 17. Therefore, the upper electrode 17 is allowed to be directly connected to the auxiliary electrode, thereby improving contact.

After the protective layer 20 is formed, for example, the light-shielding film made of the above-described material is formed on the sealing substrate 40 made of the above-described material. Next, the sealing substrate 40 is coated with the material of the red filter (not illustrated) by spin coating or the like, and the material is patterned by a photolithography technique and fired to form the red filter. Next, as in the case of the red filter (not illustrated), the blue filter and the green filter (both not illustrated) are formed in order.

After that, the adhesive layer (not illustrated) is formed on the protective layer 20, and the sealing substrate 40 is bonded to the protective layer 20 with the adhesive layer in between. Thus, the display illustrated in FIGS. 1 to 3 is completed.

In the display, a scanning signal is supplied from the scanning line drive circuit 130 to each pixel through a gate electrode of the writing transistor Tr2, and an image signal supplied from the signal line drive circuit 120 through the writing transistor Tr2 is retained in the retention capacitor Cs. In other words, on/off control of the driving transistor Tr1 is performed in response to the signal retained in the retention capacitor Cs, and a drive current Id is thereby injected into each of the red organic EL elements 10R, the green organic EL elements 10G and the blue organic EL elements 10B to emit light by the recombination of electrons and holes. In the case of bottom emission, the light passes through the lower electrodes 14 and the substrate 11, and in the case of a top emission, the light passes through the upper electrode 17, the color filter (not illustrated) and the sealing substrate 40, and then the light is extracted.

At this time, in each red organic EL element 10R, the red light-emitting layer 16CR and the blue light-emitting layer 16CB are arranged, but energy is transferred to red with a lowest energy level to predominantly emit red light. In each green organic EL element 10G, the green light-emitting layer 16CG and the blue light-emitting layer 16CB are arranged, but energy is transferred to green with a lower energy level to predominantly emit green light. In each blue organic EL element 10B, only the blue light-emitting layer 16CB is included, so blue light is emitted. As described above, in an organic EL element using a red or green organic light-emitting layer made of only a high-molecular material which is used in related art, hole or electron injection efficiency from the blue light-emitting layer to the red light-emitting layer or the green light-emitting layer is low, and the red light-emitting layer or the green light-emitting layer made of the high-molecular material does not make full use of intrinsic properties thereof.

In this case, the red light-emitting layer 16CR and the green light-emitting layer 16CG are made of the high-molecular material to which the low-molecular material is added, so a difference between the energy levels of the red light-emitting layers 16CR and the green light-emitting layers 16CG and the energy level of the blue light-emitting layer 16CB made of the low-molecular material is reduced. Therefore, the hole or electron injection efficiency from the blue light-emitting layer 16CB to the red light-emitting layers 16CR or the green light-emitting layers 16CG is improved, and a value close to element properties of the red light-emitting layers 16CR and the green light-emitting layers 16CG is allowed to be actually obtained.

Thus, in the embodiment, the red light-emitting layers 16CR and the green light-emitting layers 16CG are formed by a coating method with use of a mixture material of the high-molecular material and the low-molecular material, so hole or electron transport efficiency from the blue light-emitting layer 16CB to the red light-emitting layers 16CR or the green light-emitting layers 16CG is improved, and a value close to the element properties of the red light-emitting layers 16CR and the green light-emitting layers 16CG is obtained. In other words, higher light emission efficiency and a longer lifetime of the color organic EL display configured by forming the red organic EL elements 10R, the green organic EL elements 10G and the blue organic EL elements 10B in an array are achievable.

MODULE AND APPLICATION EXAMPLES

Application examples of the organic EL display described in the above-described embodiment will be described below. The organic EL display according to the above-described embodiment is applicable to displays of electronic devices displaying a picture signal supplied from outside or a picture signal produced inside as an image or a picture in any fields, such as televisions, digital cameras, notebook personal computers, portable terminal devices such as cellular phones, and video cameras.

Modules

Figure 8:
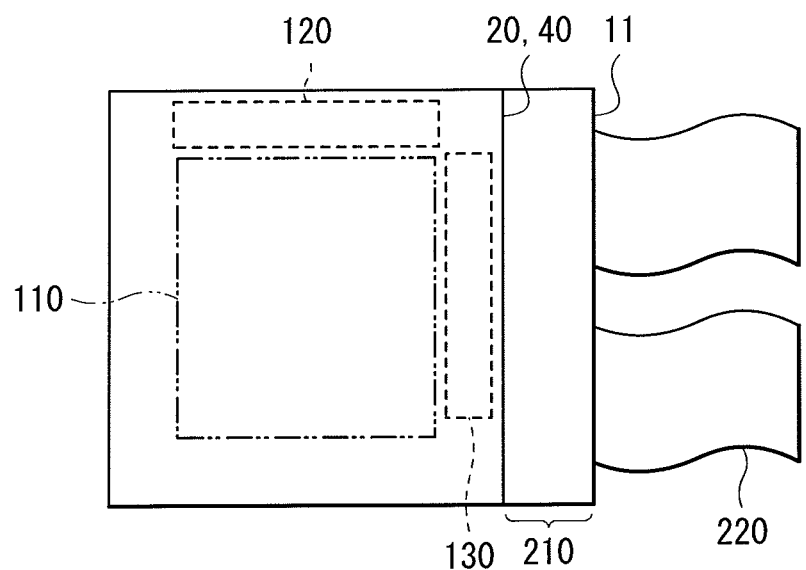
FIG. 8 is a plan view illustrating a schematic configuration of a module including the display according to the above-described embodiment.

The organic EL display according to the above-described embodiment is incorporated into various electronic devices such as Application Examples 1 to 5 which will be described later as a module as illustrated in FIG. 8. In the module, for example, a region 210 exposed from the protective layer 20 and the sealing substrate 40 is arranged on a side of the substrate 11, and an external connection terminal (not illustrated) is formed in the exposed region 210 by extending the wiring of the signal line drive circuit 120 and the scanning line drive circuit 130. In the external connection terminal, a flexible printed circuit (FPC) 220 for signal input/output may be arranged.

Application Example 1

Figure 9:
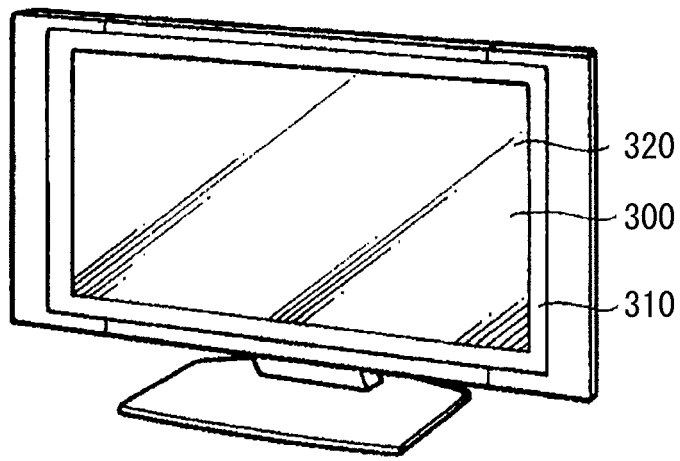
FIG. 9 is an external perspective view of Application Example 1 of the display according to the above-described embodiment.

FIG. 9 illustrates an appearance of a television to which the organic EL display according to the above-described embodiment is applied. The television has, for example, a picture display screen section 300 including a front panel 310 and a filter glass 320, and the picture display screen section 300 is configured of the organic EL display according to the above-described embodiment.

Application Example 2

Figure 10A:
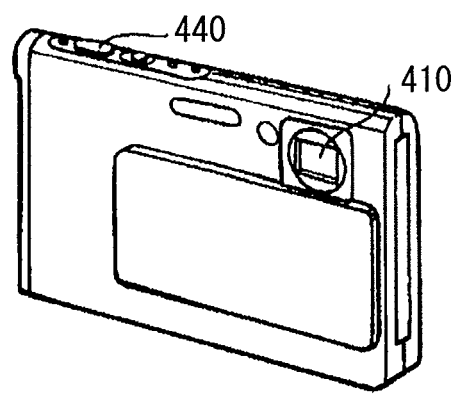
FIGS. 10A and 10B are external perspective views of Application Example 2 from a front side and a back side, respectively.
Figure 10B:
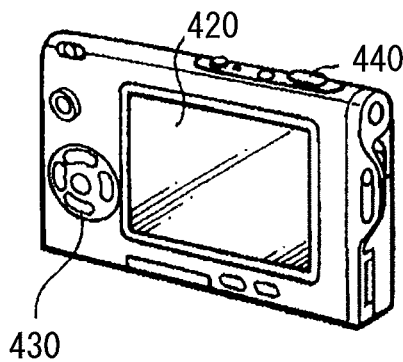

FIGS. 10A and 10B illustrate an appearance of a digital camera to which the organic EL display according to the above-described embodiment is applied. The digital camera has, for example, a light-emitting section for a flash 410, a display section 420, a menu switch 430 and a shutter button 440, and the display section 420 is configured of the organic EL display according to the above-described embodiment.

Application Example 3

Figure 11:
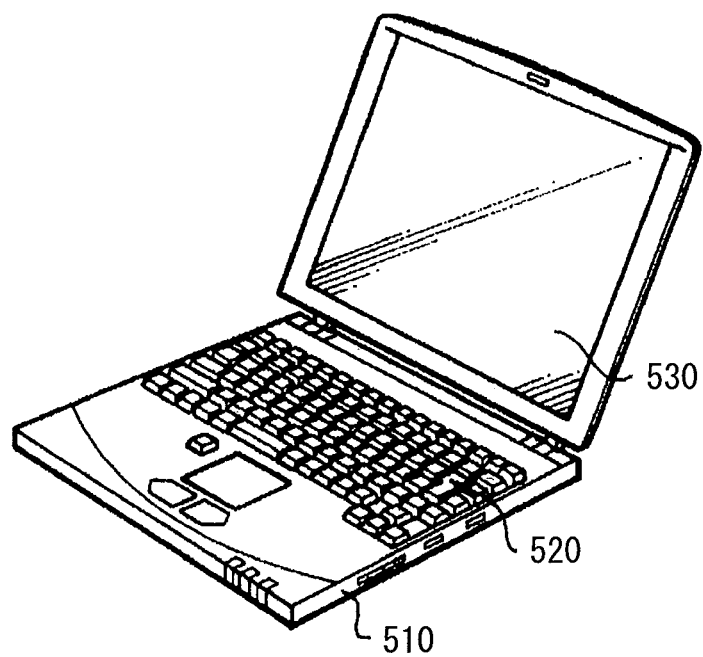
FIG. 11 is an external perspective view of Application Example 3.

FIG. 11 illustrates an appearance of a notebook personal computer to which the organic EL display according to the above-described embodiment is applied. The notebook personal computer has, for example, a main body 510, a keyboard 520 for operation of inputting characters and the like and a display section 530 for displaying an image, and the display section 530 is configured of the organic EL display according to the above-described embodiment.

Application Example 4

Figure 12:
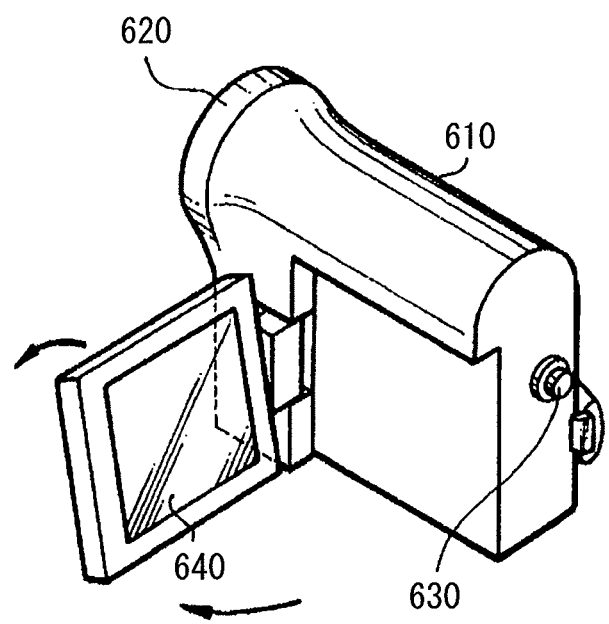
FIG. 12 is an external perspective view of Application Example 4.

FIG. 12 illustrates an appearance of a video camera to which the organic EL display according to the above-described embodiment is applied. The video camera has, for example, a main body 610, a lens for shooting an object 620 arranged on a front surface of the main body 610, a shooting start/stop switch 630 and a display section 640, and the display section 640 is configured of the organic EL display according to the above-described embodiment.

Application Example 5

FIGS. 13A to 13G illustrate an appearance of a cellular phone to which the organic EL display according to the above-described embodiment is applied. The cellular phone is formed by connecting, for example, a top-side enclosure 710 and a bottom-side enclosure 720 to each other by a connection section (hinge section) 730. The cellular phone has a display 740, a sub-display 750, a picture light 760, and a camera 770. The display 740 or the sub-display 750 is configured of the organic EL display according to the above-described embodiment.

EXAMPLES

Moreover, specific examples of the invention will be described below.

Examples

The red organic EL elements 10R, the green organic EL element 10G and the blue organic EL element 10B were formed on the substrate 11 with a size of 25 mm×25 mm.

First, a glass substrate (25 mm×25 mm) was prepared as the substrate 11, and two-layer configurations including a silver alloy layer made of an Ag—Pd—Cu alloy with a thickness of 120 nm and a transparent conductive film made of ITO with a thickness of 10 nm were formed as the lower electrodes 14 on the substrate 11 (step S101).

Next, coating with ND1501 (polyaniline manufactured from Nissan Chemical Industries. Ltd.) was performed in air by a spin coating method to form the hole injection layers 16AR, 16AG and 16AB with a thickness of 15 nm, and then the hole injection layers 16AR, 16AG and 16AB were thermally cured on a hot plate at 220° C. for 30 minutes (step S104).

After that, in a N₂ atmosphere (with a dew point of −60° C. and an oxygen concentration of 10 ppm), the polymer (polyvinylcarbazole) represented by a formula (5) was applied to the hole injection layers 16AR and 16AG by a spin coating method to form the hole transport layers 16BR and 16BG. The hole transport layer 16BR of each red organic EL element 10R had a thickness of 150 nm, and the hole transport layer 16BG of each green organic EL element 10G had a thickness of 20 nm. After that, in a N₂ atmosphere (with a dew point of −60° C. and an oxygen concentration of 10 ppm), the hole transport layers 16BR and 16BG were thermally cured on a hot plate at 180° C. for 60 minutes (step S105).

Chemical Formula 20

(5)

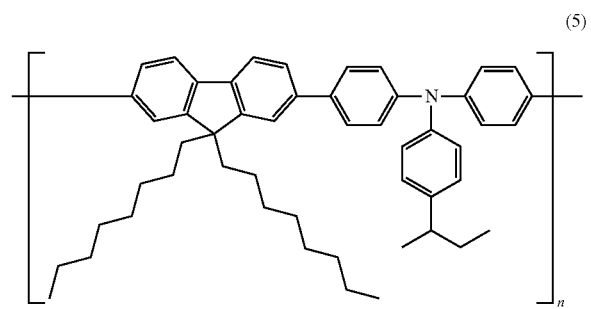

After the hole transport layers 16BR and 16BG were formed, a mixture material formed by mixing a fluorenone-based polyarylene material having benzothiadiazole in a block with the low-molecular material represented by the formula (2-38) at a weight ratio of 2:1 was dissolved in xylene, and the mixture material was applied to the hole transport layers 10BR of the red organic EL elements 10R by a spin coating method to form layers with a thickness of 80 nm as the red light-emitting layers 16CR (Experimental Example 1-1). Moreover, a mixture material formed by mixing a fluorenone-based polyarylene material having anthracene in a block with the low-molecular material represented by the formula (2-38) at a weight ratio of 2:1 was dissolved in xylene, and the mixture material was applied to the hole transport layers 16BG of the green organic EL elements 10G by a spin coating method to form layers with a thickness of 80 nm as the green light-emitting layers 16CG (Experimental Example 2-1). Next, in a N₂ atmosphere (with a dew point of −60° C. and an oxygen concentration of 10 ppm), the red light-emitting layers 16CR and the green light-emitting layers 16CG were thermally cured on a hot plate at 130° C. for 10 minutes (step S106).

After the red light-emitting layers 16CR and the green light-emitting layers 16CG were formed, the low-molecular material represented by the formula (2-38) was applied to the hole injection layers 16AB of the blue organic EL elements 10B by a spin coating method to form layer with a thickness of 50 nm as the hole transport layers 16BB (Experimental Example 3-1). After that, in a N₂ atmosphere (with a dew point of −60° C. and an oxygen concentration of 10 ppm), the hole transport layers 16BB was heated on a hot plate at 100° C. for 60 minutes (step S107).

After the hole transport layers 16BB were formed, the substrate 11 for the red organic EL elements 10R in which layers until the red light-emitting layers 16CR were formed, and the substrate 11 for the green organic EL elements 10G in which layers until the green light-emitting layers 16CG were formed, and the substrate 11 for the blue organic EL elements 10B in which layers until the hole transport layers 16BB were formed were put into a vacuum deposition apparatus to evaporate the blue light-emitting layers 16CB and subsequent layers.

First, as the blue light-emitting layer 16CB, ADN (9,10-di (2-naphthyl)anthracene represented by the formula (4-20) and a blue dopant represented by a formula (6) were co-evaporated at a weight ratio of 95:5 (step S108).

Chemical Formula 21

(6)

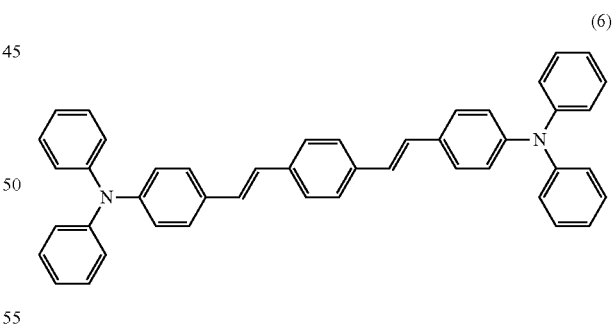

After the blue light-emitting layer 16CB was formed, Alq3 (tris(8-hydroxyquinoline)aluminum) represented by a formula (7) was evaporated by a vacuum deposition method to form a layer with a thickness of 15 nm as the electron transport layer 16D (step S109). Next, a film of LiF with a thickness of 0.3 nm was formed as the electron injection layer 16E by the same evaporation method (step S110), and then a layer of Mg—Ag with a thickness of 10 nm was formed as the upper electrode 17 (step S111). Finally, the protective layer 20 made of SiN was formed by a CVD method, and a transparent resin was used to perform solid sealing. A full-color organic EL display was obtained by combining the red organic EL elements 10R, the green organic EL elements 10G and the blue organic El elements 10B which were obtained in such a manner.

Chemical Formula 22

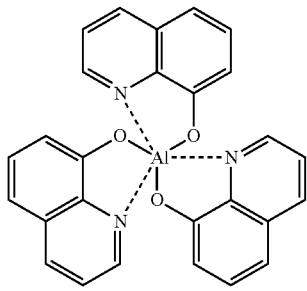

(7)

Experiment 1

In the formation of the red light-emitting layers 16CR and the green light-emitting layers 16CG in the steps of forming the organic EL display described in the examples, as the low-molecular material added to the high-molecular material, the compound represented by the formula (2-38) was replaced with low-molecular materials represented by the following formula (8), and the formulas (2-6), (2-24), (2-39), (3-5), (3-10), (1-29) and (1-34) so as to prepare the red organic EL elements 10R (Experimental Examples 1-2 to 1-9) and green organic EL elements 10G (Experimental Examples 2-2 to 2-9), and a red organic EL element (Experimental Example 1-10) in which the low-molecular material was not added and a green organic EL element (Experimental Example 2-10) in which the low-molecular material was not added were prepared. Then, the drive voltage (V) and the light emission efficiency (cd/A) in the case of driving at a current density of 10 mA/cm$_2$ of each of Experimental Examples 1-1 to 1-10 and 2-1 to 2-10 were measured. Moreover, the luminance half time in the case of constant-current driving at a current density of 100 mA/cm$_2$ of each of Experimental Examples 1-1 to 1-1- and 2-1 to 2-10 was also measured. These results are illustrated in FIGS. 14A, 14B, 14C, 15A and 15B and Tables 1 and 2. Moreover, the drive voltage (V), the light emission efficiency (cd/A) and chromaticity in the case of driving at a current density of 10 mA/cm$_2$ and the luminance half time in the case of constant-current driving at a current density of 100 mA/cm2 of each of blue organic EL elements 10B (Experimental Examples 3-1 to 3-3) in which as the low-molecular material of the hole transport layer 16BB for the blue organic EL element 10B, compounds represented by the formulas (2-38), (2-6) and (2-24) were used, respectively, were measured. These results are illustrated in Table 3.

Chemical Formula 23

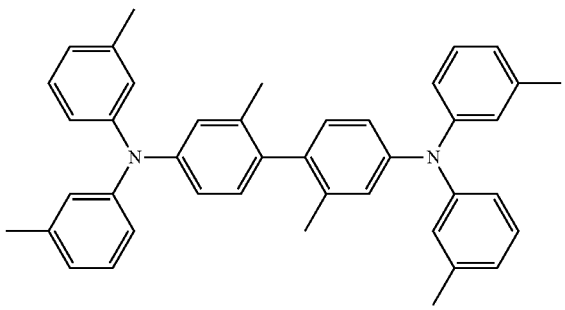

(8)

TABLE 1

| | Red light-emitting layer | Mixture ratio (high-molecular material:low-molecular material) | Drive voltage (V) | Light emission efficiency (cd/A) | Chromaticity | Lifetime (Luminance half time/h) |
|---|---|---|---|---|---|---|
| Experimental Example 1-1 | High-molecular material/ Formula (2-38) | 2:1 | 7.1 | 8.4 | 0.67 0.32 | 200 |
| Experimental Example 1-2 | High-molecular material/ Formula (8) | 2:1 | 7.3 | 8.2 | 0.67 0.32 | 190 |
| Experimental Example 1-3 | High-molecular material/ Formula (2-6) | 2:1 | 7.5 | 8.0 | 0.67 0.32 | 170 |
| Experimental Example 1-4 | High-molecular material/ Formula (2-24) | 2:1 | 7.7 | 7.8 | 0.67 0.32 | 160 |
| Experimental Example 1-5 | High-molecular material/ Formula (2-39) | 2:1 | 7.2 | 7.6 | 0.67 0.32 | 170 |
| Experimental Example 1-6 | High-molecular material/ Formula (3-5) | 2:1 | 7.2 | 8.3 | 0.67 0.32 | 185 |
| Experimental Example 1-7 | High-molecular material/ Formula (3-10) | 2:1 | 8.3 | 7.4 | 0.67 0.32 | 140 |
| Experimental Example 1-8 | High-molecular material/ Formula (1-29) | 2:1 | 8.5 | 7.8 | 0.67 0.32 | 155 |
| Experimental Example 1-9 | High-molecular material/ Formula (1-34) | 2:1 | 8.7 | 7.6 | 0.67 0.32 | 150 |
| Experimental Example 1-10 | High-molecular material/— | 2:1 | 9.0 | 6.7 | 0.67 0.32 | 10 |

TABLE 2

|  | Green light-emitting layer | Mixture ratio (high-molecular material:low-molecular material) | Drive voltage (V) | Light emission efficiency (cd/A) | Chromaticity | Lifetime (Luminance half time/h) |
|---|---|---|---|---|---|---|
| Experimental Example 2-1 | High-molecular material/Formula (2-38) | 2:1 | 4.8 | 17.0 | 0.26 0.65 | 300 |
| Experimental Example 2-2 | High-molecular material/Formula (8) | 2:1 | 4.9 | 16.5 | 0.26 0.65 | 280 |
| Experimental Example 2-3 | High-molecular material/Formula (2-6) | 2:1 | 5.2 | 13.2 | 0.26 0.65 | 270 |
| Experimental Example 2-4 | High-molecular material/Formula (2-24) | 2:1 | 5.3 | 14.5 | 0.26 0.65 | 265 |
| Experimental Example 2-5 | High-molecular material/Formula (2-39) | 2:1 | 5.8 | 16.6 | 0.26 0.65 | 265 |
| Experimental Example 2-6 | High-molecular material/Formula (3-5) | 2:1 | 5.9 | 12.8 | 0.26 0.65 | 260 |
| Experimental Example 2-7 | High-molecular material/Formula (3-10) | 2:1 | 5.4 | 13.5 | 0.26 0.65 | 280 |
| Experimental Example 2-8 | High-molecular material/Formula (1-29) | 2:1 | 6.2 | 12.8 | 0.26 0.65 | 290 |
| Experimental Example 2-9 | High-molecular material/Formula (1-34) | 2:1 | 6.7 | 12.7 | 0.26 0.65 | 290 |
| Experimental Example 2-10 | High-molecular material/— | 2:1 | 7.3 | 11.0 | 0.26 0.65 | 260 |

TABLE 3

|  | Blue hole transport layer | Blue light-emitting layer | Drive voltage (V) | Light emission efficiency (cd/A) | Chromaticity | Lifetime (Luminance half time/h) |
|---|---|---|---|---|---|---|
| Experimental Example 3-1 | High-molecular material/Formula (2-38) | ADN | 5.3 | 7.2 | 0.15 0.15 | 240 |
| Experimental Example 3-2 | High-molecular material/Formula (2-6) | ADN | 5.3 | 7.3 | 0.15 0.15 | 230 |
| Experimental Example 3-3 | High-molecular material/Formula (2-24) | ADN | 5.6 | 7.1 | 0.15 0.15 | 200 |

Figure 14A:
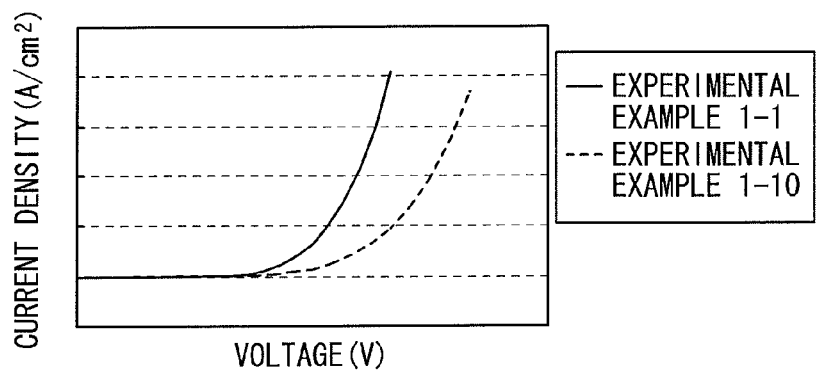
FIGS. 14A to 14C are plots illustrating results of experimental examples of red organic EL elements.
Figure 14B:
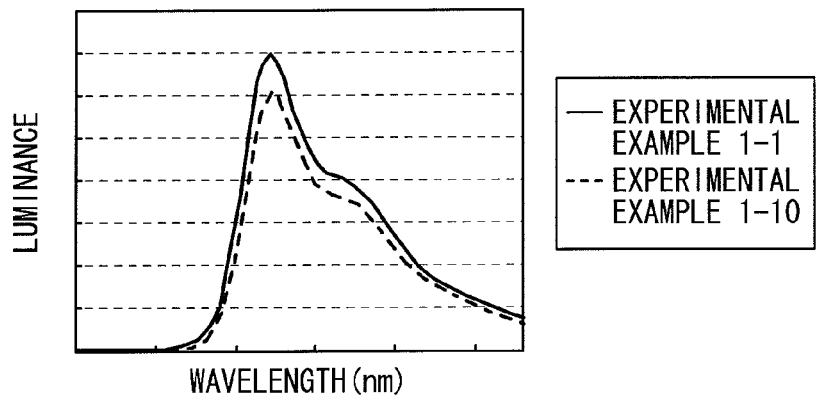
Figure 14C:
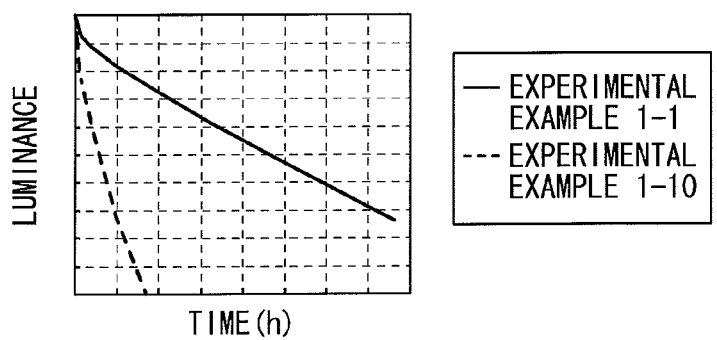
Figure 15A:
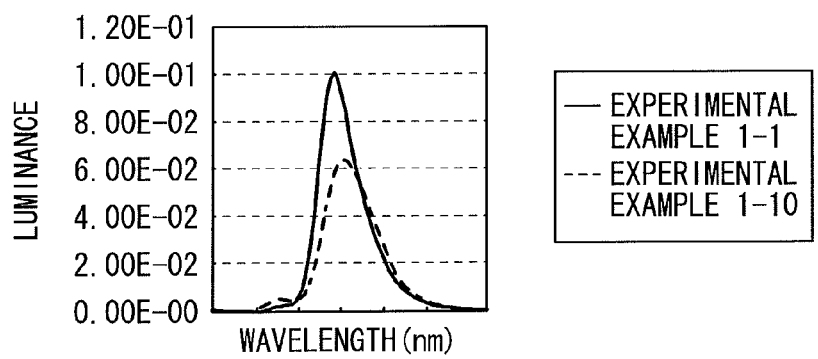
FIGS. 15A and 15B are plots illustrating results of experimental examples of green organic EL elements.
Figure 15B:
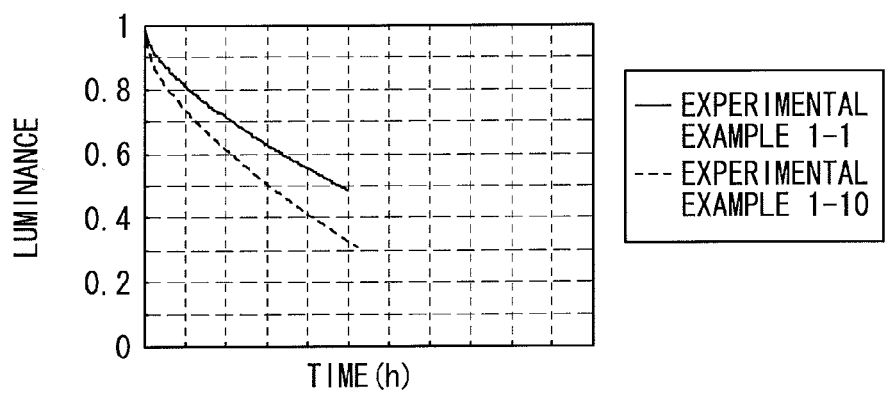

FIGS. 14A to 14C are plots illustrating the results of the drive voltage (V) (FIG. 14A), the light emission efficiency (cd/A) (FIG. 14B) and the luminance half time (FIG. 14C) in the case of constant-current driving at a current density of 100 mA/cm² of Experimental Example 1-1 and Experimental Example 1-10 in which the low-molecular material was not added to the red light-emitting layer 16CR. FIGS. 15A and 15B are plots illustrating results of the light emission efficiency (cd/A) (FIG. 15A) and the luminance half time (FIG. 15B) in the case of constant-current driving at a current density of 100 mA/cm² of Experimental Example 2-1 and Experimental Example 2-10 in which the low-molecular material was not added to the green light-emitting layer 16CG.

It was obvious from FIGS. 14A, 14B, 14C, 15A and 15B and Tables 1 and 2 that in the red organic EL elements (Experimental Examples 1-1 to 1-9) and the green organic EL elements (Experimental Example 2-1 to 2-9) in which the low-molecular materials represented by the formulas (8), (2-6), (2-24), (2-39), (3-5), (3-10), (1-29) and (1-34) were added to the high-molecular material, respectively, the drive voltage, the light emission efficiency and the luminance half time were improved, compared to the red organic EL element (Experimental Example 1-10) including the red light-emitting layer 16CR made of the high-molecular material and the green organic EL element (Experimental Example 2-10) including the green light-emitting layer 16CG made of the high-molecular material. In particular, the luminance half time of the red organic EL element 10R was remarkably improved.

Experiment 2

In the step of forming the red light-emitting layer 16CR in the steps of forming the organic EL display described in the examples, the additive amount of the low-molecular material (represented by the formula (2-38)) added to the high-molecular material was changed to 0%, 11%, 20%, 25%, 33%, 50%, 66% and 80% to measure changes in luminance half time in the case of constant-current driving at a current density of 100 mA/cm².

TABLE 4

| Additive amount (%) | Lifetime (Luminance half time/h) |
|---|---|
| 0 | 10 |
| 11 | 80 |
| 20 | 120 |
| 25 | 150 |
| 33 | 200 |
| 50 | 100 |
| 66 | 80 |
| 80 | 60 |

Figure 16:
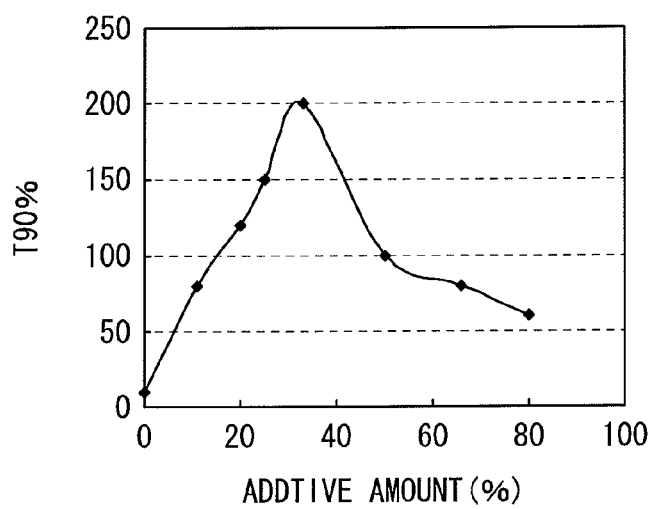
FIG. 16 is a plot illustrating results of Experiment 2.

Table 4 illustrates results of the additive amount of the low-molecular material and the luminance half time in Experiment 2. FIG. 16 illustrates a plot of the results of Experiment 2. It was obvious from Table 4 and FIG. 16 that when the low-molecular material was added to the high-molecular material forming the light-emitting layer 16C, the luminance half time of the organic EL element 10R was improved, and when the additive amount was preferably within a range of 10% to 70% both inclusive, the luminance half time was allowed to be effectively improved. In particular, when the additive amount was approximately 30%, the luminance half time was allowed to be remarkably improved.

Although the present invention is described referring to the embodiment and examples, the invention is not limited thereto, and may be variously modified.

For example, the material and thickness of each layer, the method and conditions of forming each layer are not limited to those described in the above-described embodiment and the above-described examples, and each layer may be made of any other material with any other thickness by any other method under any other conditions.

Moreover, in the above-described embodiment and the above-described examples, the configurations of the organic EL elements 10R, 10B and 10G are specifically described; however, all layers are not necessarily included, or any other layer may be further included.

Further, in the above-described embodiment, the case of the active matrix display was described. However, the invention is applicable to a passive matrix display. Moreover, the configuration of a pixel drive circuit for active matrix drive is not limited to that described in the above-described embodiment, and if necessary, a capacitive element or a transistor may be added. In this case, a necessary drive circuit may be included in addition to the above-described signal line drive circuit 120 and the scanning line drive circuit 130 according to a change in the pixel drive circuit.

It should be understood by those skilled in the art that various modifications, combinations, sub-combinations and alterations may occur depending on design requirements and other factors insofar as they are within the scope of the appended claims or the equivalents thereof.

What is claimed is:

1. An organic EL display comprising:
    lower electrodes arranged on a substrate so as to correspond to a red organic EL element, a green organic EL element and a blue organic EL element, respectively;
    hole injection/transport layers arranged on the lower electrodes so as to correspond to the red organic EL element, the green organic EL element and the blue organic EL element, respectively, the hole injection/transport layers having hole injection properties for hole injection, or hole transport properties for hole mobility, or both;
    a red organic light-emitting layer arranged on the hole injection/transport layer for the red organic EL element, and including a low-molecular material;
    a green organic light-emitting layer arranged on the hole injection/transport layer for the green organic EL element, and including a low-molecular material;
    a blue organic light-emitting layer arranged on whole surfaces of the red organic light-emitting layer, the green organic light-emitting layer and the hole injection/transport layer for the blue organic EL element; and
    an electron injection/transport layer and an upper electrode arranged on a whole surface of the blue light-emitting layer, the electron injection/transport layer having one or both of electron injection properties and electron transport properties, wherein,
    the hole injection/transport layers of the red organic EL element and the green organic EL element comprise a high-molecular material, and
    the hole injection/transport layers of the blue organic EL element includes (i) a layer having hole injection properties and (ii) a layer having hole transport properties which comprises a low-molecular material.

2. The organic EL display according to claim 1, wherein:
    the red organic light emitting includes a high molecular material, the green organic light emitting includes a high molecular material, and
    the low-molecular material has a value lower than the lowest unoccupied molecular orbital of the high molecular material of the red organic light-emitting layer or the high molecular material of the green organic light-emitting layer, and a value higher than the highest occupied molecular orbital of the high molecular material of the red organic light-emitting layer or the high molecular material of the green organic light-emitting layer.

3. The organic EL display according to claim 1, wherein the low-molecular material has a value higher than the lowest unoccupied molecular orbital of the blue organic light-emitting layer, and a value lower than HOMO (highest occupied molecular orbital) of the blue organic light-emitting layer.

4. The organic EL display according to claim 1, wherein the red organic light-emitting layer and the green organic light-emitting layer each include a high-molecular material, and the blue organic light-emitting layer is made of a low-molecular material.

5. The organic EL display according to claim 4, wherein a mixture ratio between the high-molecular material and the low-molecular material included in the red organic light-emitting layer and the green organic light-emitting layer is 1:2 or less.

6. The organic EL display according to claim 1, wherein the low-molecular material is a compound represented by Chemical Formula 1:

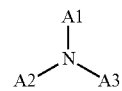

(1)

where each of A1, A2 and A3 represents an aromatic hydrocarbon group, a heterocyclic group or a derivative thereof.

7. The organic EL display according to claim 1, wherein the low-molecular material is a compound represented Chemical Formula 2:

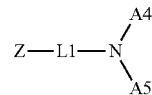

(2)

where, (a) Z represents a nitrogen-containing hydrocarbon group or a derivative thereof, (b) L1 represents a group in which 1 to 4 divalent aromatic ring groups are bonded to each other, or a derivative thereof, and (c) each of A4 and A5 represents an aromatic hydrocarbon group, an aromatic heterocyclic group or a derivative thereof, and A4 and A5 may be bonded to each other to form a cyclic structure.

8. The organic EL display according to claim 1, wherein the low-molecular material is a compound represented by Chemical Formula 3

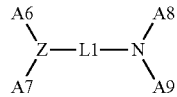

(3)

where (a) L2 represents a group in which 2 to 6 divalent aromatic ring group are bonded to each other, or a derivative thereof, (b) each of A6, A7, A8 and A9 represents a group in which 1 to 10 aromatic hydrocarbon groups, 1 to 10 heterocyclic groups or 1 to 10 derivatives thereof are bonded.

9. The organic EL display according to claim 1, wherein the blue organic light-emitting layer comprises a compound represented by Chemical Formula 4:

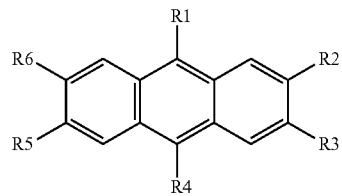

(4)

where each of R1, R2, R3, R4, R5 and R6 represents a hydrogen atom, a halogen atom, a hydroxyl group, a cyano group, a nitro group, or a group including a carbonyl group with 20 or less carbon atoms, a group including a carbonyl ester group, an alkyl group, an alkenyl group, an alkoxyl group, a group including a silyl group with 30 or less carbon atoms, a group including an aryl group, a group including a heterocyclic group, a group including an amino group, or a derivative thereof.

\* \* \* \* \*